(12) United States Patent
Doornbos et al.

(10) Patent No.: US 12,456,676 B2
(45) Date of Patent: Oct. 28, 2025

(54) SEMICONDUCTOR DEVICE INCLUDING FIRST AND SECOND TRANSISTOR CHANNELS

(71) Applicant: TAIWAN SEMICONDUCTOR MANUFACTURING COMPANY LIMITED, Hsin-Chu (TW)

(72) Inventors: Gerben Doornbos, Kessel-Lo (BE); Mauricio Manfrini, Zhubei (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 627 days.

(21) Appl. No.: 17/725,015

(22) Filed: Apr. 20, 2022

(65) Prior Publication Data

US 2023/0343696 A1     Oct. 26, 2023

(51) Int. Cl.

| | | |
|---|---|---|
| H01L 23/52 | (2006.01) | |
| H01L 23/522 | (2006.01) | |
| H10B 41/10 | (2023.01) | |
| H10B 41/35 | (2023.01) | |
| H10B 41/41 | (2023.01) | |
| H10B 43/10 | (2023.01) | |
| H10B 43/35 | (2023.01) | |
| H10B 43/40 | (2023.01) | |
| H10D 30/01 | (2025.01) | |
| H10D 30/68 | (2025.01) | |
| H10D 30/69 | (2025.01) | |
| H10D 64/01 | (2025.01) | |

(52) U.S. Cl.
CPC ......... *H01L 23/5226* (2013.01); *H10B 41/10* (2023.02); *H10B 41/35* (2023.02); *H10B 41/41* (2023.02); *H10B 43/10* (2023.02); *H10B 43/35* (2023.02); *H10B 43/40* (2023.02); *H10D 30/0411* (2025.01); *H10D 30/0413* (2025.01); *H10D 30/68* (2025.01); *H10D 30/6894* (2025.01); *H10D 30/69* (2025.01); *H10D 30/699* (2025.01); *H10D 64/035* (2025.01); *H10D 64/037* (2025.01)

(58) Field of Classification Search
CPC ..... H01L 23/5226; H10B 41/10; H10B 41/35; H10B 41/41; H10B 43/10; H10B 43/35; H10B 43/40; H10D 30/0411; H10D 30/0413; H10D 30/68; H10D 30/6894; H10D 30/69; H10D 30/699; H10D 64/035; H10D 64/037; H10D 30/6704; A45C 11/002
USPC ........................................................ 257/324
See application file for complete search history.

(56) References Cited

U.S. PATENT DOCUMENTS

| | | | | |
|---|---|---|---|---|
| 7,589,375 B2* | 9/2009 | Jang | ............... | H10B 10/18 438/257 |
| 2008/0128780 A1* | 6/2008 | Nishihara | ............... | H10B 41/35 257/E27.103 |
| 2010/0276743 A1* | 11/2010 | Kuniya | ............... | H10D 30/69 257/315 |
| 2015/0318333 A1* | 11/2015 | Narayanan | ........... | H10N 70/245 257/4 |

(Continued)

*Primary Examiner* — Mohammad M Hoque
(74) *Attorney, Agent, or Firm* — Cooper Legal Group, LLC

(57) ABSTRACT

A semiconductor device is provided. The semiconductor device includes a memory structure including a first transistor channel, a gate structure overlying the first transistor channel, and a second transistor channel overlying the gate structure. The gate structure includes a control gate.

20 Claims, 35 Drawing Sheets

(56) References Cited

U.S. PATENT DOCUMENTS

2016/0268304 A1* 9/2016 Ikeda .................... H10B 43/40

* cited by examiner

SEMICONDUCTOR DEVICE INCLUDING FIRST AND SECOND TRANSISTOR CHANNELS

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
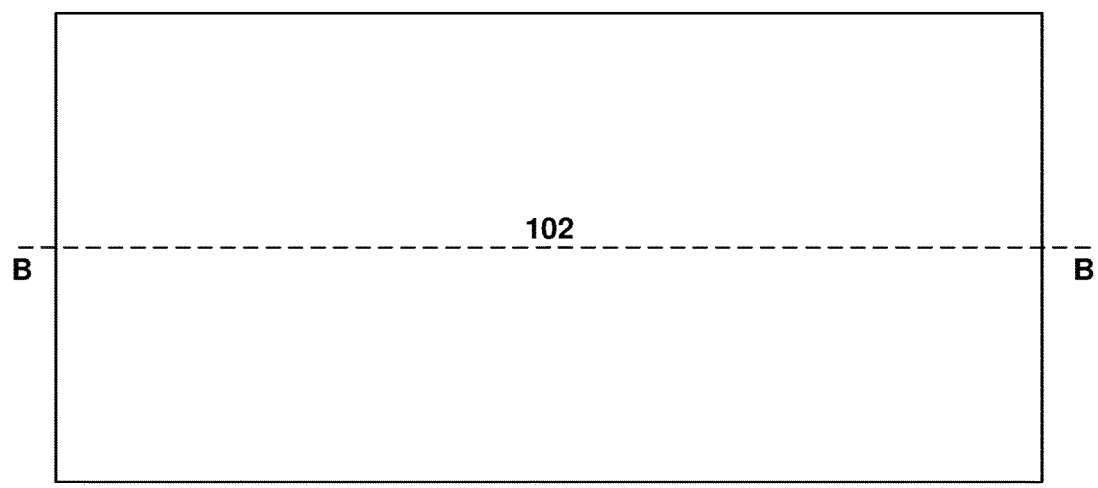
FIGS. 1A-1B illustrate a memory structure at a stage of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

The term "overlying" and/or the like may be used to describe one element or feature being vertically coincident with and at a higher elevation than another element or feature. For example, a first element overlies a second element if the first element is at a higher elevation than the second element and at least a portion of the first element is vertically coincident with at least a portion of the second element.

The term "underlying" and/or the like may be used to describe one element or feature being vertically coincident with and at a lower elevation than another element or feature. For example, a first element underlies a second element if the first element is at a lower elevation than the second element and at least a portion of the first element is vertically coincident with at least a portion of the second element.

The term "over" may be used to describe one element or feature being at a higher elevation than another element or feature. For example, a first element is over a second element if the first element is at a higher elevation than the second element.

The term "under" may be used to describe one element or feature being at a lower elevation than another element or feature. For example, a first element is under a second element if the first element is at a lower elevation than the second element.

Some embodiments relate to a semiconductor device. In accordance with some embodiments, the semiconductor device comprises a memory structure, such as a non-volatile memory structure. The memory structure comprises a first transistor channel, a first gate structure overlying the first transistor channel, and a second transistor channel overlying the first gate structure. The first gate structure comprises a control gate configured to control the first transistor channel and the second transistor channel. A first portion of the first gate structure and at least a portion of the first transistor channel form a first memory cell of the memory structure. A second portion of the first gate structure and at least a portion of the second transistor channel form a second memory cell of the memory structure. The first memory cell and the second memory cell share the control gate of the first gate structure. In some embodiments, the memory structure comprises a second gate structure overlying the first gate structure, and a via in contact with the first gate structure and the second gate structure. In some embodiments, the via connects a word line to the first gate structure and the second gate structure. At least one of implementing the first gate structure between the first transistor channel and the second transistor channel, or implementing the via in contact with the first gate structure and the second gate structure, provides for at least one of increased memory cell density of the semiconductor device, an increased number of memory cells that are embedded in the semiconductor device, reduced footprint, etc. In some embodiments, at least one of the increased memory cell density, the increased number of memory cells, the reduced footprint, etc. are a result of at least one of providing vertically stacked layers of memory cells or sharing a via among multiple gate structures.

In some embodiments, the semiconductor device comprises a logic structure comprising a plurality of logic cells. The memory structure overlies the logic structure. The logic structure is in a Front End of Line (FEOL) structure of the semiconductor device. In some embodiments, the semiconductor device comprises one or more interconnection layers in a Back End of Line (BEOL) structure, of the semiconductor device, overlying the FEOL structure. In some embodiments, the memory structure overlies at least one of the FEOL structure or the one or more interconnection layers. In some embodiments, the memory structure at least one of overlies or is within the BEOL structure. Implementing the memory structure to overlie at least one of the logic structure or the one or more interconnection layers provides for in-memory computing and/or near-memory computing of the semiconductor device, thereby providing for increased processing and/or computing speed as compared to semiconductor devices, such as logic chips, that are connected to memory circuitry on separate devices, such as standalone flash memory. Implementing the memory structure to overlie at least one of the logic structure or the one or more interconnection layers provides for at least one of reduced manufacturing costs, reduced complexity, reduced footprint, increased memory cell density, etc. as compared to at least one of semiconductor devices with memory structures that are laterally coincident with logic structures or semiconductor devices with memory structures formed within FEOL structures comprising logic structures.

FIGS. 1A-180 illustrate a memory structure 100 at various stages of fabrication, in accordance with some embodiments. FIGS. 1A, 2A, 3A, 4A, 5A, 6A, 7A, 8A, 9A, 10A, 11A, 12A, 13A, 14A, 15A, 16A, 17A, and 18A illustrate top views of the memory structure 100 at various stages of fabrication. FIGS. 1B, 2B, 3B, 4B, 5B, 6B, 7B, 8B, 9B, 10B, 11B, 12B, 13B, 15B, 16B, 17B and 18B illustrate cross-sectional views of the memory structure 100 taken along lines B-B of FIGS. 1A, 2A, 3A, 4A, 5A, 6A, 7A, 8A, 9A, 10A, 11A, 12A, 13A, 15A, 16A, 17A, and 18A, respectively. FIGS. 14B and 14F illustrate cross-sectional views of the memory structure 100 taken along lines B-B of FIG. 14A. FIGS. 8C, 10C, 12C, 14C, 17C, and 18C illustrate cross-sectional views of the memory structure 100 taken along lines C-C of FIGS. 8A, 10A, 12A, 14A, 17A, and 18A, respectively. FIG. 14D illustrates a cross-sectional view of the memory structure 100 taken along line D-D of FIG. 14A. FIG. 14E illustrates a cross-sectional enlarged view of a section of the memory structure 100. In some embodiments, the memory structure 100 is a non-volatile memory structure, such as a flash memory structure or other non-volatile memory structure. In some embodiments, the memory structure 100 comprises memory cells. In some embodiments, the memory cells comprise non-volatile memory cells, such as flash memory cells or other type of non-volatile memory cells. In some embodiments, the memory structure 100 comprises a stacked memory array structure comprising layers of memory cells stacked over each other.

Figure 1B:
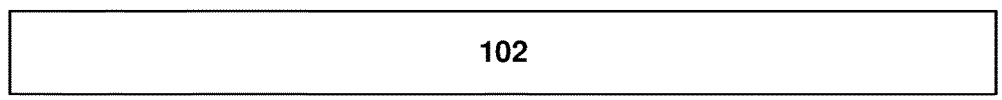

FIGS. 1A and 1B illustrate the memory structure 100 according to some embodiments. In some embodiments, the memory structure 100 comprises a first dielectric layer 102. In some embodiments, the first dielectric layer 102 is formed over at least one of a logic structure, an FEOL structure comprising the logic structure, or one or more interconnection layers in a BEOL structure. In some embodiments, the first dielectric layer 102 is formed at least one of over or within the BEOL structure. The first dielectric layer 102 is an interlayer dielectric layer. The first dielectric layer 102 comprises at least one of silicon, nitride, oxide, such as silicon dioxide ($SiO_2$), or other suitable material. Other structures and/or configurations of the first dielectric layer 102 are within the scope of the present disclosure. The first dielectric layer 102 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques.

Figure 2A:
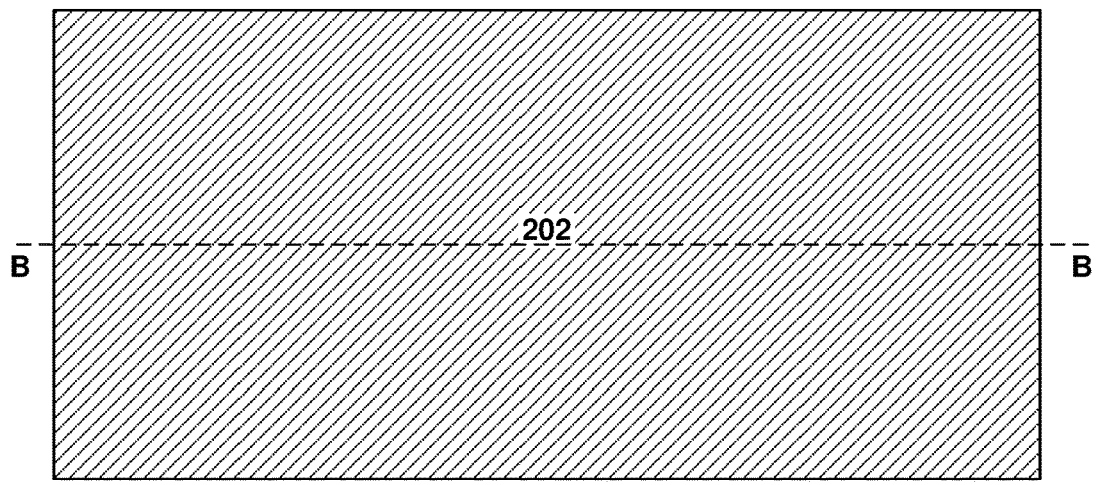
FIGS. 2A-2B illustrate a memory structure at a stage of fabrication, in accordance with some embodiments.
Figure 2B:
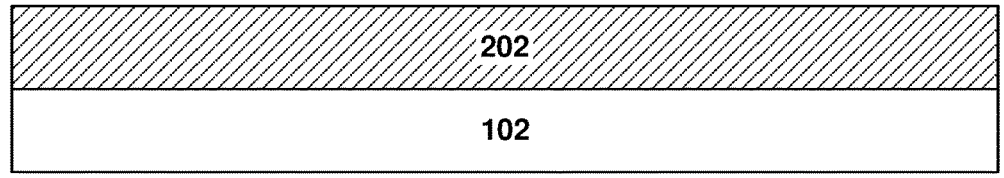

FIGS. 2A and 2B illustrate one or more gate structure layers 202 formed over the first dielectric layer 102, according to some embodiments. The one or more gate structure layers 202 at least one of overlie the first dielectric layer 102, are in direct contact with a top surface of the first dielectric layer 102, or are in indirect contact with the top surface of the first dielectric layer 102. In some embodiments, one or more layers, such as a buffer layer, are between the one or more gate structure layers 202 and the first dielectric layer 102. The one or more gate structure layers 202 are formed by at least one of PVD, sputtering, CVD, LPCVD, ALCVD, UHVCVD, RPCVD, ALD, MBE, LPE, spin on, growth, or other suitable techniques. Other structures and/or configurations of the one or more gate structure layers 202 are within the scope of the present disclosure.

In some embodiments, the one or more gate structure layers 202 comprise at least one of a gate layer or one or more other layers. In some embodiments, the gate layer comprises a metal. The gate layer comprises at least one of titanium, tungsten, nitride, such as titanium nitride (TiN), or other suitable material. In some embodiments, the gate layer underlies the one or more other layers. Other structures and/or configurations of the one or more gate structure layers 202 are within the scope of the present disclosure.

FIGS. 3A-3D illustrate a first set of gate structures 302 formed from the one or more gate structure layers 202, according to some embodiments. The first set of gate structures 302 comprises one or more gate structures 302. In some embodiments, the one or more gate structure layers 202 are patterned to form the first set of gate structures 302, such as by removing portions of the one or more gate structure layers 202 to form openings 304 through the one or more gate structure layers 202. In some embodiments, the openings 304 expose portions of a top surface of the first dielectric layer 102. Other structures and/or configurations of the first set of gate structures 302 are within the scope of the present disclosure.

According to some embodiments, the first set of gate structures 302 are formed using a photoresist (not shown). The photoresist is formed over the one or more gate structure layers 202 by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist.

In some embodiments, an etching process is performed to remove portions of the one or more gate structure layers 202 to form the openings 304, where an opening in the photoresist allows one or more etchants applied during the etching process to remove the portions of the one or more gate structure layers 202 to form the openings 304 while the photoresist protects or shields portions of the one or more gate structure layers 202 that are covered by the photoresist. The etching process is at least one of a dry etching process, a wet etching process, an anisotropic etching process, an isotropic etching process, or other suitable etching process. The etching process uses at least one of fluorine, hydrogen fluoride (HF), diluted HF, sulfur hexafluoride (SF6), a chlorine compound such as hydrogen chloride (HCl2), hydrogen sulfide (H2S), tetrafluoromethane (CF4), or other suitable material. The photoresist is stripped or washed away after the first set of gate structures 302 are formed. Other processes and/or techniques for forming the first set of gate structures 302 are within the scope of the present disclosure.

Figure 3A:
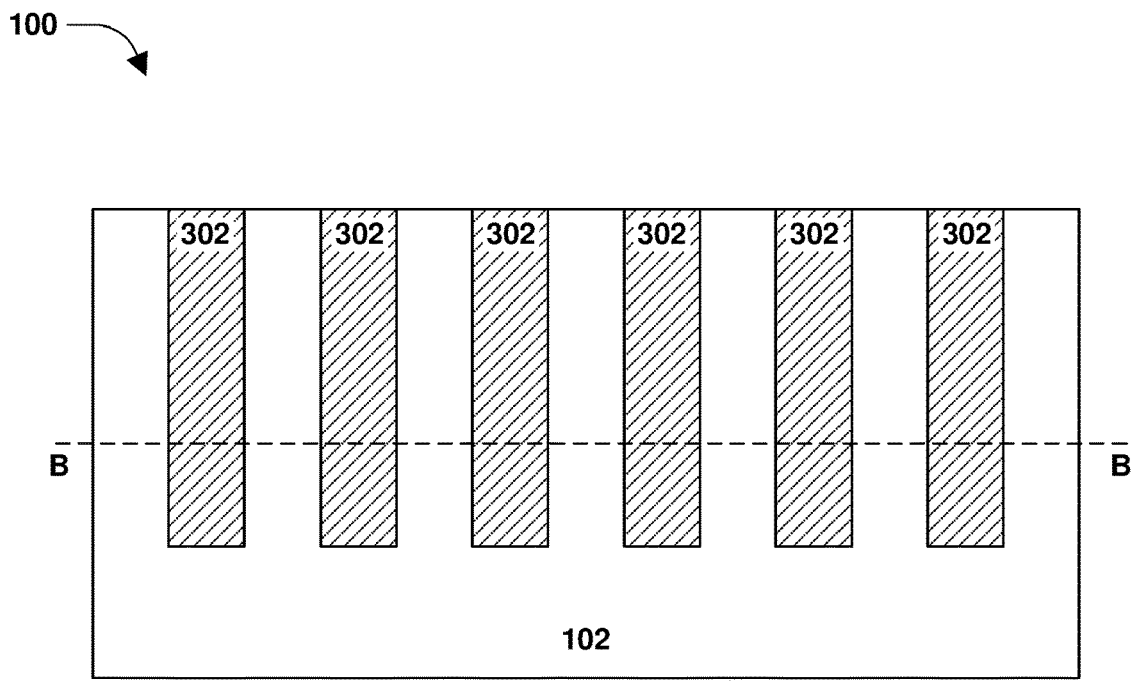
FIGS. 3A-3B illustrate a memory structure at a stage of fabrication, in accordance with some embodiments.
Figure 3B:
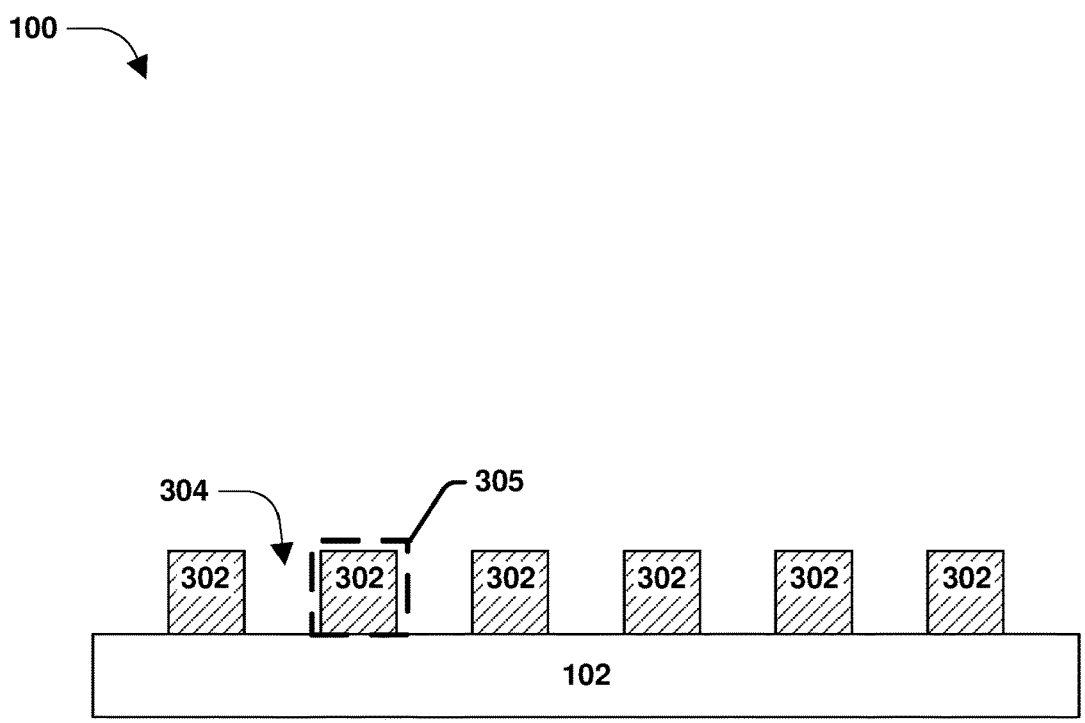
Figure 3C:
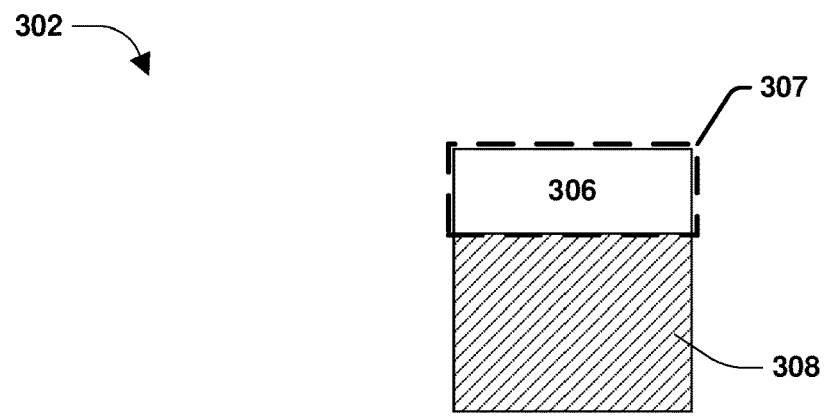
FIG. 3C illustrates a gate structure, in accordance with some embodiments.

FIG. 3C illustrates an enlarged and/or detailed cross-sectional view of a section 305 (FIG. 3B), of the memory structure 100, comprising a gate structure 302, according to some embodiments. An outline of the section 305 is shown in FIG. 3B with a dashed line box. The gate structure 302 comprises at least one of a gate 308, such as a control gate, or a charge storing component 306. The gate 308 comprise a metal. The gate 308 comprises at least one of titanium, tungsten, nitride, such as titanium nitride (TiN), or other suitable material. The charge storing component 306 at least one of overlies the gate 308, is in direct contact with the gate 308, or is in indirect contact with the gate 308. The charge storing component 306 is configured to store charge. Other structures and/or configurations of the gate 308 and/or the gate structure 302 are within the scope of the present disclosure.

Figure 3D:
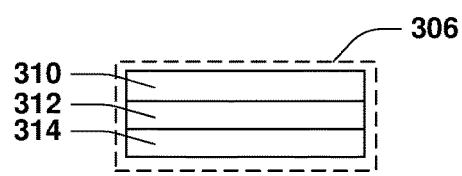
FIGS. 3D-3E illustrate a charge storing component, in accordance with some embodiments.

FIG. 3D illustrates an enlarged and/or detailed cross-sectional view of a section 307 (FIG. 3C), of a gate structure 302, comprising a charge storing component 306, according to some embodiments in which the charge storing component 306 comprises a dielectric charge trapping element for storing charge. An outline of the section 307 is shown in FIG. 3C with a dashed line box. The charge storing component 306 comprises one or more dielectric layers, such as dielectric layers stacked upon each other. A dielectric layer of the one or more dielectric layers comprises at least one of at least one of silicon, nitride, such as silicon nitride ($Si_3N_4$), oxide, such as silicon dioxide ($SiO_2$), or other suitable material. Other structures and/or configurations of the charge storing component 306 are within the scope of the present disclosure. In some embodiments, the one or more dielectric layers of the charge storing component 306 comprise an oxide-nitride-oxide (ONO) tri-layer. The ONO tri-layer of the one or more dielectric layers comprises a first oxide layer 310, a nitride layer 312, and a second oxide layer 314. The first oxide layer 310 at least one of overlies the nitride layer 312, is in direct contact with a top surface of the nitride layer 312, or is in indirect contact with the top surface of the nitride layer 312. The nitride layer 312 at least one of overlies the second oxide layer 314, is in direct contact with a top surface of the second oxide layer 314, or is in indirect contact with the top surface of the second oxide layer 314. The first oxide layer 310 comprises an oxide, such as silicon dioxide ($SiO_2$). The nitride layer 312 comprises a nitride, such as silicon nitride ($Si_3N_4$). The second oxide layer 314 comprises an oxide, such as silicon dioxide ($SiO_2$). In some embodiments, the nitride layer 312 corresponds to a dielectric charge trapping element of the charge storing component 306. Other structures and/or configurations of the ONO tri-layer are within the scope of the present disclosure.

Figure 3E:
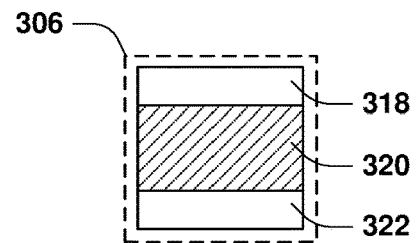

FIG. 3E illustrates an enlarged and/or detailed cross-sectional view of the section 307 (shown in FIG. 3C), of the gate structure 302, comprising a charge storing component 306, according to some embodiments in which the charge storing component 306 comprises a floating gate 320 for storing charge. The charge storing component 306 comprises at least one of a first dielectric component 318, the floating gate 320, or a second dielectric component 322. The first dielectric component 318 at least one of overlies the floating gate 320, is in direct contact with a top surface of the floating gate 320, or is in indirect contact with the top surface of the floating gate 320. The floating gate 320 at least one of overlies the second dielectric component 322, is in direct contact with a top surface of the second dielectric component 322, or is in indirect contact with the top surface of the second dielectric component 322. The second dielectric component 322 at least one of overlies the gate 308, is in direct contact with a top surface of the gate 308, or is in indirect contact with the top surface of the gate 308. In some embodiments, the first dielectric component 318 comprises a high-k dielectric material. The high-k dielectric material may be any suitable material. In some embodiments, the first dielectric component 318 comprises oxide, such as a high-k oxide. In some embodiments, the first dielectric component 318 comprises at least one of hafnium dioxide ($HfO_2$) or other suitable material. The floating gate 320 comprises at least one of titanium, tungsten, nitride, such as titanium nitride (TiN), or other suitable material. The second dielectric component 322 comprises one or more dielectric layers, such as merely a single dielectric layer or an ONO tri-layer (not shown). In some embodiments, the ONO tri-layer of the second dielectric component 322 comprises a third oxide layer, a second nitride layer and a fourth oxide layer. The second nitride layer at least one of overlies the third oxide layer, is in direct contact with a top surface of the third oxide layer, or is in indirect contact with the top surface of the third oxide layer. The fourth oxide layer at least one of overlies the second nitride layer, is in direct contact with a top surface of the second nitride layer, or is in indirect contact with the top surface of the second nitride layer. The third oxide layer comprises an oxide, such as silicon dioxide ($SiO_2$). The second nitride layer comprises a nitride, such as silicon nitride ($Si_3N_4$). The fourth oxide layer comprises an oxide, such as silicon dioxide ($SiO_2$). Other structures and/or configurations of the charge storing component 306 are within the scope of the present disclosure.

Other structures and/or configurations of a gate structure of the first set of gate structures 302 are within the scope of the present disclosure. In some embodiments, a gate structure of the first set of gate structures 302, and/or other gate structures provided herein, comprises a ferro-electric gate insulator, such as orthorhombic $HfZrO_x$ or other suitable ferro-electric gate insulator, as an alternative to or in addition to a charge storing component 306. In some embodiments, integration of ferro-electric gate insulators in at least one of gate structures or memory cells provided herein is enabled due to one or more of the techniques provided herein for forming memory cells, such as planar transistor processing.

In some embodiments, one, some and/or all gate structures 302 of the first set of gate structures 302 are spaced apart in a regular manner, such as where one, some and/or all gate structures 302 of the first set of gate structures 302 have about the same pitch.

In some embodiments, one, some and/or all gates 308 of the first set of gate structures 302 are control gates of transistors of the memory structure 100.

In some embodiments, the first set of gate structures 302 are formed using a damascene process (not shown) in which one or more trenches are formed in the first dielectric layer 102 and the first set of gate structures 302 are formed in the one or more trenches.

Figure 4A:
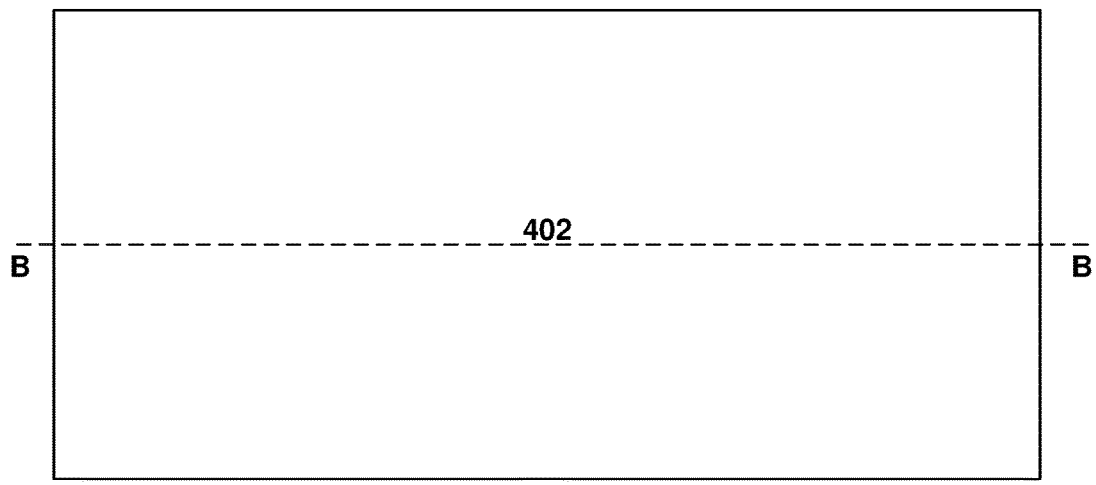
FIGS. 4A-4B illustrate a memory structure at a stage of fabrication, in accordance with some embodiments.
Figure 4B:
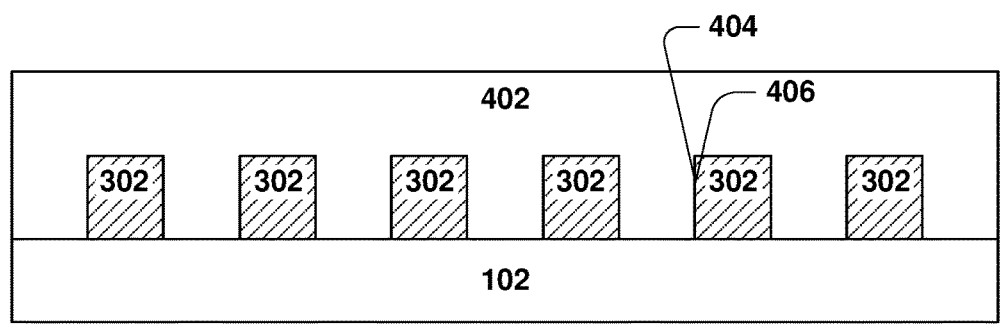

FIGS. 4A and 4B illustrate a second dielectric layer 402 formed over at least one of the first dielectric layer 102 or the gate structures 302, according to some embodiments. The second dielectric layer 402 comprises at least one of silicon, nitride, oxide, such as SiO2, or other suitable material. The second dielectric layer 402 is formed by at least one of PVD, sputtering, CVD, LPCVD, ALCVD, UHVCVD, RPCVD, ALD, MBE, LPE, spin on, growth, or other suitable techniques. The second dielectric layer 402 is an interlayer dielectric layer. Other structures and/or configurations of the second dielectric layer 402 are within the scope of the present disclosure.

In some embodiments, the second dielectric layer 402 is in direct contact with a top surface of the first dielectric layer 102. In some embodiments, the second dielectric layer 402 is different than the first dielectric layer 102, such as having a different material composition, such that an interface is defined between the second dielectric layer 402 and the first dielectric layer 102. In some embodiments, the second dielectric layer 402 does not have a material composition different than the first dielectric layer 102, and an interface between the second dielectric layer 402 and the first dielectric layer 102 may be defined due to the second dielectric layer 402 and the first dielectric layer 102 being separate, different, etc. layers. Embodiments are contemplated in which an interface between the second dielectric layer 402 and the first dielectric layer 102 is not defined. In some embodiments, the second dielectric layer 402 is in indirect contact with the top surface of the first dielectric layer 102, where one or more layers, such as a buffer layer, are between the second dielectric layer 402 and the first dielectric layer 102. The second dielectric layer 402 at least one of overlies gate structures 302 of the first set of gate structures 302, is in direct contact with top surfaces and/or sidewalls of gate structures 302 of the first set of gate structures 302, or is in indirect contact with top surfaces and/or sidewalls of gate structures 302 of the first set of gate structures 302. A sidewall 404 of the second dielectric layer 402 is aligned with a sidewall 406 of a gate structure 302. Other structures and/or configurations of the second dielectric layer 402 relative to other elements, features, etc. are within the scope of the present disclosure.

Figure 5A:
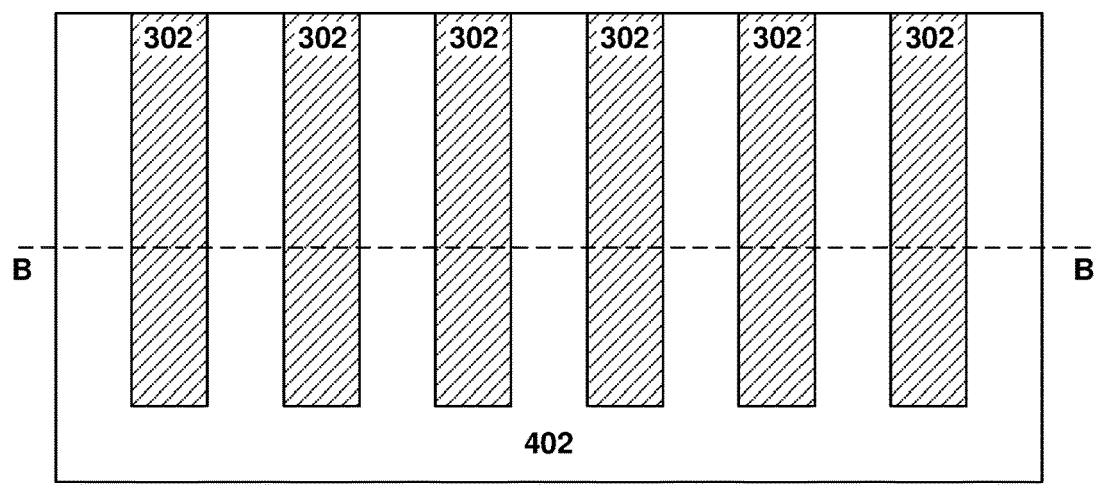
FIGS. 5A-5B illustrate a memory structure at a stage of fabrication, in accordance with some embodiments.
Figure 5B:
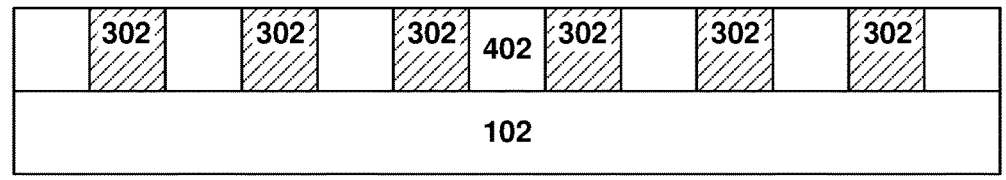

FIGS. 5A and 5B illustrate removal of a portion of the second dielectric layer 402, according to some embodiments. The portion of the second dielectric layer 402 is removed by at least one of chemical mechanical planarization (CMP), etching, or other suitable techniques. In some embodiments, removal of the portion of the second dielectric layer 402 exposes top surfaces of one, some and/or all gate structures of the first set of gate structures 302. In some embodiments, a top surface of a gate structure 302 is level or coplanar with a top surface of the second dielectric layer 402. Other structures and/or configurations of the second dielectric layer 402 and/or the first set of gate structures 302 are within the scope of the present disclosure.

Figure 6A:
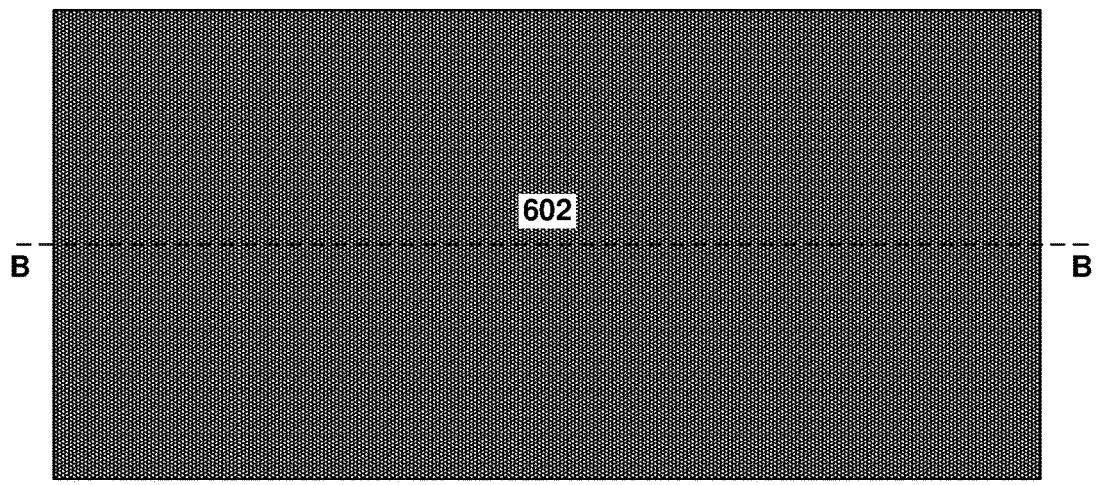
FIGS. 6A-6B illustrate a memory structure at a stage of fabrication, in accordance with some embodiments.
Figure 6B:
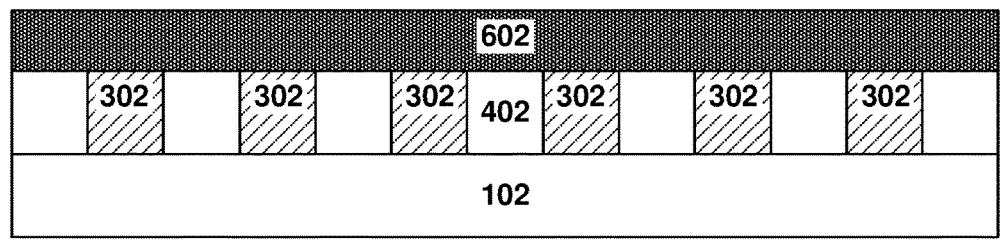

FIGS. 6A and 6B illustrate a first channel layer 602 formed over the second dielectric layer 402 and the first set of gate structures 302, according to some embodiments. The first channel layer 602 at least one of overlies the second dielectric layer 402, is in direct contact with a top surface of the second dielectric layer 402, or is in indirect contact with the top surface of the second dielectric layer 402. The first channel layer 602 at least one of overlies one, some and/or all gate structures of the first set of gate structures 302, is in direct contact with top surfaces of one, some and/or all gate structures of the first set of gate structures 302, or is in indirect contact with the top surfaces of one, some and/or all gate structures of the first set of gate structures 302. In some embodiments, one or more layers, such as a buffer layer, are between the first channel layer 602 and at least one of the second dielectric layer 402 or one, some and/or all gate structures of the first set of gate structures 302. The first channel layer 602 comprises at least one of an oxide semiconductor material or other suitable material. The first channel layer 602 comprises at least one of InGaZnO, InSnO, InWO, $In_2O_3$, $Ga_2O_3$, InGaZnO:Si, a III-V compound semiconductor, silicon, indium gallium arsenide, gallium arsenide, indium arsenide, or other suitable material. The first channel layer 602 is formed by at least one of PVD, sputtering, CVD, LPCVD, ALCVD, UHVCVD, RPCVD, ALD, MBE, LPE, spin on, growth, or other suitable techniques. Other structures and/or configurations of the first channel layer 602 are within the scope of the present disclosure.

Figure 7A:
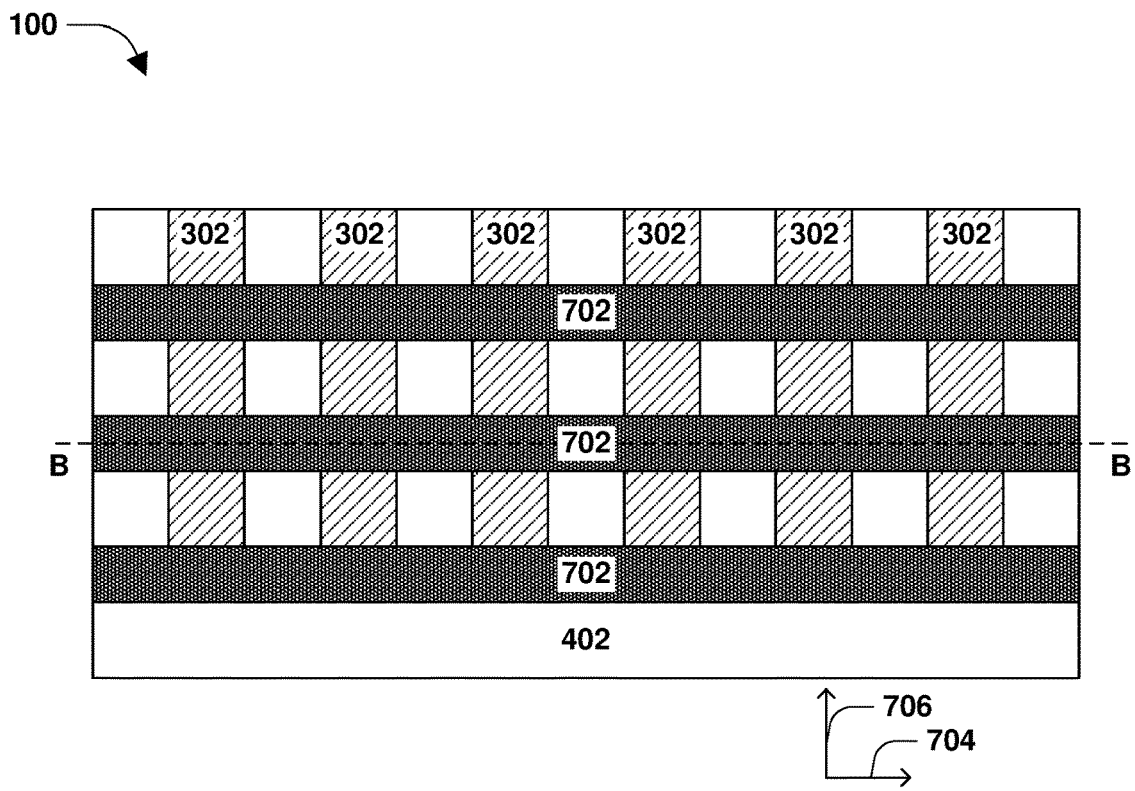
FIGS. 7A-7B illustrate a memory structure at a stage of fabrication, in accordance with some embodiments.
Figure 7B:
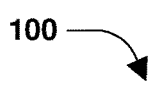

FIGS. 7A and 7B illustrate a first set of transistor channels 702 formed from the first channel layer 602, according to some embodiments. The first set of transistor channels 702 comprises one or more transistor channels 702. Each transistor channel of one, some and/or all of the first set of transistor channels 702 at least one of overlies the second dielectric layer 402, is in direct contact with a top surface of the second dielectric layer 402, or is in indirect contact with the top surface of the second dielectric layer 402. Each transistor channel of one, some and/or all of the first set of transistor channels 702 at least one of overlies one, some and/or all gate structures of the first set of gate structures 302, is in direct contact with top surfaces of one, some and/or all gate structures of the first set of gate structures 302, or is in indirect contact with the top surfaces of one, some and/or all gate structures of the first set of gate structures 302. Each transistor channel of one, some and/or all of the first set of transistor channels 702 extends in a direction 704 (shown in FIG. 7A). In some embodiments, the direction 704 is perpendicular to a direction 706 (shown in FIG. 7A) in which each gate structure of one, some and/or all gate structures of the first set of gate structures 302 extends. Other structures and/or configurations of the first set of transistor channels 702 relative to other elements, features, etc. are within the scope of the present disclosure.

According to some embodiments, one or more portions of the first channel layer 602 are removed to form the first set of transistor channels 702. In some embodiments, the one or more portions of the first channel layer 602 are removed using a photoresist (not shown). The photoresist is formed over the first channel layer 602 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove the one or more portions of the first channel layer 602, where openings in the photoresist allow one or more etchants applied during the etching process to remove the one or more portions of the first channel layer 602 while the photoresist protects or shields portions of the first channel layer 602 that are covered by the photoresist. The etching process is at least one of a dry etching process, a wet etching process, an anisotropic etching process, an isotropic etching process, or other suitable etching process. The etching process uses at least one of fluorine, HF, diluted HF, SF6, a chlorine compound such as HCl2, H2S, CF4, or other suitable material. The photoresist is stripped or washed away after the one or more portions of the first channel layer 602 are removed. Other processes and/or techniques for removing the one or more portions of the first channel layer 602 and/or forming the first set of transistor channels 702 are within the scope of the present disclosure.

In some embodiments, one, some and/or all transistor channels of the first set of transistor channels 702 are spaced apart in a regular manner along the direction 706 (shown in FIG. 7A).

Figure 8A:
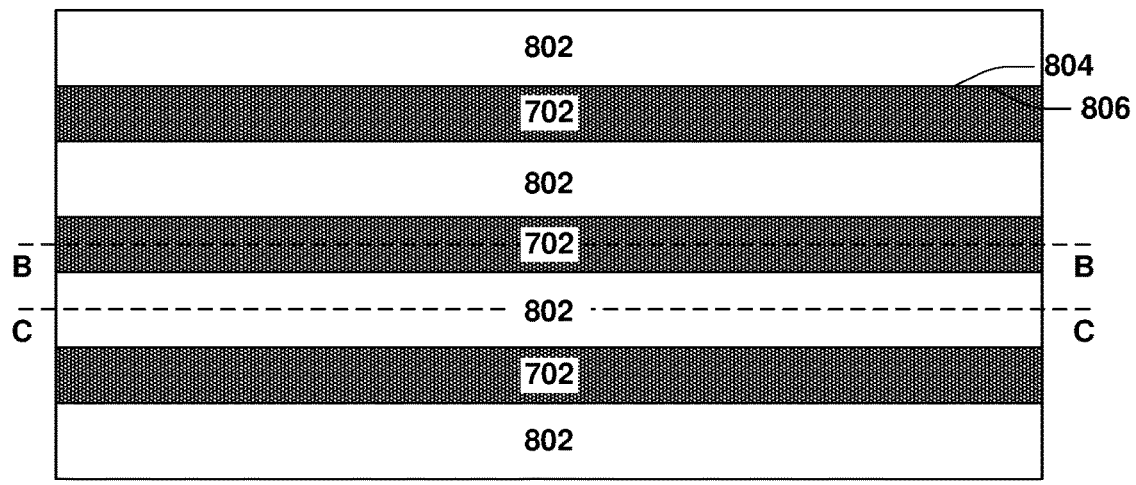
FIGS. 8A-8C illustrate a memory structure at a stage of fabrication, in accordance with some embodiments.
Figure 8B:
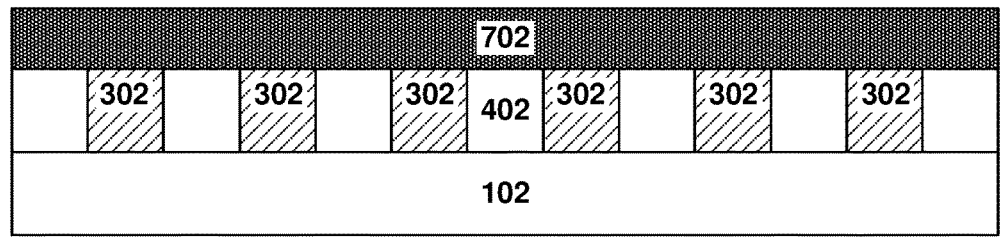
Figure 8C:
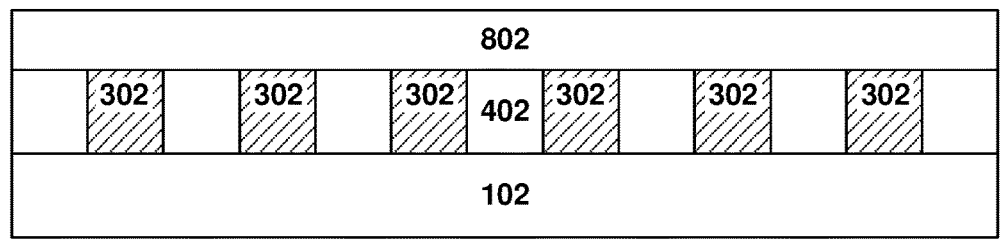

FIGS. 8A-8C illustrate a third dielectric layer 802 formed over at least one of the second dielectric layer 402 or the first set of gate structures 302, according to some embodiments. The third dielectric layer 802 comprises at least one of silicon, nitride, oxide, such as SiO2, or other suitable material. The third dielectric layer 802 is formed by at least one of PVD, sputtering, CVD, LPCVD, ALCVD, UHVCVD, RPCVD, ALD, MBE, LPE, spin on, growth, or other suitable techniques. The third dielectric layer 802 is an interlayer dielectric layer. Other structures and/or configurations of the third dielectric layer 802 are within the scope of the present disclosure.

The third dielectric layer 802 overlies the second dielectric layer 402 (as shown in FIG. 8C). In some embodiments, the third dielectric layer 802 is in direct contact with a top surface of the second dielectric layer 402. In some embodiments, the third dielectric layer 802 is different than the second dielectric layer 402, such as having a different material composition, such that an interface is defined between the third dielectric layer 802 and the second dielectric layer 402. In some embodiments, the third dielectric layer 802 does not have a material composition different than the second dielectric layer 402, and an interface between the third dielectric layer 802 and the second dielectric layer 402 may be defined due to the third dielectric layer 802 and the second dielectric layer 402 being separate, different, etc. layers. Embodiments are contemplated in which an interface between the third dielectric layer 802 and the second dielectric layer 402 is not defined. In some embodiments, the third dielectric layer 802 is in indirect contact with the top surface of the second dielectric layer 402, where one or more layers, such as a buffer layer, are between the third dielectric layer 802 and the second dielectric layer 402. The third dielectric layer 802 at least one of overlies gate structures 302 of the first set of gate structures 302 (as shown in FIG. 8C), is in direct contact with top surfaces of gate structures 302 of the first set of gate structures 302, or is in indirect contact with top surfaces of gate structures 302 of the first set of gate structures 302. A sidewall 804 (shown in FIG. 8A) of the third dielectric layer 802 is aligned with a sidewall 806 of a transistor channel 702. Other structures and/or configurations of the third dielectric layer 802 relative to other elements, features, etc. are within the scope of the present disclosure.

In some embodiments, a portion of the third dielectric layer 802, overlying the first set of transistor channels 702, is removed by at least one of CMP, etching, or other suitable techniques. In some embodiments, removal of the portion of the third dielectric layer 802 exposes top surfaces of one, some and/or all transistor channels of the first set of transistor channels 702 (as shown in FIG. 8A). In some embodiments, a top surface of a transistor channel 702 is level or coplanar with a top surface of the third dielectric layer 802. Other structures and/or configurations of the third dielectric layer 802 and/or the first set of transistor channels 702 are within the scope of the present disclosure.

Figure 9A:
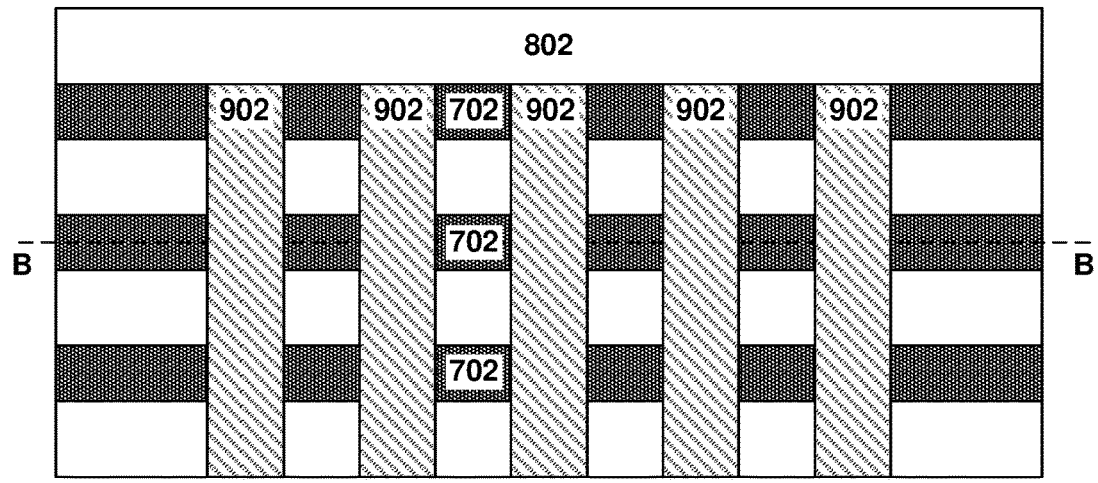
FIGS. 9A-9B illustrate a memory structure at a stage of fabrication, in accordance with some embodiments.
Figure 9B:
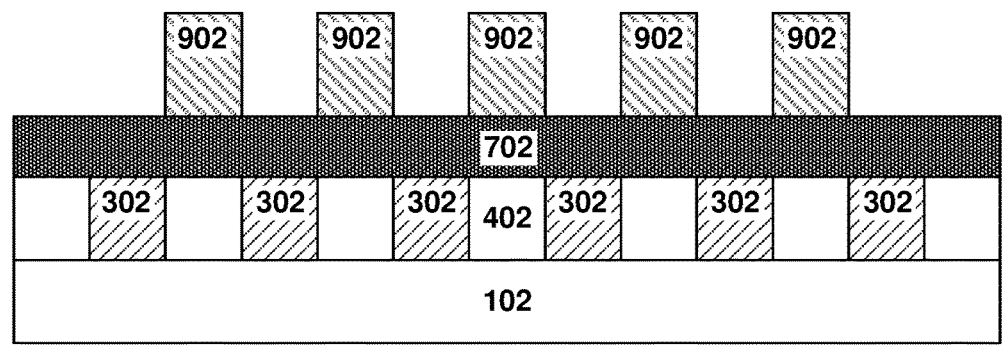

FIGS. 9A and 9B illustrate a second set of gate structures 902 formed over the first set of transistor channels 702, according to some embodiments. The second set of gate structures 902 comprises one or more gate structures 902. In some embodiments, one or more gate structure layers (not shown) are formed over the first set of transistor channels 702 and are patterned to form the second set of gate structures 902, such as using one or more of the techniques shown in and/or described with respect to FIGS. 2A-3D for forming the one or more gate structure layers 202 and/or forming the first set of gate structures 302. Other processes and/or techniques for forming the second set of gate structures 902 are within the scope of the present disclosure.

In some embodiments, a gate structure 902 of the second set of gate structures 902 comprises at least one of the one or more layers, features, structures, elements, etc. of a gate structure 302 of the first set of gate structures 302 (shown in and/or described with respect to FIGS. 3A-3E). Each gate structure of one, some and/or all of the second set of gate structures 902 at least one of overlies the third dielectric layer 802, is in direct contact with a top surface of the third dielectric layer 802, or is in indirect contact with the top surface of the third dielectric layer 802. Each gate structure of one, some and/or all of the second set of gate structures 902 at least one of overlies one, some and/or all transistor channels of the first set of transistor channels 702, is in direct contact with top surfaces of one, some and/or all transistor channels of the first set of transistor channels 702, or is in indirect contact with the top surfaces of one, some and/or all transistor channels of the first set of transistor channels 702. In some embodiments, each gate structure of one, some and/or all of the second set of gate structures 902 extends in the direction 706 (shown in FIG. 7A) in which each gate structure of one, some and/or all gate structures of the first set of gate structures 302 extends. Other structures and/or configurations of the second set of gate structures 902 relative to other elements, features, etc. are within the scope of the present disclosure.

A gate structure 902 comprises at least one of a gate 308, such as a control gate, or a charge storing component 306. In some embodiments, a gate structure 902 comprises multiple charge storing components 306 comprising a first charge storing component 306 overlying a gate 308 of the gate structure 902 and a second charge storing component 306 underlying the gate 308. Other structures and/or configurations of a gate structure of the second set of gate structures 902 are within the scope of the present disclosure. In some embodiments, a gate structure of the second set of gate structures 902 comprises a ferro-electric gate insulator, such as orthorhombic HfZrO$_x$ or other suitable ferro-electric gate insulator, as an alternative to or in addition to a charge storing component 306.

In some embodiments, gate structures 902 of the second set of gate structures 902 are laterally offset from gate structures 302 of the first set of gate structures 302. In some embodiments, a gate structure 902 of the second set of gate structures 902 overlies a region between two adjacent gate structures 302 of the first set of gate structures 302. In some embodiments, as shown in FIG. 9B, a gate structure 902 of the second set of gate structures 902 is not vertically coincident with a gate structure 302 of the first set of gate structures 302. In some embodiments (not shown), a gate structure 902 of the second set of gate structures 902 is vertically coincident with a gate structure 302 of the first set of gate structures 302.

In some embodiments, one, some and/or all gate structures 902 of the second set of gate structures 902 are spaced apart in a regular manner, such as where one, some and/or all gate structures 902 of the second set of gate structures 902 have about the same pitch. In some embodiments, the pitch of the second set of gate structures 902 is about equal to the pitch of the first gate structures 302.

In some embodiments, one, some and/or all gates 308 of the second set of gate structures 902 are control gates of transistors of the memory structure 100.

In some embodiments, the second set of gate structures 902 are formed using a damascene process (not shown) in which one or more trenches are formed in a dielectric layer overlying the first set of transistor channels 702 and the second set of gate structures 902 are formed in the one or more trenches.

Figure 10A:
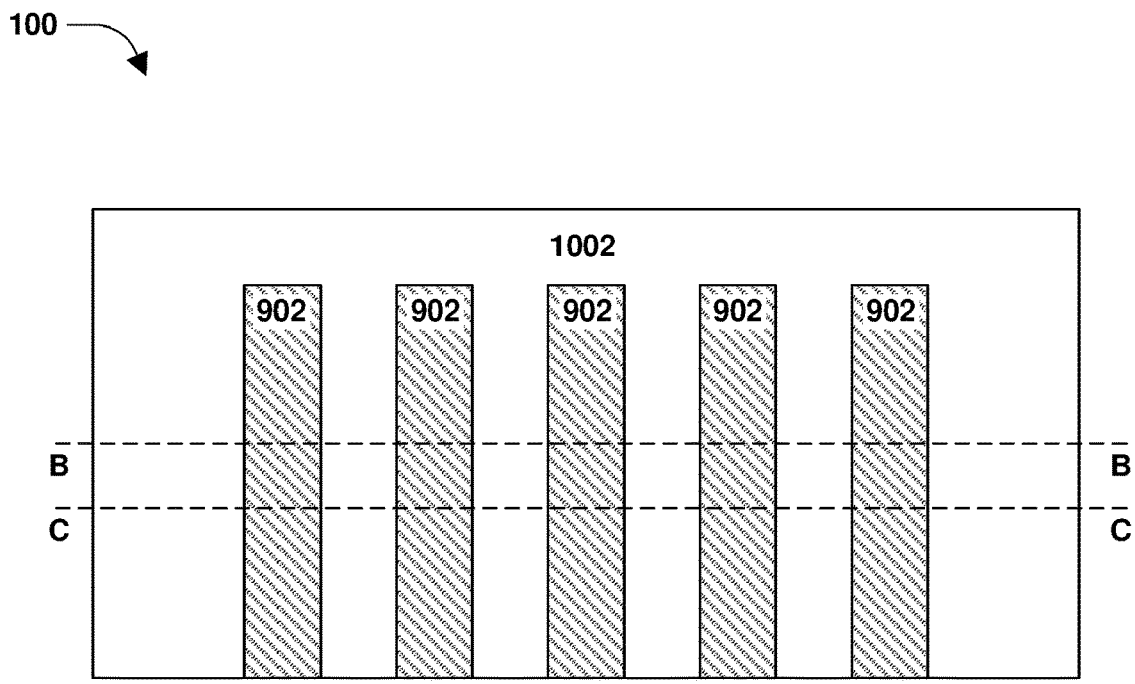
FIGS. 10A-10C illustrate a memory structure at a stage of fabrication, in accordance with some embodiments.
Figure 10B:
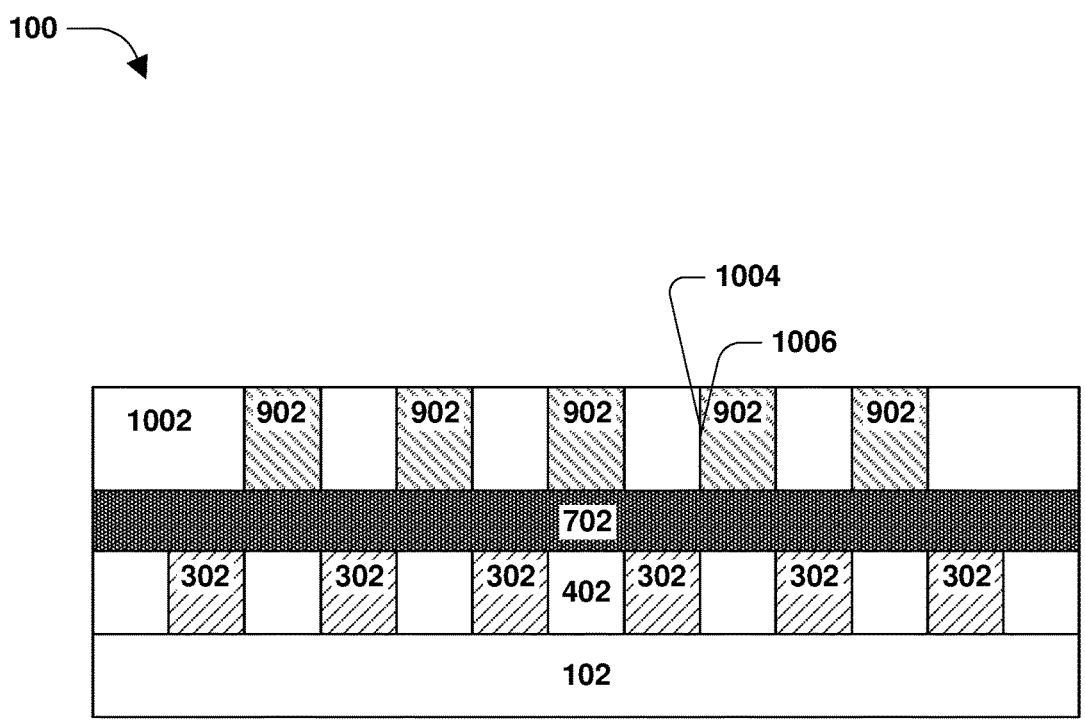
Figure 10C:
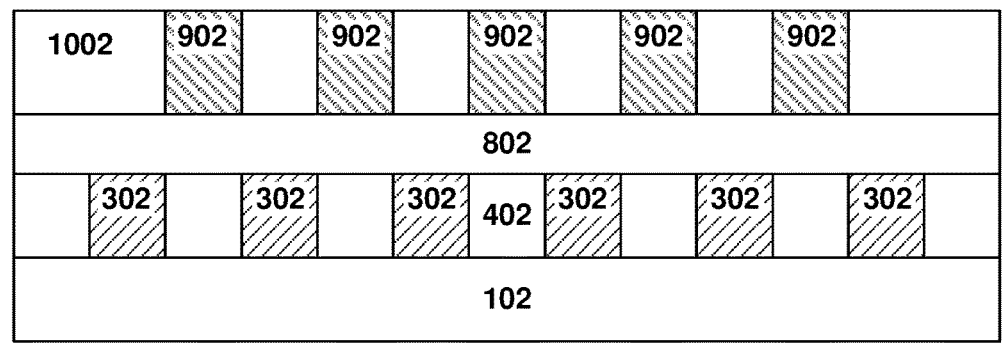

FIGS. 10A-10C illustrate a fourth dielectric layer 1002 formed over at least one of the third dielectric layer 802 or the first set of transistor channels 702, according to some embodiments. The fourth dielectric layer 1002 comprises at least one of silicon, nitride, oxide, such as SiO2, or other suitable material. The fourth dielectric layer 1002 is formed by at least one of PVD, sputtering, CVD, LPCVD, ALCVD, UHVCVD, RPCVD, ALD, MBE, LPE, spin on, growth, or other suitable techniques. The fourth dielectric layer 1002 is an interlayer dielectric layer. Other structures and/or configurations of the fourth dielectric layer 1002 are within the scope of the present disclosure.

The fourth dielectric layer 1002 overlies the third dielectric layer 802 (as shown in FIG. 10C). In some embodiments, the fourth dielectric layer 1002 is in direct contact with a top surface of the third dielectric layer 802. In some embodiments, the fourth dielectric layer 1002 is different than the third dielectric layer 802, such as having a different material composition, such that an interface is defined between the fourth dielectric layer 1002 and the third dielectric layer 802. In some embodiments, the fourth dielectric layer 1002 does not have a material composition different than the third dielectric layer 802 and an interface between the fourth dielectric layer 1002 and the third dielectric layer 802 may be defined due to the fourth dielectric layer 1002 and the third dielectric layer 802 being separate, different, etc. layers. Embodiments are contemplated in which an interface between the fourth dielectric layer 1002 and the third dielectric layer 802 is not defined. In some embodiments, the fourth dielectric layer 1002 is in indirect contact with the top surface of the third dielectric layer 802, where one or more layers, such as a buffer layer, are between the fourth dielectric layer 1002 and the third dielectric layer 802. The fourth dielectric layer 1002 at least one of overlies transistor channels 702 of the first set of transistor channels 702 (as shown in FIG. 10B), is in direct contact with top surfaces of transistor channels 702 of the first set of transistor channels 702, or is in indirect contact with top surfaces of transistor channels 702 of the first set of transistor channels 702. A sidewall 1004 (shown in FIG. 10B) of the fourth dielectric layer 1002 is aligned with a sidewall 1006 of a gate structure 902. Other structures and/or configurations of the fourth dielectric layer 1002 relative to other elements, features, etc. are within the scope of the present disclosure.

In some embodiments, a portion of the fourth dielectric layer 1002, overlying the second set of gate structures 902, is removed by at least one of CMP, etching, or other suitable techniques. In some embodiments, removal of the portion of the fourth dielectric layer 1002 exposes top surfaces of one, some and/or all gate structures of the second set of gate structures 902 (as shown in FIG. 10A). In some embodiments, a top surface of a gate structure 902 is level or coplanar with a top surface of the fourth dielectric layer 1002. Other structures and/or configurations of the fourth dielectric layer 1002 and/or the second set of gate structures 902 are within the scope of the present disclosure.

Figure 11A:
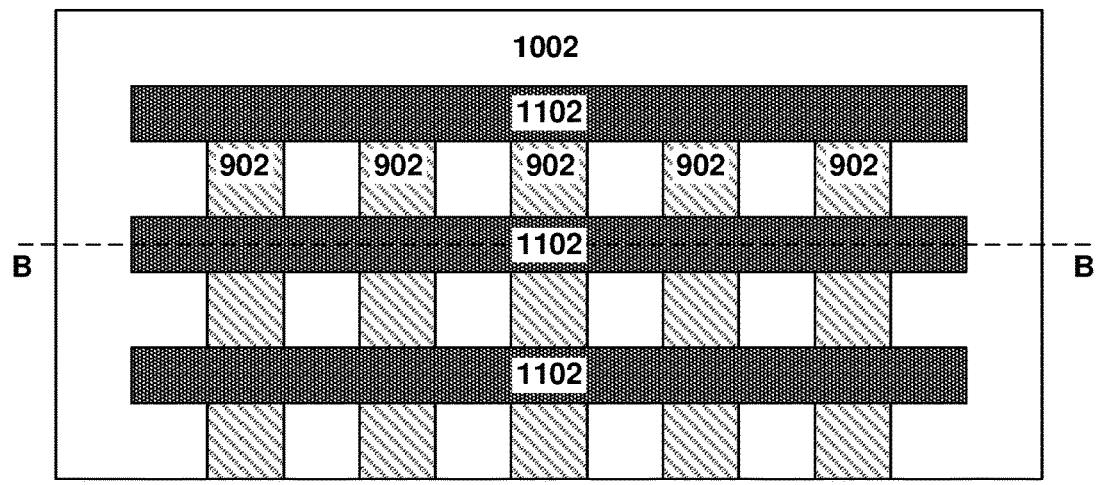
FIGS. 11A-11B illustrate a memory structure at a stage of fabrication, in accordance with some embodiments.
Figure 11B:
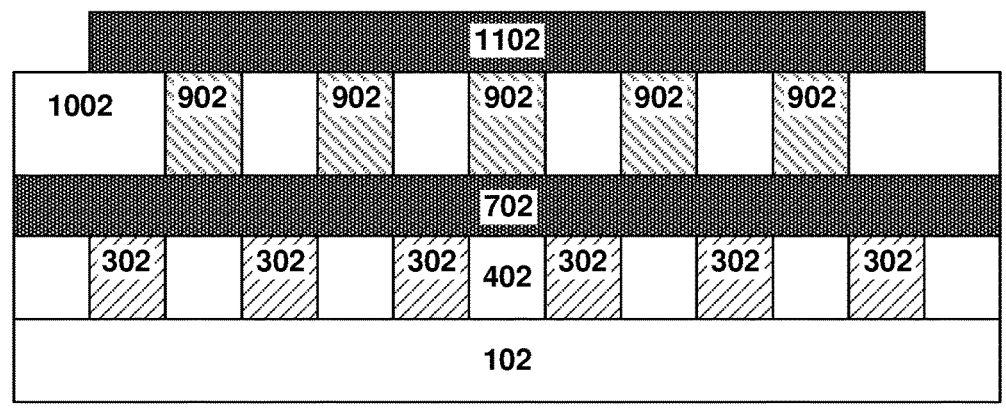

FIGS. 11A and 11B illustrate a second set of transistor channels 1102 formed over the second set of gate structures 902, according to some embodiments. The second set of transistor channels 1102 comprises one or more transistor channels 1102. In some embodiments, a channel layer (not shown) is formed over the second set of gate structures 902 and is patterned to form the second set of transistor channels 1102, such as using one or more of the techniques shown in and/or described with respect to FIGS. 6A-7B for forming the first channel layer 602 and/or forming the first set of transistor channels 702. Other processes and/or techniques for forming the second set of transistor channels 1102 are within the scope of the present disclosure. A transistor channel 1102 comprises at least one of an oxide semiconductor material or other suitable material. The transistor channel 1102 comprises at least one of InGaZnO, InSnO, InWO, In$_2$O$_3$, Ga$_2$O$_3$, InGaZnO:Si, a III-V compound semiconductor, silicon, indium gallium arsenide, gallium arsenide, indium arsenide, or other suitable material. Other structures and/or configurations of the second set of transistor channels 1102 are within the scope of the present disclosure.

Each transistor channel of one, some and/or all of the second set of transistor channels 1102 at least one of overlies the fourth dielectric layer 1002, is in direct contact with a top surface of the fourth dielectric layer 1002, or is in indirect contact with the top surface of the fourth dielectric layer 1002. Each transistor channel of one, some and/or all of the second set of transistor channels 1102 at least one of overlies one, some and/or all gate structures of the second set of gate structures 902, is in direct contact with top surfaces of one, some and/or all gate structures of the second set of gate structures 902, or is in indirect contact with the top surfaces of one, some and/or all gate structures of the second set of gate structures 902. Each transistor channel of one, some and/or all of the second set of transistor channels 1102 extends in the direction 704 (shown in FIG. 7A). In some embodiments, the direction 704 is perpendicular to the direction 706 (shown in FIG. 7A) in which each gate structure of one, some and/or all gate structures of the second set of gate structures 902 extends. Other structures and/or configurations of the second set of transistor channels 1102 relative to other elements, features, etc. are within the scope of the present disclosure.

In some embodiments, one, some and/or all transistor channels of the second set of transistor channels 1102 are spaced apart in a regular manner. In some embodiments, each transistor channel of one, some and/or all of the second set of transistor channels 1102 overlies a transistor channel of the first set of transistor channels 702. In some embodiments, the pitch of the transistor channels of the second set of transistor channels 1102 in the direction 706 is about equal to the pitch of the transistor channels of the first set of transistor channels 702 in the direction 706.

Figure 12A:
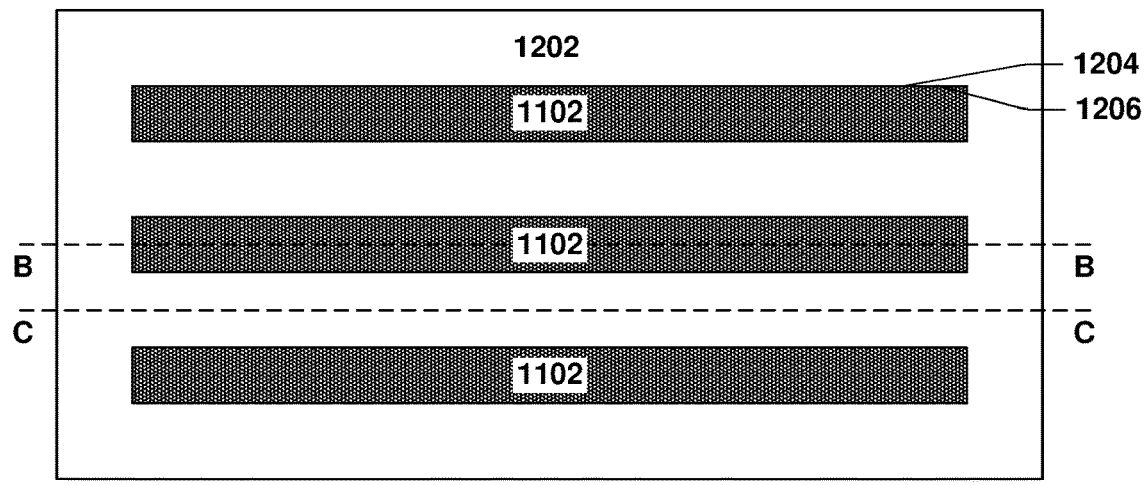
FIGS. 12A-12C illustrate a memory structure at a stage of fabrication, in accordance with some embodiments.
Figure 12B:
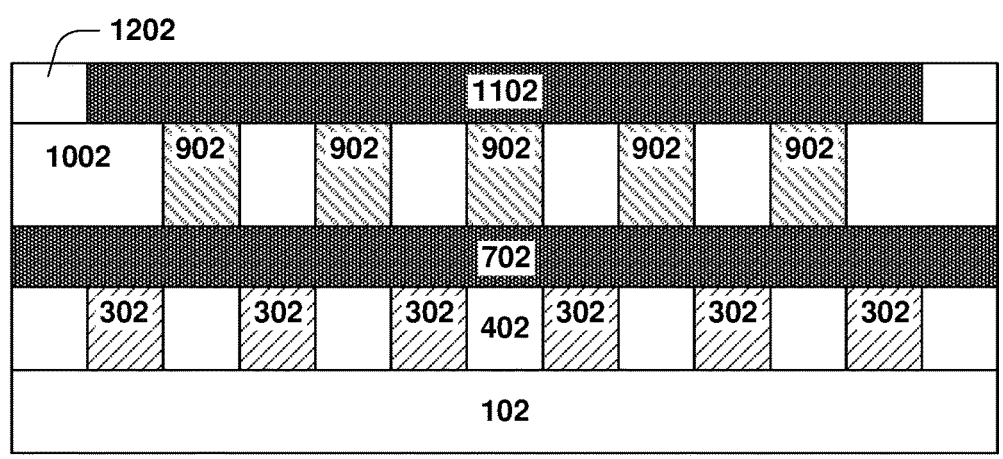
Figure 12C:
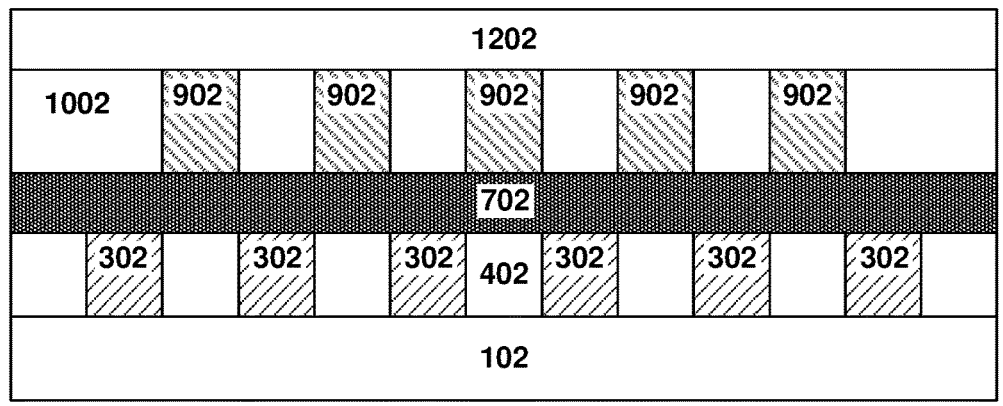

FIGS. 12A-12C illustrate a fifth dielectric layer 1202 formed over at least one of the fourth dielectric layer 1002 or the second set of gate structures 902, according to some embodiments. The fifth dielectric layer 1202 comprises at least one of silicon, nitride, oxide, such as SiO2, or other suitable material. The fifth dielectric layer 1202 is formed by at least one of PVD, sputtering, CVD, LPCVD, ALCVD, UHVCVD, RPCVD, ALD, MBE, LPE, spin on, growth, or other suitable techniques. The fifth dielectric layer 1202 is an interlayer dielectric layer. Other structures and/or configurations of the fifth dielectric layer 1202 are within the scope of the present disclosure.

The fifth dielectric layer 1202 overlies the fourth dielectric layer 1002 (as shown in FIGS. 12B and 12C). In some embodiments, the fifth dielectric layer 1202 is in direct contact with a top surface of the fourth dielectric layer 1002. In some embodiments, the fifth dielectric layer 1202 is different than the fourth dielectric layer 1002, such as having a different material composition, such that an interface is defined between the fifth dielectric layer 1202 and the fourth dielectric layer 1002. In some embodiments, the fifth dielectric layer 1202 does not have a material composition different than the fourth dielectric layer 1002 and an interface between the fifth dielectric layer 1202 and the fourth dielectric layer 1002 may be defined due to the fifth dielectric layer 1202 and the fourth dielectric layer 1002 being separate, different, etc. layers. Embodiments are contemplated in which an interface between the fifth dielectric layer 1202 and the fourth dielectric layer 1002 is not defined. In some embodiments, the fifth dielectric layer 1202 is in indirect contact with the top surface of the fourth dielectric layer 1002, where one or more layers, such as a buffer layer, are between the fifth dielectric layer 1202 and the fourth dielectric layer 1002. The fifth dielectric layer 1202 at least one of overlies gate structures 902 of the second set of gate structures 902 (as shown in FIG. 12C), is in direct contact with top surfaces of gate structures 902 of the second set of gate structures 902, or is in indirect contact with top surfaces of gate structures 902 of the second set of gate structures 902. A sidewall 1204 (shown in FIG. 12A) of the fifth dielectric layer 1202 is aligned with a sidewall 1206 of a transistor channel 1102. Other structures and/or configurations of the fifth dielectric layer 1202 relative to other elements, features, etc. are within the scope of the present disclosure.

In some embodiments, a portion of the fifth dielectric layer 1202, overlying the second set of transistor channels 1102, is removed by at least one of CMP, etching, or other suitable techniques. In some embodiments, removal of the portion of the fifth dielectric layer 1202 exposes top surfaces of one, some and/or all transistor channels of the second set of transistor channels 1102 (as shown in FIG. 12A). In some embodiments, a top surface of a transistor channel 1102 is level or coplanar with a top surface of the fifth dielectric layer 1202. Other structures and/or configurations of the fifth dielectric layer 1202 and/or the second set of transistor channels 1102 are within the scope of the present disclosure.

Figure 13A:
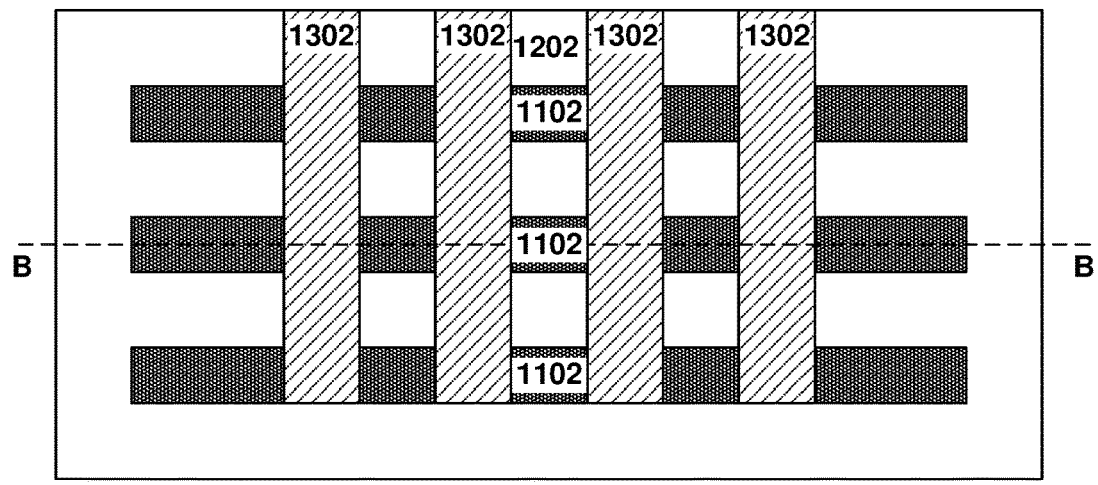
FIGS. 13A-13B illustrate a memory structure at a stage of fabrication, in accordance with some embodiments.
Figure 13B:
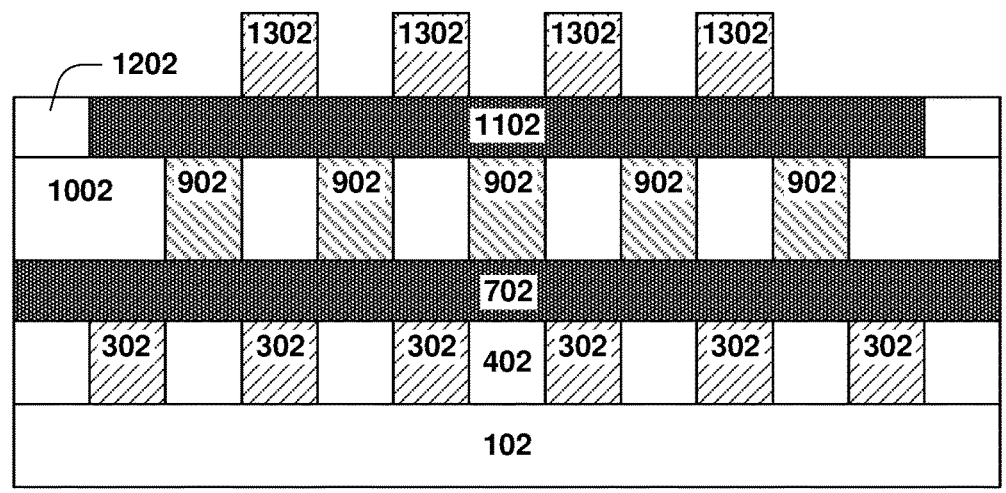
Figure 14A:
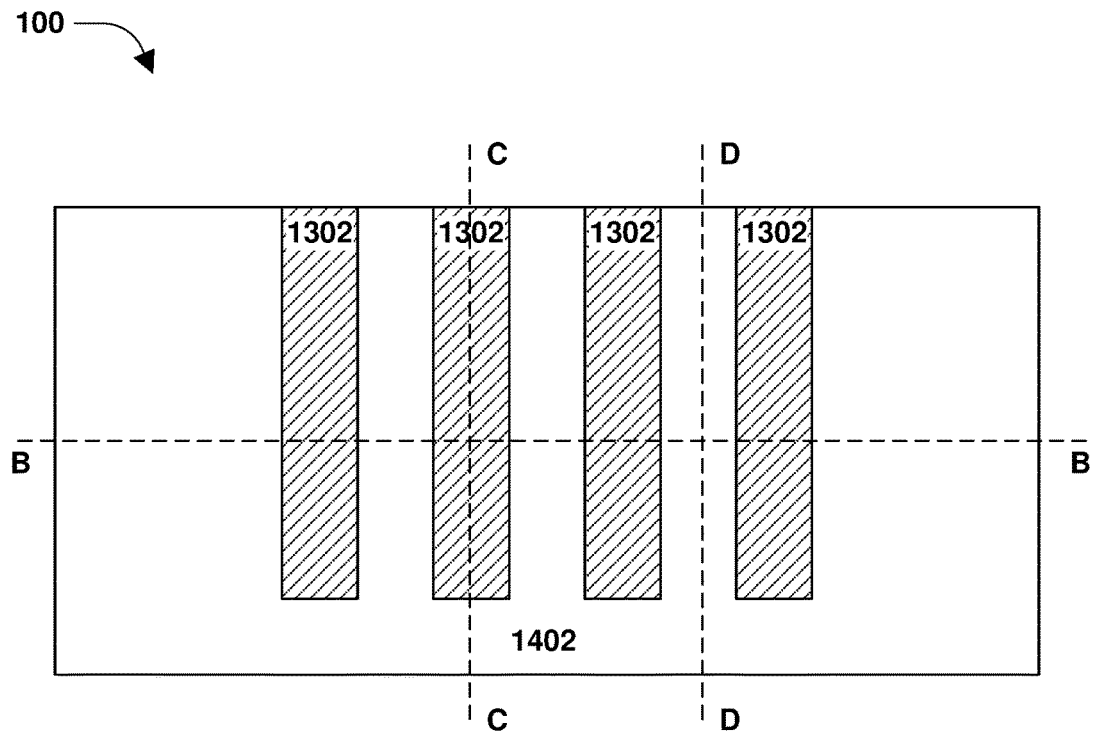
FIGS. 14A-14F illustrate a memory structure at a stage of fabrication, in accordance with some embodiments.
Figure 14B:
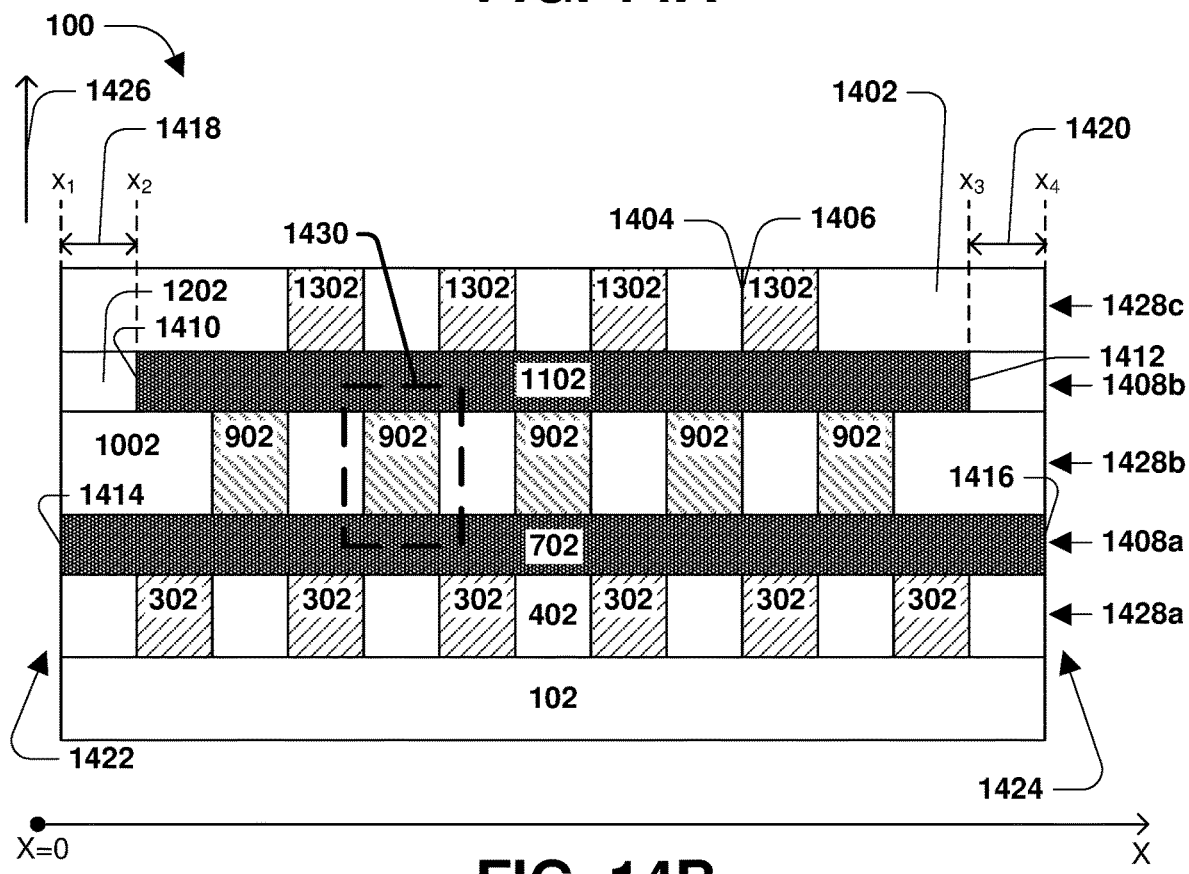

FIGS. 13A and 13B illustrate a third set of gate structures 1302 formed over the second set of transistor channels 1102, according to some embodiments. The third set of gate structures 1302 comprises one or more gate structures 1302. In some embodiments, one or more gate structure layers (not shown) are formed over the second set of transistor channels 1102 and are patterned to form the third set of gate structures 1302, such as using one or more of the techniques shown in and/or described with respect to FIGS. 2A-3E for forming the one or more gate structure layers 202 and/or forming the first set of gate structures 302. Other processes and/or techniques for forming the third set of gate structures 1302 are within the scope of the present disclosure.

In some embodiments, a gate structure 1302 of the third set of gate structures 1302 comprises at least one of the one or more layers, features, structures, elements, etc. of a gate structure 302 of the first set of gate structures 302 (shown in and/or described with respect to FIGS. 3A-3E). Each gate structure of one, some and/or all of the third set of gate structures 1302 at least one of overlies the fifth dielectric layer 1202, is in direct contact with a top surface of the fifth dielectric layer 1202, or is in indirect contact with the top surface of the fifth dielectric layer 1202. Each gate structure of one, some and/or all of the third set of gate structures 1302 at least one of overlies one, some and/or all transistor channels of the second set of transistor channels 1102, is in direct contact with top surfaces of one, some and/or all transistor channels of the second set of transistor channels 1102, or is in indirect contact with the top surfaces of one, some and/or all transistor channels of the second set of transistor channels 1102. In some embodiments, each gate structure of one, some and/or all of the third set of gate structures 1302 extends in the direction 706 (shown in FIG. 7A) in which each gate structure of one, some and/or all gate structures of the first set of gate structures 302 extends. Other structures and/or configurations of the third set of gate structures 1302 relative to other elements, features, etc. are within the scope of the present disclosure.

A gate structure 1302 comprises at least one of a gate 308, such as a control gate, or a charge storing component 306. In some embodiments, such as in an embodiment in which a gate structure 1302 is in contact with a transistor channel underlying the gate structure 1302 and a transistor channel overlying the gate structure 1302, the gate structure 1302 comprises multiple charge storing components 306 comprising a first charge storing component 306 overlying a gate 308 of the gate structure 1302 and a second charge storing component 306 underlying the gate 308. In some embodiments, such as in an embodiment in which a gate structure 1302 is in contact with a transistor channel underlying the gate structure 1302 and is not in contact with a transistor channel overlying the gate structure 1302, the gate structure 1302 comprises a charge storing component 306 underlying the gate 308. Other structures and/or configurations of a gate structure of the third set of gate structures 1302 are within the scope of the present disclosure. In some embodiments, a gate structure of the third set of gate structures 1302 comprises a ferro-electric gate insulator, such as orthorhombic $HfZrO_x$ or other suitable ferro-electric gate insulator, as an alternative to or in addition to a charge storing component 306.

In some embodiments, gate structures 1302 of the third set of gate structures 1302 are laterally offset from gate structures 902 of the second set of gate structures 902. In some embodiments, a gate structure 1302 of the third set of gate structures 1302 overlies a region between two adjacent gate structures 902 of the second set of gate structures 902. In some embodiments, as shown in FIG. 9B, a gate structure 902 of the third set of gate structures 1302 is not vertically coincident with a gate structure 902 of the second set of gate structures 902. In some embodiments (not shown), a gate structure 902 of the third set of gate structures 1302 is vertically coincident with a gate structure 902 of the second set of gate structures 902. In some embodiments, each gate structure of one, some and/or all gate structures of the third set of gate structures 1302 is vertically coincident with a gate structure 302 of the first set of gate structures 302.

In some embodiments, one, some and/or all gates 308 of the third set of gate structures 1302 are spaced apart in a regular manner, such as where one, some and/or all gates 308 of the third set of gate structures 1302 have about the same pitch. In some embodiments, the pitch of the third set of gate structures 1302 is about equal to the pitch of the first gate structures 302.

In some embodiments, one, some and/or all gates 308 of the third set of gate structures 1302 are control gates of transistors of the memory structure 100.

In some embodiments, the third set of gate structures 1302 are formed using a damascene process (not shown) in which one or more trenches are formed in a dielectric layer overlying the second set of transistor channels 1102 and the third set of gate structures 1302 are formed in the one or more trenches.

FIGS. 14A-14F illustrate a sixth dielectric layer 1402 formed over at least one of the fifth dielectric layer 1202 or the second set of transistor channels 1102, according to some embodiments. The sixth dielectric layer 1402 comprises at least one of silicon, nitride, oxide, such as SiO2, or other suitable material. The sixth dielectric layer 1402 is formed by at least one of PVD, sputtering, CVD, LPCVD, ALCVD, UHVCVD, RPCVD, ALD, MBE, LPE, spin on, growth, or other suitable techniques. The sixth dielectric layer 1402 is an interlayer dielectric layer. Other structures and/or configurations of the sixth dielectric layer 1402 are within the scope of the present disclosure.

The sixth dielectric layer 1402 overlies the fifth dielectric layer 1202 (as shown in FIGS. 14B-14D and 14F). In some embodiments, the sixth dielectric layer 1402 is in direct contact with a top surface of the fifth dielectric layer 1202. In some embodiments, the sixth dielectric layer 1402 is different than the fifth dielectric layer 1202, such as having a different material composition, such that an interface is defined between the sixth dielectric layer 1402 and the fifth dielectric layer 1202. In some embodiments, the sixth dielectric layer 1402 does not have a material composition different than the fifth dielectric layer 1202, and an interface between the sixth dielectric layer 1402 and the fifth dielectric layer 1202 may be defined due to the sixth dielectric layer 1402 and the fifth dielectric layer 1202 being separate, different, etc. layers. Embodiments are contemplated in which an interface between the sixth dielectric layer 1402 and the fifth dielectric layer 1202 is not defined. In some embodiments, the sixth dielectric layer 1402 is in indirect contact with the top surface of the fifth dielectric layer 1202, where one or more layers, such as a buffer layer, are between the sixth dielectric layer 1402 and the fifth dielectric layer 1202. The sixth dielectric layer 1402 at least one of overlies transistor channels 1102 of the second set of transistor channels 1102 (as shown in FIGS. 14B-14D and 14F), is in direct contact with top surfaces of transistor channels 1102 of the second set of transistor channels 1102, or is in indirect contact with top surfaces of transistor channels 1102 of the second set of transistor channels 1102. A sidewall 1404 (shown in FIG. 14B) of the sixth dielectric layer 1402 is aligned with a sidewall 1406 of a gate structure 1302. Other structures and/or configurations of the sixth dielectric layer 1402 relative to other elements, features, etc. are within the scope of the present disclosure.

In some embodiments, a portion of the sixth dielectric layer 1402, overlying the third set of gate structures 1302, is removed by at least one of CMP, etching, or other suitable techniques. In some embodiments, removal of the portion of the sixth dielectric layer 1402 exposes top surfaces of one, some and/or all gate structures of the third set of gate structures 1302 (as shown in FIG. 10A). In some embodiments, a top surface of a gate structure 1302 is level or coplanar with a top surface of the sixth dielectric layer 1402. Other structures and/or configurations of the sixth dielectric layer 1402 and/or the third set of gate structures 1302 are within the scope of the present disclosure.

In some embodiments, the memory structure 100 comprises multiple layers of transistor channels 1408 stacked over each other. The multiple layers of transistor channels 1408 (shown in FIG. 14B) comprise at least one of a first layer of transistor channels 1408a comprising the first set of transistor channels 702, a second layer of transistor channels 1408b, over the first layer of transistor channels 1408a, comprising the second set of transistor channels 1102, or one or more other layers of transistor channels over the second layer of transistor channels 1408b. Although FIG. 14B shows two layers of transistor channels stacked over each other, any number of layers of transistor channels of the multiple layers of transistor channels 1408 is contemplated. In some embodiments, each layer of transistor channels of one, some and/or all of the multiple layers of transistor channels 1408 comprises one or more transistor channels that are in direct contact or indirect contact with at least one of one or more gate structures underlying the layer of transistor channels or one or more gate structures overlying the layer of transistor channels.

In some embodiments, transistor channels of different layers of the multiple layers of transistor channels 1408 have different sizes and/or positions. In some embodiments, the multiple layers of transistor channels 1408 are formed such that the multiple layers of transistor channels 1408 have a staircase-like arrangement from a first side 1422 of the memory structure 100 and/or a staircase-like arrangement from a second side 1424 of the memory structure 100.

In some embodiments, each transistor channel of one, some and/or all transistor channels of the multiple layers of transistor channels 1408, comprises a first side-proximal edge and a second side-proximal edge, wherein the first side-proximal edge is closer to the first side 1422 of the memory structure 100 than the second side-proximal edge, and wherein the second side-proximal edge is closer to the second side 1424 of the memory structure 100 than the first side-proximal edge. One or more transistor channels of the first layer of transistor channels 1408a, such as one, some and/or all of the first set of transistor channels 702, extend from an x-axis position $x_1$ on an x-axis (shown in FIG. 14B) to an x-axis position $x_4$ on the x-axis. As shown in FIG. 14B, a transistor channel 702 of the first layer of transistor channels 1408a comprises a first side-proximal edge 1414 and a second side-proximal edge 1416, wherein the first side-proximal edge 1414 has the x-axis position $x_1$ and the second side-proximal edge 1416 has the x-axis position $x_4$. One or more transistor channels of the second layer of transistor channels 1408b, such as one, some and/or all of the second set of transistor channels 1102, extend from an x-axis position $x_2$ on the x-axis to an x-axis position $x_3$ on the x-axis. As shown in FIG. 14B, a transistor channel 1102 of the second layer of transistor channels 1408b comprises a first side-proximal edge 1410 and a second side-proximal edge 1412, wherein the first side-proximal edge 1410 has the x-axis position $x_2$ and the second side-proximal edge 1412 has the x-axis position $x_3$.

In some embodiments, x-axis positional values of first side-proximal edges of transistor channels increase across the multiple layers of transistor channels 1408 along a direction 1426 (shown in FIG. 14B), such as to form a staircase-like arrangement from the first side 1422 of the memory structure 100. For example, the x-axis position $x_2$ of the first side-proximal edge 1410 of the transistor channel 1102 in the second layer of transistor channels 1408b is larger than the x-axis position $x_1$ of the first side-proximal edge 1414 of the transistor channel 702 of the first layer of transistor channels 1408a. In some embodiments in which a third layer of transistor channels (not shown) is formed over the second layer of transistor channels 1408b, an x-axis position of one or more first side-proximal edges of the third layer of transistor channels is larger than the x-axis position $x_2$ of the first side-proximal edge 1410 of the transistor channel 1102. In some embodiments, an x-axis position offset of first side-proximal edges of two consecutive layers 1408 is configured such that there is space for a via to extend to and/or contact a transistor channel of a lower layer of the two consecutive layers without contacting a transistor channel of an upper layer of the two consecutive layers. For example, an x-axis position offset 1418 from the x-axis position $x_1$ of the first side-proximal edge 1414 of the first layer of transistor channels 1408a to the x-axis position $x_2$ of the first side-proximal edge 1410 of the second layer of transistor channels 1408b is configured such that there is space for a via, such as a via 1602 shown in FIG. 16B, to extend to and/or contact the transistor channel 702 without contacting the transistor channel 1102. In some embodiments, the x-axis position offset 1418 is larger than a width 1606 (shown in FIG. 16B) of a via 1602.

In some embodiments, x-axis positional values of second side-proximal edges of transistor channels decrease across the multiple layers of transistor channels 1408 along the direction 1426 (shown in FIG. 14B), such as to form a staircase-like arrangement from the second side 1424 of the memory structure 100. For example, the x-axis position $x_3$ of the second side-proximal edge 1412 of the transistor channel 1102 in the second layer of transistor channels 1408b is smaller than the x-axis position $x_4$ of the second side-proximal edge 1416 of the transistor channel 702 of the first layer of transistor channels 1408a. In some embodiments in which a third layer of transistor channels (not shown) is formed over the second layer of transistor channels 1408b, an x-axis position of one or more second side-proximal edges of the third layer of transistor channels is smaller than the x-axis position $x_3$ of the second side-proximal edge 1412 of the transistor channel 1102. In some embodiments, an x-axis position offset of second side-proximal edges of two consecutive layers 1408 is configured such that there is space for a via to extend to and/or contact a transistor channel of a lower layer of the two consecutive layers without contacting a transistor channel of an upper layer of the two consecutive layers. For example, an x-axis position offset 1420 from the x-axis position $x_4$ of the second side-proximal edge 1416 of the first layer of transistor channels 1408a to the x-axis position $x_3$ of the second side-proximal edge 1412 of the second layer of transistor channels 1408b is configured such that there is space for a via, such as a via 1602 shown in FIG. 16B, to extend to and/or contact the transistor channel 702 without contacting the transistor channel 1102. In some embodiments, the x-axis position offset 1420 is larger than the width 1606 (shown in FIG. 16B) of a via 1602.

Other structures and/or configurations of the multiple layers of transistor channels 1408 are within the scope of the present disclosure.

In some embodiments, the memory structure 100 comprises multiple layers of gate structures 1428 stacked over each other. The multiple layers of gate structures 1428 (shown in FIG. 14B) comprise at least one of a first layer of gate structures 1428a comprising the first set of gate structures 302, a second layer of gate structures 1428b, over the first layer of gate structures 1428a, comprising the second set of gate structures 902, a third layer of gate structures 1428c, over the second layer of gate structures 1428b, comprising the third set of gate structures 1302, or one or more other layers of gate structures over the third layer of gate structures 1428c. Although FIG. 14B shows three layers of gate structures stacked over each other, any number of layers of gate structures of the multiple layers of gate structures 1428 is contemplated. In some embodiments, each layer of gate structures of one, some and/or all of the multiple layers of gate structures 1428 comprises one or more gate structures that are in direct contact or indirect contact with at least one of one or more transistor channels underlying the layer of transistor channels or one or more transistor channels overlying the layer of gate structures.

In some embodiments, gate structures of different layers of the multiple layers of gate structures 1428 have different sizes and/or configurations. In some embodiments, each gate structure of one, some and/or all gate structures of the memory structure 100 comprises a gate 308 and a charge storing component 306 that separates the gate 308 from a transistor channel in contact with the gate structure. In some embodiments, each gate structure of one, some and/or all gate structures, of the memory structure 100, that are in contact with a transistor channel underlying the gate structures comprises a gate 308 and a charge storing component 306 underlying the gate 308, such as a charge storing component 306 that separates the gate 308 from the transistor channel underlying the gate structure. In some embodiments, each gate structure of one, some and/or all gate structures, of the memory structure 100, that are in contact with a transistor channel overlying the gate structures comprises a gate 308 and a charge storing component 306 overlying the gate 308, such as a charge storing component 306 that separates the gate 308 from the transistor channel overlying the gate structure. In some embodiments, a gate structure, of the memory structure 100, that is in contact with a first transistor channel overlying the gate structure and a second transistor channel underlying the gate structure comprises a gate 308 and multiple charge storing components, wherein a first charge storing component 306 of the multiple charge storing components 306 overlies the gate 308 and separates the gate 308 from the first transistor channel, and wherein a second charge storing component 306 of the multiple charge storing components 306 underlies the gate 308 and separates the gate 308 from the second transistor channel.

In some embodiments, each gate structure of one, some and/or all gate structures of a topmost layer (such as the third layer 1428c in FIG. 14B) of the multiple layers of gate structures 1428 overlies a transistor channel (such as the transistor channel 1102 in FIG. 14B) and comprises a gate 308 and a charge storing component 306 underlying the gate 308, such as a charge storing component 306 in contact with the transistor channel underlying the gate structure. In some embodiments, each gate structure of one, some and/or all gate structures of a lowermost layer (such as the first layer 1428a in FIG. 14B) of the multiple layers of gate structures 1428 underlies a transistor channel (such as the transistor channel 702 in FIG. 14B) and comprises a gate 308 and a charge storing component 306 overlying the gate 308, such as a charge storing component 306 in contact with the transistor channel overlying the gate structure. In some embodiments, each gate structure of one, some and/or all gate structures of an intermediate layer (such as the second layer 1428b in FIG. 14B) of the multiple layers of gate structures 1428, such as a layer that is over the lowermost layer and under the topmost layer, comprises a gate 308 and multiple charge storing components 306, wherein a first charge storing component 306 of the multiple charge storing components 306 at least one of overlies the gate 308 or is in contact with a transistor channel overlying the gate structure and wherein a second charge storing component 306 of the multiple charge storing components 306 at least one of underlies the gate 308 or is in contact with a transistor channel underlying the gate structure.

FIG. 14E illustrates an enlarged and/or detailed cross-sectional view of a section 1430 of the memory structure 100 comprising a gate structure 902 of the second set of gate structures 902, according to some embodiments in which the gate structure 902 is at least one of in contact with two transistor channels or is between the two transistor channels. The two transistor channels comprise a transistor channel 1102 and a transistor channel 702. An outline of the section 1430 is shown in FIG. 14B with a dashed line box. The section 1430 comprises a portion of a transistor channel 1102, a portion of a transistor channel 1104, a portion of the fourth dielectric layer 1002 and the gate structure 902. The gate structure 902 (shown in FIG. 14E) comprises a first charge storing component 306a, a second charge storing component 306b and a gate 308, such as a control gate. The first charge storing component 306a at least one of overlies the gate 308, is in direct contact with a top surface of the gate 308, or is in indirect contact with the top surface of the gate 308. The first charge storing component 306a at least one of underlies the transistor channel 1102, is in direct contact with a bottom surface of the transistor channel 1102, or is in indirect contact with the bottom surface of the transistor channel 1102. The second charge storing component 306b at least one of underlies the gate 308, is in direct contact with a bottom surface of the gate 308, or is in indirect contact with the bottom surface of the gate 308. The second charge storing component 306b at least one of overlies the transistor channel 702, is in direct contact with a top surface of the transistor channel 702, or is in indirect contact with the top surface of the transistor channel 702.

In some embodiments, the gate 308 is configured to control the transistor channel 1102 and the transistor channel 702. In some embodiments, a first portion of the gate structure 902 and at least a portion of the transistor channel 1102 form a first memory cell 1432. The first portion of the gate structure 902 comprises the first charge storing component 306a and the gate 308. In some embodiments, a second portion of the gate structure 902 and at least a portion of the transistor channel 702 form a second memory cell 1434. The second portion of the gate structure 902 comprises the second charge storing component 306b and the gate 308.

In some embodiments, the first memory cell 1432 comprises a first transistor, such as a thin film transistor or other suitable transistor, wherein the first transistor comprises at least one of the gate 308, a first portion 1436 of the transistor channel 1102, a second portion 1438 of the transistor channel 1102, or the first charge storing component 306a, wherein a threshold voltage of the first transistor is based upon a charge stored in the first charge storing component 306a. In some embodiments, the first charge storing component 306a separates the gate 308 from the transistor channel 1102. In some embodiments, the first portion 1436 is a first doped portion, of the transistor channel 1102, corresponding to a source or drain of the first transistor. In some embodiments, the second portion 1438 is a second doped portion, of the transistor channel 1102, corresponding to a source or drain of the first transistor. In some embodiments in which the first charge storing component 306a comprises a dielectric charge trapping element for storing charge, the charge is trapped in the dielectric charge trapping element of the first charge storing component 306a, such as a nitride layer of an ONO tri-layer of the first charge storing component 306a. In some embodiments in which the first charge storing component 306a comprises a floating gate 320 for storing charge, the charge is trapped in the floating gate 320 of the first charge storing component 306a. In some embodiments, electrons are attracted to the first charge storing component 306a when a positive voltage is applied to the gate 308. In some embodiments, electrons are repelled by the first charge storing component 306a when a negative voltage is applied to the gate 308. In some embodiments, the first transistor switches between a plurality of transistor states, such as two transistor states, associated with a plurality of threshold voltage levels of the first transistor. In some embodiments, the first transistor is in a first transistor state when a first amount of charge is stored in the first charge storing component 306a, wherein the first amount of charge is positive, negative, or zero, wherein the first transistor state is associated with the threshold voltage of the first transistor being equal to about a first threshold level of the plurality of threshold voltage levels. In some embodiments, the first transistor is in a second transistor state when a second amount of charge is stored in the first charge storing component 306a, wherein the second amount of charge differs from the first amount of charge, and wherein the second transistor state is associated with the threshold voltage of the first transistor being equal to about a second threshold level of the plurality of threshold voltage levels.

Other structures and/or configurations of the first memory cell 1432 are within the scope of the present disclosure.

In some embodiments, the second memory cell 1434 comprises a second transistor, such as a thin film transistor or other suitable transistor, wherein the second transistor comprises at least one of the gate 308, a first portion 1440 of the transistor channel 702, a second portion 1442 of the transistor channel 702, or the second charge storing component 306b, wherein a threshold voltage of the second transistor is based upon a charge stored in the second charge storing component 306b. In some embodiments, the second charge storing component 306b separates the gate 308 from the transistor channel 702. In some embodiments, the first portion 1440 is a first doped portion, of the transistor channel 702, corresponding to a source or drain of the second transistor. In some embodiments, the second portion 1442 is a second doped portion, of the transistor channel 702, corresponding to a source or drain of the second transistor. In some embodiments in which the second charge storing component 306b comprises a dielectric charge trapping element for storing charge, the charge is trapped in the dielectric charge trapping element of the second charge storing component 306b, such as a nitride layer of an ONO tri-layer of the second charge storing component 306b. In some embodiments in which the second charge storing component 306b comprises a floating gate 320 for storing charge, the charge is trapped in the floating gate 320 of the second charge storing component 306b. Other structures and/or configurations of the second memory cell 1434 are within the scope of the present disclosure.

In some embodiments, gate structures of different layers of the multiple layers of gate structures 1428 have different positions. In some embodiments, the multiple layers of gate structures 1428 are formed such that z-axis positions (on a z-axis shown in FIG. 14C) of gate structures of one or more odd layers of the multiple layers of gate structures 1428 are about the same as each other. In some embodiments, the one or more odd layers of the multiple layers of gate structures 1428 comprise one, some and/or all odd layers of the multiple layers of gate structures 1428, such as at least one of the first layer of gate structures 1428a, the third layer of gate structures 1428c, or one or more other layer of gate structures. In some embodiments, the multiple layers of gate structures 1428 are formed such that z-axis positions of gate structures of one or more even layers of the multiple layers of gate structures 1428 are about the same as each other. In some embodiments, the one or more even layers of the multiple layers of gate structures 1428 comprise at least one of one, some and/or all even layers of the multiple layers of gate structures 1428, such as at least one of the second layer of gate structures 1428b or one or more other layer of gate structures.

Figure 14C:
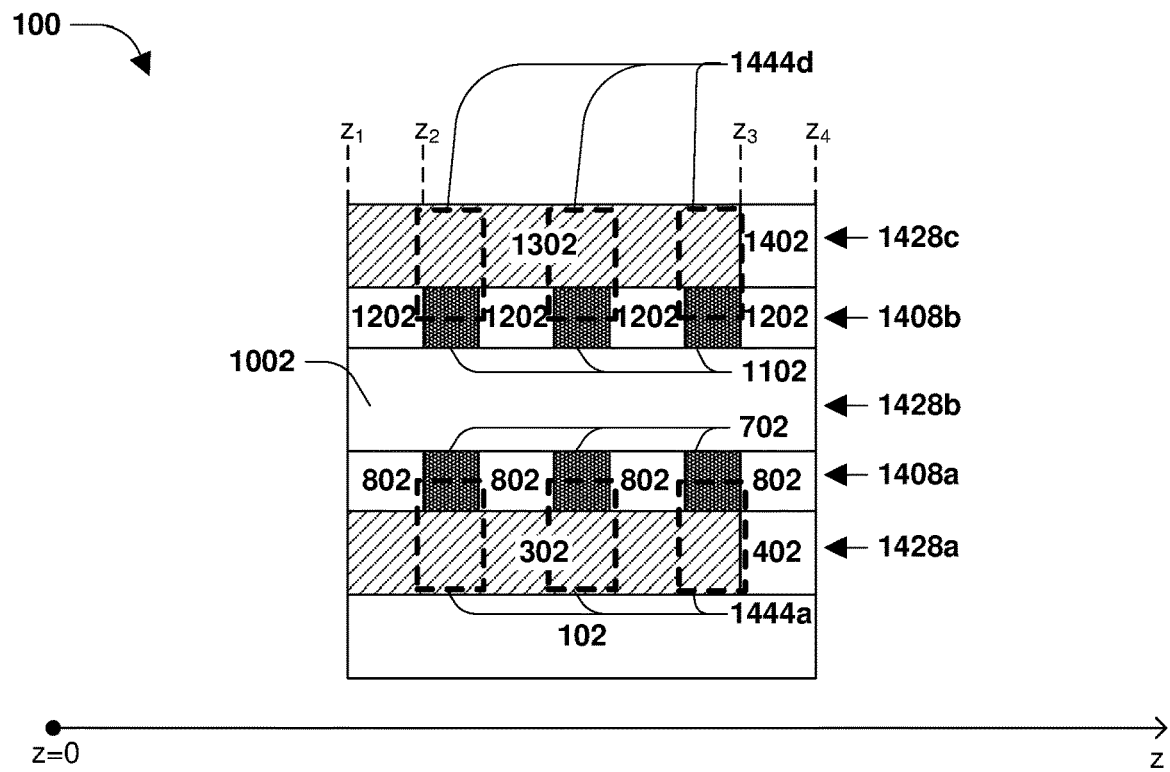
Figure 14D:
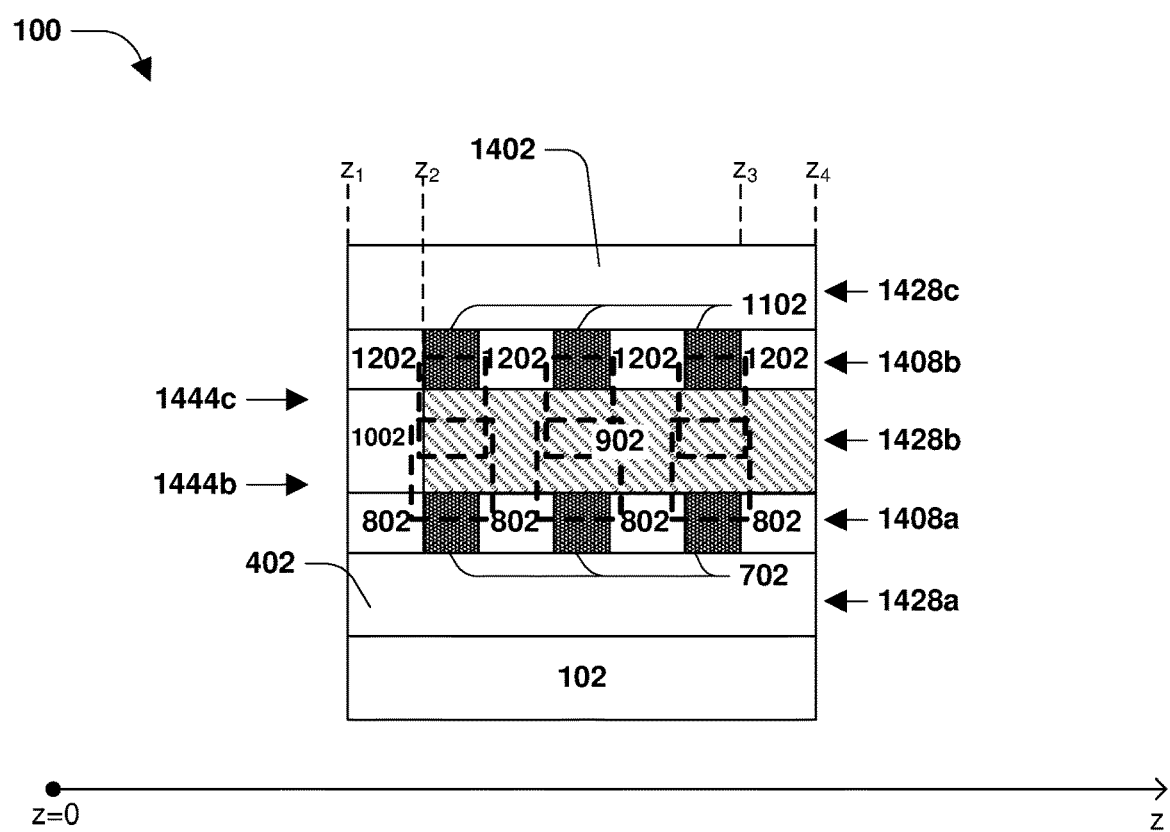
Figure 14E:
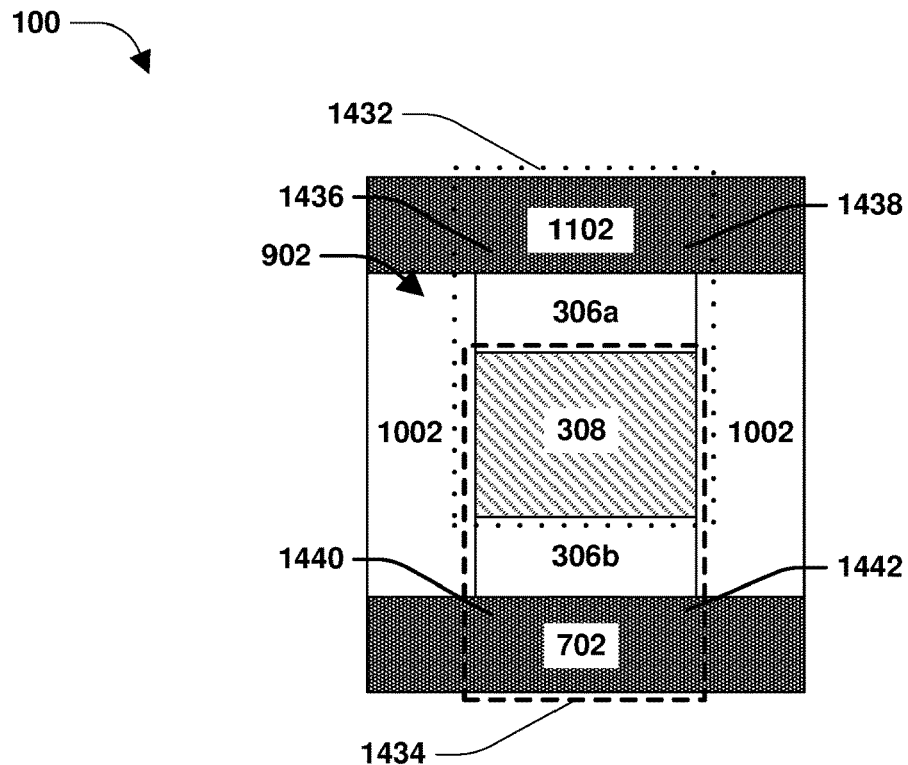
Figure 14F:
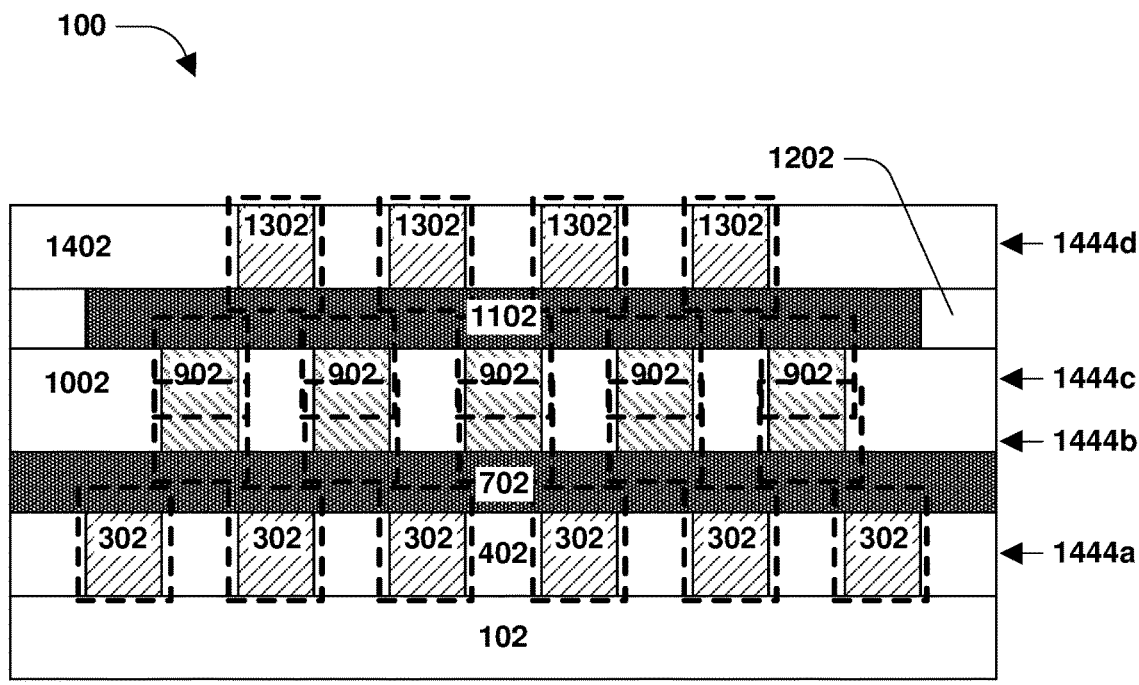

In some embodiments, as shown in FIG. 14C, one, some and/or all gate structures of the one or more odd layers of the multiple layers of gate structures 1428, such as one, some and/or all of the first set of gate structures 302 and/or one, some and/or all of the third set of gate structures 1302, extend from a z-axis position $z_1$ on the z-axis to a z-axis position $z_3$ on the z-axis. In some embodiments, one, some and/or all gate structures of the one or more odd layers of the multiple layers of gate structures 1428 do not occupy a region, of the memory structure 100, between the z-axis position $z_3$ and a z-axis position $z_4$. In some embodiments, one or more vias (such as vias 1804 shown in FIG. 18A and FIG. 18C), in contact with one or more gate structures of one or more even layers of the multiple layers of gate structures 1428, are within the region between the z-axis position $z_3$ and the z-axis position $z_4$. In some embodiments, a distance along the z-axis between the z-axis position $z_3$ and the z-axis position $z_4$ is larger than a width 1808 of a via 1804 (shown in FIG. 18C).

In some embodiments, as shown in FIG. 14D, one, some and/or all gate structures of the one or more even layers of the multiple layers of gate structures 1428, such as one, some and/or all of the second set of gate structures 1302, extend from a z-axis position $z_2$ on the z-axis to the z-axis position $z_4$ on the z-axis. In some embodiments, one, some and/or all gate structures of the one or more even layers of the multiple layers of gate structures 1428 do not occupy a region, of the memory structure 100, between the z-axis position $z_1$ and the z-axis position $z_2$. In some embodiments, one or more vias (such as vias 1802 shown in FIG. 18A and FIG. 18B), in contact with one or more gate structures of the one or more odd layers of the multiple layers of gate structures 1428, are within the region between the z-axis position $z_1$ and the z-axis position $z_2$. In some embodiments, a distance along the z-axis between the z-axis position $z_1$ and the z-axis position $z_2$ is larger than a width 1806 of a via 1802 (shown in FIG. 18B).

In some embodiments, as shown in FIG. 14F, the memory structure 100 comprises multiple layers of memory cells 1444 stacked over each other. The multiple layers of memory cells 1444 comprise at least one of a first layer of memory cells 1444a, a second layer of memory cells 1444b over the first layer of memory cells 1444a, a third layer of memory cells 1444c over the second layer of memory cells 1444b, a fourth layer of memory cells 1444d over the third layer of memory cells 1444c, or one or more other layers of transistor channels over the fourth layer of memory cells 1444d. Outlines of memory cells of the memory structure 100 are shown with dashed line boxes in FIG. 14F, according to some embodiments. Although FIG. 14F shows four layers of memory cells stacked over each other, any number of layers of memory cells of the multiple layers of memory cells 1444 is contemplated. In some embodiments, memory cells of the first layer of memory cells 1444a comprise gate structures of the first set of gate structures 302 and portions of a transistor channel 702 of the first set of transistor channels 702. In some embodiments, memory cells of the second layer of memory cells 1444b comprise portions of gate structures of the second set of gate structures 902 and/or portions of a transistor channel 702 of the first set of transistor channels 702. In some embodiments, the second layer of memory cells 1444b comprises the second memory cell 1434 (shown in FIG. 14E). In some embodiments, memory cells of the third layer of memory cells 1444c comprise portions of gate structures of the second set of gate structures 902 and/or portions of a transistor channel 1102 of the second set of transistor channels 1102. In some embodiments, the third layer of memory cells 1444c comprises the first memory cell 1432 (shown in FIG. 14E). In some embodiments, memory cells of the fourth layer of memory cells 1444d comprise gate structures of the third set of gate structures 1302 and portions of a transistor channel 1102 of the second set of transistor channels 1102. In FIG. 14F, memory cells of the multiple layers of memory cells 1444 are shown to be distributed across the x-axis. In some embodiments, memory cells of the multiple layers of memory cells 1444 are distributed across the z-axis, such as in addition to the x-axis, as shown in FIGS. 14C-14D. FIG. 14C shows dashed line boxes representative of outlines of memory cells of the first layer 1444a distributed across the z-axis and memory cells of the fourth layer 1444d distributed across the z-axis, according to some embodiments.

FIG. 14D shows dashed line boxes representative of outlines of memory cells of the second layer 1444b distributed across the z-axis and memory cells of the third layer 1444c distributed across the z-axis, according to some embodiments. In some embodiments, a memory cell of the second layer 1444b shares a gate 308, such as a control gate, with a memory cell of the third layer 1444c.

Figure 15A:
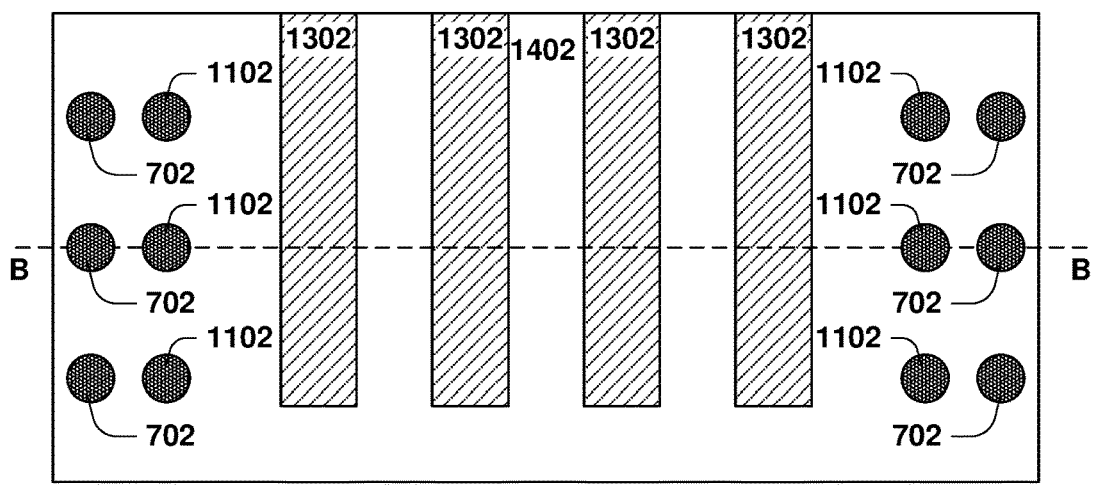
FIGS. 15A-15B illustrate a memory structure at a stage of fabrication, in accordance with some embodiments.
Figure 15B:
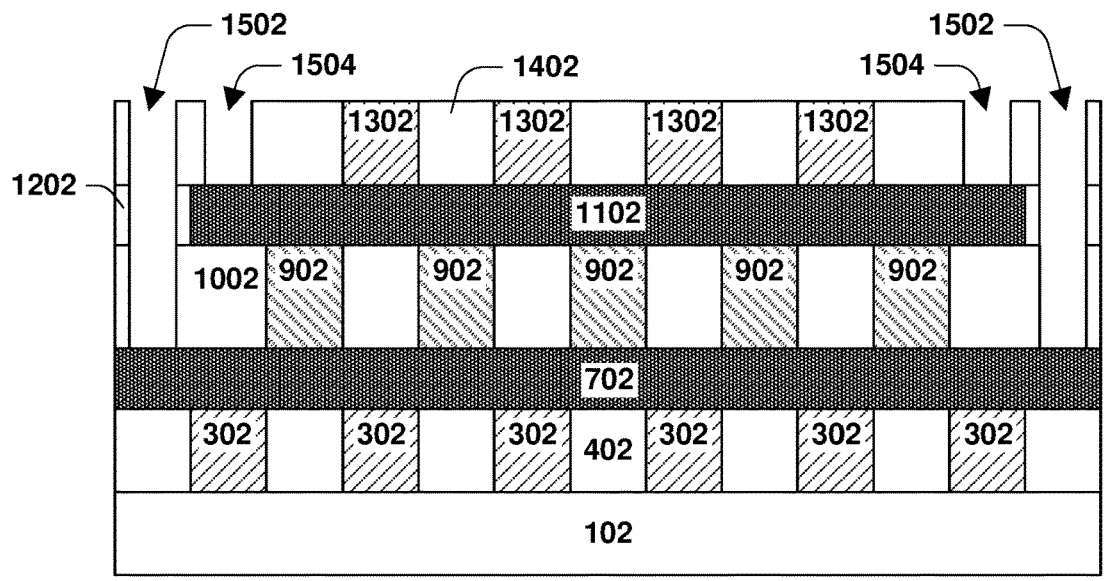

FIGS. 15A and 15B illustrate a first plurality of openings formed in the memory structure 100, according to some embodiments. In some embodiments, for each transistor channel of one, some and/or all transistor channels of the multiple layers of transistor channels 1408, the first plurality of openings comprises one or more openings, such as two openings or other number of openings, that expose a top surface of the transistor channel. In some embodiments, the first plurality of openings comprises openings 1502 overlying one or more transistor channels of the first set of transistor channels 702. In some embodiments, each opening of the openings 1502 exposes a top surface of a transistor channel 702 of the first set of transistor channels 702. In some embodiments, each opening of one, some and/or all of the openings 1502 extends, through at least one of the sixth dielectric layer 1402, the fifth dielectric layer 1202, or the fourth dielectric layer 1002, to a transistor channel 702. In some embodiments, the first plurality of openings comprises openings 1504 overlying one or more transistor channels of the second set of transistor channels 1102. In some embodiments, each opening of the openings 1504 exposes a top surface of a transistor channel 1102 of the second set of transistor channels 1102. In some embodiments, each opening of one, some and/or all of the openings 1504 extends, through the sixth dielectric layer 1402, to a transistor channel 1102. In some embodiments, portions of at least one of the sixth dielectric layer 1402, the fifth dielectric layer 1202, or the fourth dielectric layer 1002 are removed to form the first plurality of openings. According to some embodiments, the first plurality of openings is formed using a photoresist (not shown). The photoresist is formed over the sixth dielectric layer 1402 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to form the first plurality of openings, where openings in the photoresist allow one or more etchants applied during the etching process to remove portions of at least one of the sixth dielectric layer 1402, the fifth dielectric layer 1202, or the fourth dielectric layer 1002 while the photoresist protects or shields portions of at least one of the sixth dielectric layer 1402, the fifth dielectric layer 1202, or the fourth dielectric layer 1002 that are covered by the photoresist. The etching process is at least one of a dry etching process, a wet etching process, an anisotropic etching process, an isotropic etching process, or other suitable etching process. The etching process uses at least one of fluorine, HF, diluted HF, SF6, a chlorine compound such as HCl2, H2S, CF4, or other suitable material. The photoresist is stripped or washed away after the first plurality of openings is formed. Other processes and/or techniques for forming the first plurality of openings are within the scope of the present disclosure.

Figure 16A:
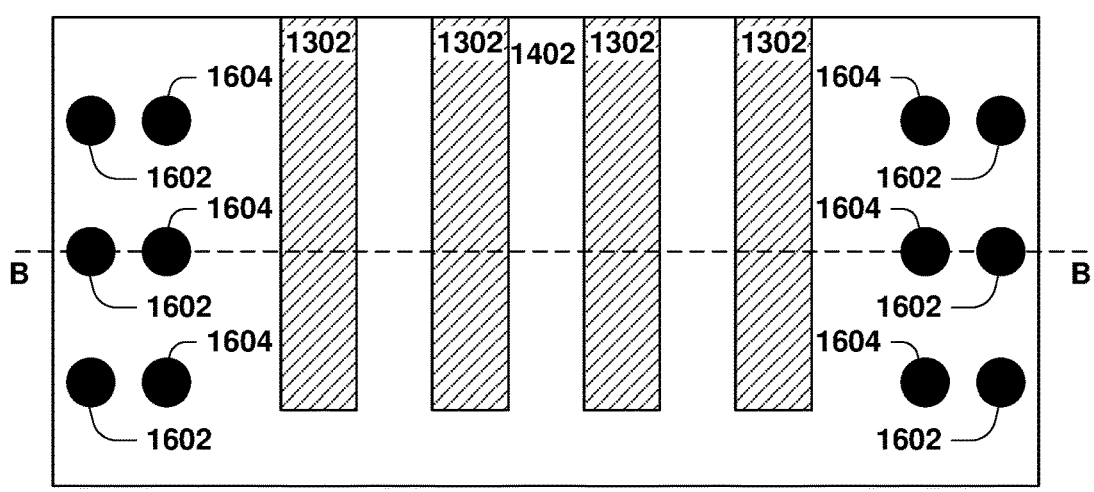
FIGS. 16A-16B illustrate a memory structure at a stage of fabrication, in accordance with some embodiments.
Figure 16B:
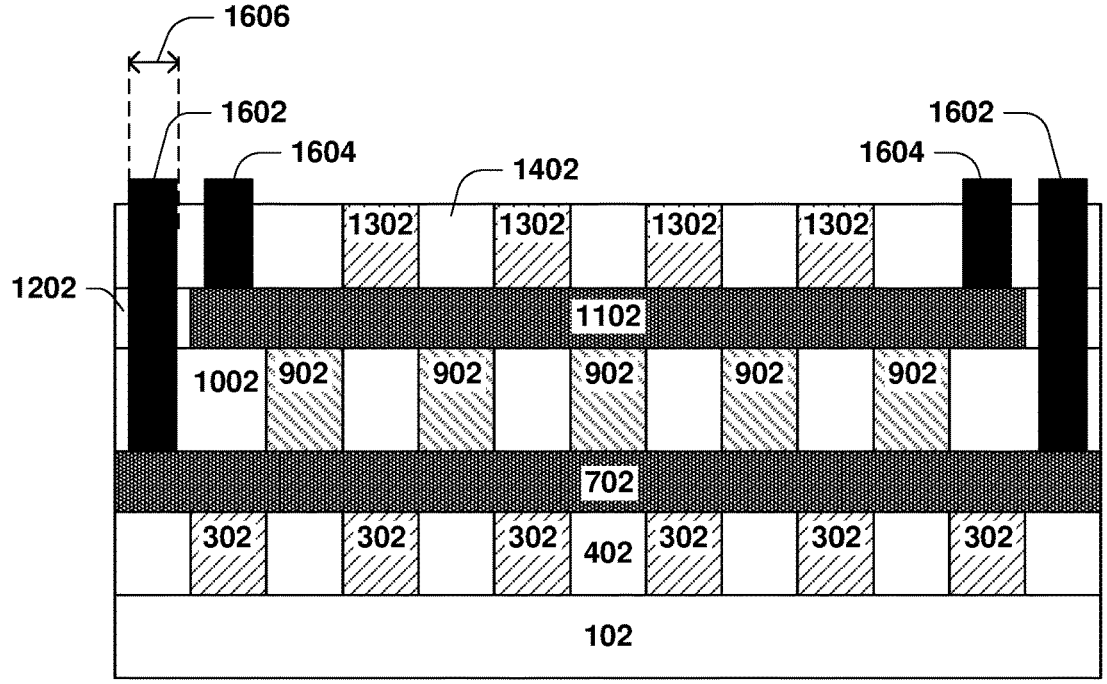

FIGS. 16A and 16B illustrate a first plurality of vias formed in the memory structure 100, according to some embodiments. In some embodiments, each via of one, some and/or all of the first plurality of vias is formed at least one of over the sixth dielectric layer 1402 or within an opening of the first plurality of openings. In some embodiments, the first plurality of vias is formed by depositing via material, such as metal or other suitable material, at least one of over the sixth dielectric layer 1402 or within openings of the first plurality of openings, such as by depositing the via material by at least one of PVD, sputtering, CVD, PECVD, LPCVD, ALCVD, UHVCVD, RPCVD, ALD, MBE, LPE, spin on, growth, or other suitable techniques. Other processes and/or techniques for forming the first plurality of vias are within the scope of the present disclosure. In some embodiments, one, some and/or all of the first plurality of vias are metal contacts. A via of the first plurality of vias comprises at least one of titanium, tungsten, nitride, or other suitable material. In some embodiments, a material of a first portion of a via of the first plurality of vias is different than a material of a second portion of the via. Other structures and/or configurations of the first plurality of vias are within the scope of the present disclosure.

In some embodiments, each via of one, some and/or all of the first plurality of vias is in contact with a transistor channel, such as in contact with a single transistor channel of the memory structure 100 while at least one of being isolated from or not being in contact with other transistor channels of the memory structure 100. In some embodiments, for each transistor channel of one, some and/or all transistor channels of the multiple layers of transistor channels 1408, the first plurality of vias comprises one or more vias, such as two vias or other number of vias, that are in contact with, such as in direct contact with, the transistor channel. In some embodiments, at least one of a first via of the one or more vias corresponds to a source of the transistor channel or a second via of the one or more vias corresponds to a drain of the transistor channel.

In some embodiments, the first plurality of vias comprises vias 1602 overlying one or more transistor channels of the first set of transistor channels 702. In some embodiments, each via of the vias 1602 is in contact with, such as in direct contact with, a top surface of a transistor channel 702 of the first set of transistor channels 702. In some embodiments, each via of one, some and/or all of the vias 1602 extends, through at least one of the sixth dielectric layer 1402, the fifth dielectric layer 1202, or the fourth dielectric layer 1002, to a transistor channel 702. In some embodiments, the first plurality of vias comprises vias 1604 overlying one or more transistor channels of the second set of transistor channels 1102. In some embodiments, each via of the vias 1604 is in contact with, such as in direct contact with, a top surface of a transistor channel 1102 of the second set of transistor channels 1102. In some embodiments, each via of one, some and/or all of the vias 1604 extends, through the sixth dielectric layer 1402, to a transistor channel 1102.

Figure 17A:
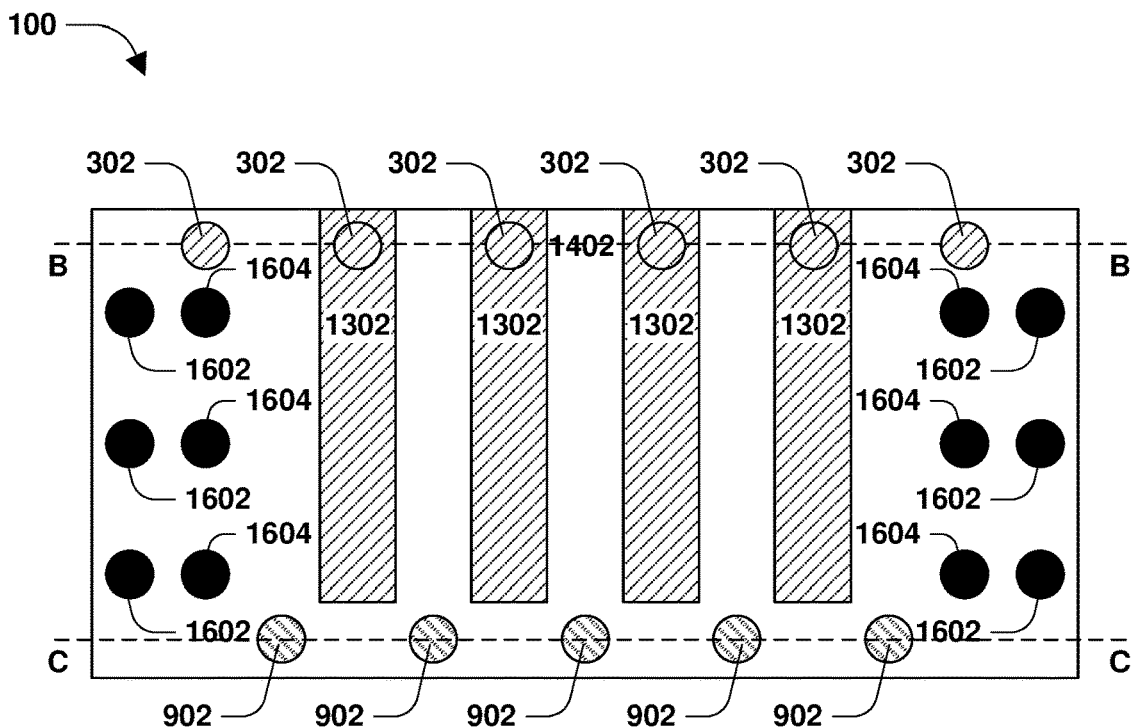
FIGS. 17A-17C illustrate a memory structure at a stage of fabrication, in accordance with some embodiments.
Figure 17B:
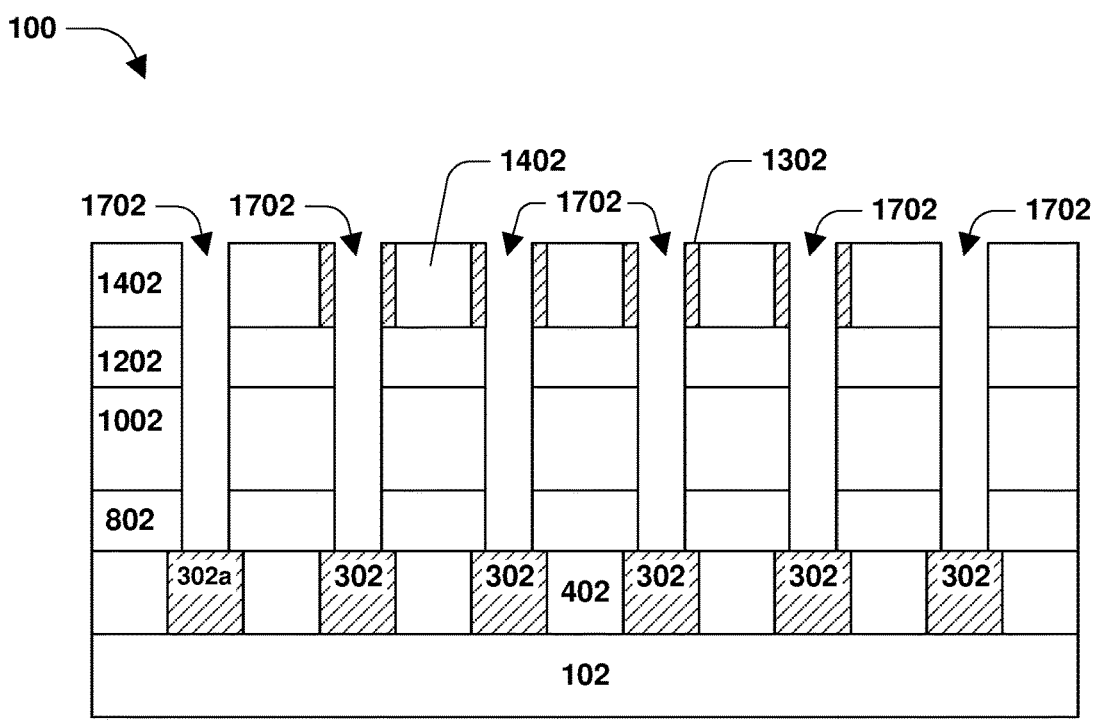
Figure 17C:
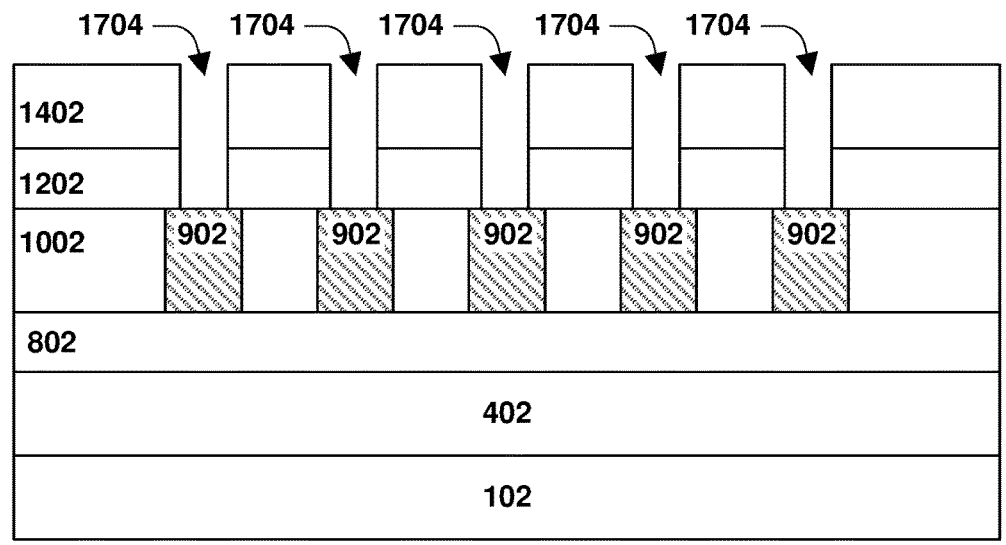

FIGS. 17A and 17B illustrate a second plurality of openings formed in the memory structure 100, according to some embodiments. In some embodiments, for each gate structure of one, some and/or all gate structures of the multiple layers of gate structures 1428, the second plurality of openings comprises an opening that at least one of extends through the gate structure or exposes a top surface of the gate structure.

In some embodiments, the second plurality of openings comprises openings 1702 (shown in FIG. 17B) that at least one of extend through one or more gate structures of one or more odd layers of the multiple layers of gate structures 1428 or expose top surfaces of one or more gate structures of an odd layer, such as a lowermost odd layer, of the multiple layers of gate structures 1428. In some embodiments, each opening of one, some and/or all of the openings

1702 exposes a top surface of a gate structure 302 of the first set of gate structures 302. In some embodiments, each opening of one, some and/or all of the openings 1702 extends through a gate structure 1302 of the third set of gate structures 1302. In some embodiments, a gate structure 302a (shown in FIG. 17B) is not vertically coincident with a gate structure 1302 over the gate structure 302, and an opening 1702 extends through at least one of the sixth dielectric layer 1402, the fifth dielectric layer 1202, the fourth dielectric layer 1002, or the third dielectric layer 802, to the gate structure 302a. In some embodiments, each opening of one, some and/or all of the openings 1702 extends, through at least one of a gate structure 1302, the sixth dielectric layer 1402, the fifth dielectric layer 1202, the fourth dielectric layer 1002, or the third dielectric layer 802, to a gate structure 302.

In some embodiments, the second plurality of openings comprises openings 1704 (shown in FIG. 17C) that at least one of extend through one or more gate structures of one or more even layers of the multiple layers of gate structures 1428 or expose top surfaces of one or more gate structures of an even layer, such as a lowermost even layer, of the multiple layers of gate structures 1428. In some embodiments, each opening of one, some and/or all of the openings 1704 exposes a top surface of a gate structure 902 of the second set of gate structures 902. In some embodiments, each opening of one, some and/or all of the openings 1704 extends, through at least one of the sixth dielectric layer 1402 or the fifth dielectric layer 1202, to a gate structure 902.

In some embodiments, portions of at least one of the third set of gate structures 1302, the sixth dielectric layer 1402, the fifth dielectric layer 1202, the fourth dielectric layer 1002, or the third dielectric layer 802, are removed to form the second plurality of openings. According to some embodiments, the second plurality of openings is formed using a photoresist (not shown). The photoresist is formed over the sixth dielectric layer 1402 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to form the second plurality of openings, where openings in the photoresist allow one or more etchants applied during the etching process to remove portions of at least one of the third set of gate structures 1302, the sixth dielectric layer 1402, the fifth dielectric layer 1202, the fourth dielectric layer 1002, or the third dielectric layer 802 while the photoresist protects or shields portions of at least one of the third set of gate structures 1302, the sixth dielectric layer 1402, the fifth dielectric layer 1202, the fourth dielectric layer 1002, or the third dielectric layer 802 that are covered by the photoresist. The etching process is at least one of a dry etching process, a wet etching process, an anisotropic etching process, an isotropic etching process, or other suitable etching process. The etching process uses at least one of fluorine, HF, diluted HF, SF6, a chlorine compound such as HCl2, H2S, CF4, or other suitable material. The photoresist is stripped or washed away after the second plurality of openings is formed. Other processes and/or techniques for forming the second plurality of openings are within the scope of the present disclosure.

Figure 18A:
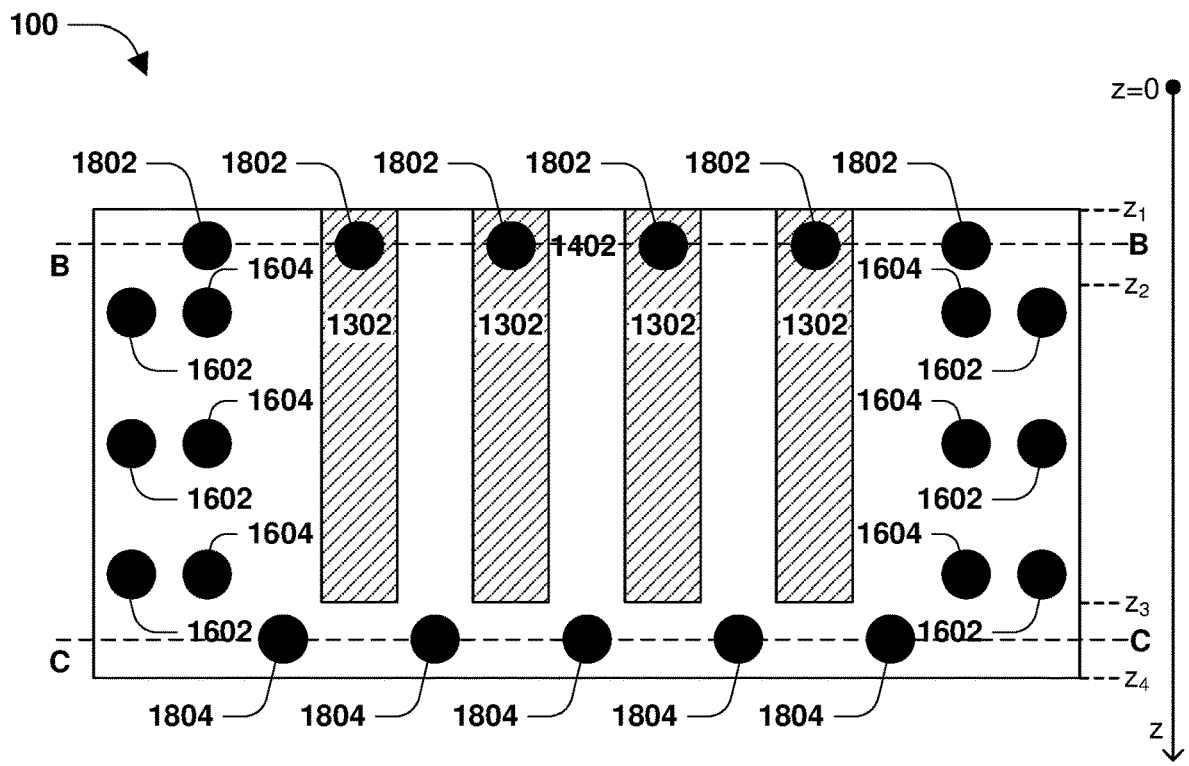
FIGS. 18A-18C illustrate a memory structure at a stage of fabrication, in accordance with some embodiments.
Figure 18B:
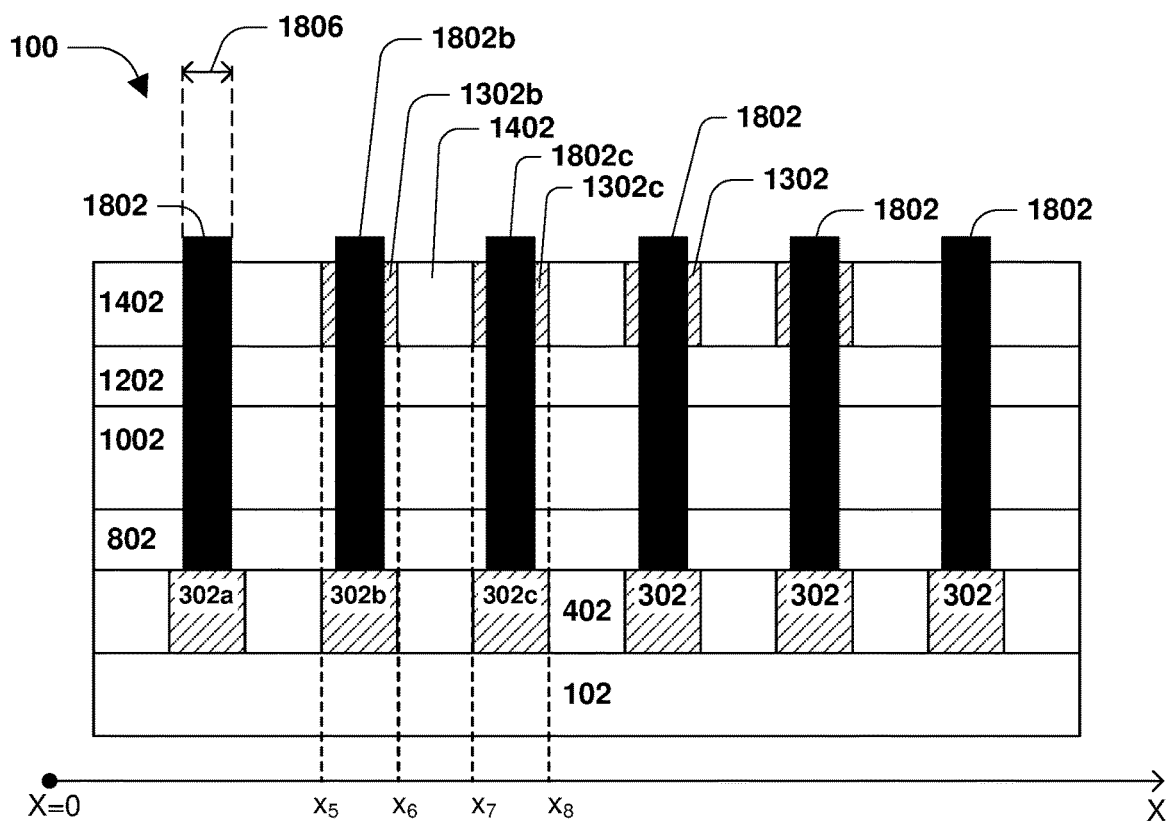
Figure 18C:
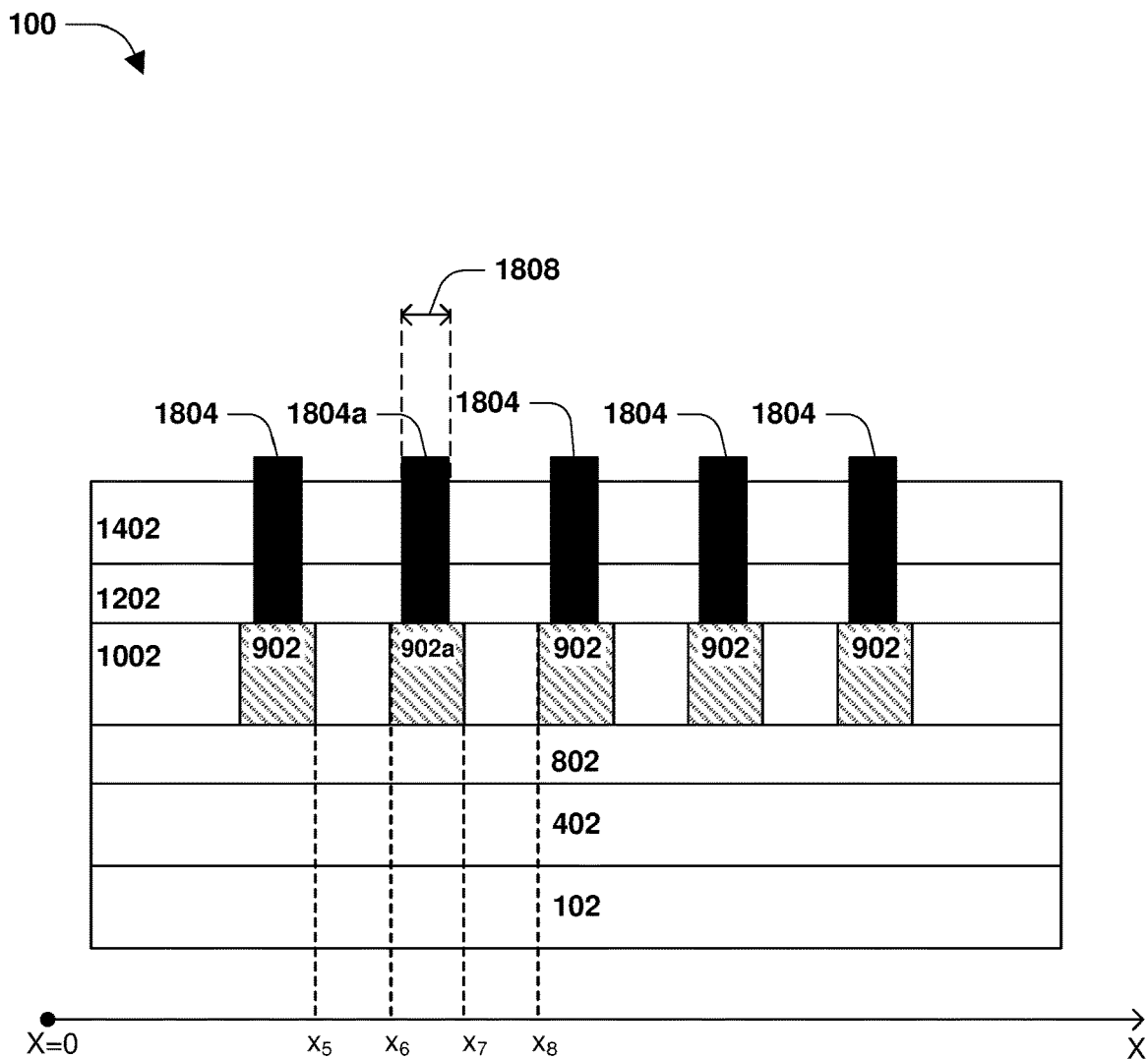

FIGS. 18A-18C illustrate a second plurality of vias formed in the memory structure 100, according to some embodiments. In some embodiments, each via of one, some and/or all of the second plurality of vias is formed at least one of over the sixth dielectric layer 1402 or within an opening of the second plurality of openings. In some embodiments, the second plurality of vias is formed by depositing via material, such as metal or other suitable material, at least one of over the sixth dielectric layer 1402 or within openings of the second plurality of openings, such as by depositing the via material by at least one of PVD, sputtering, CVD, PECVD, LPCVD, ALCVD, UHVCVD, RPCVD, ALD, MBE, LPE, spin on, growth, or other suitable techniques. Other processes and/or techniques for forming the second plurality of vias are within the scope of the present disclosure. In some embodiments, one, some and/or all of the second plurality of vias are metal contacts. A via of the second plurality of vias comprises at least one of titanium, tungsten, nitride, or other suitable material. In some embodiments, a material of a first portion of a via of the second plurality of vias is different than a material of a second portion of the via. Other structures and/or configurations of the second plurality of vias are within the scope of the present disclosure.

In some embodiments, each via of one, some and/or all of the second plurality of vias is in contact with a gate structure, such as in contact with one or more gate structures, of one or more layers of the multiple layers of gate structures 1428, that are vertically coincident with each other.

In some embodiments, the second plurality of vias comprises vias 1802 (shown in FIGS. 18A and 18B) that at least one of extend through and contact one or more gate structures of one or more odd layers of the multiple layers of gate structures 1428 or are in contact with top surfaces of one or more gate structures of an odd layer, such as a lowermost odd layer, of the multiple layers of gate structures 1428. In some embodiments, each via of one, some and/or all of the vias 1802 is in contact with a gate structure 302 of the first set of gate structures 302, such as in contact with a top surface of the gate structure 302. In some embodiments, each via of one, some and/or all of the vias 1802 extends through a gate structure 1302 of the third set of gate structures 1302. In some embodiments, a gate structure 302a (shown in FIG. 18B) is not vertically coincident with a gate structure 1302 over the gate structure 302, and a via 1802 extends through at least one of the sixth dielectric layer 1402, the fifth dielectric layer 1202, the fourth dielectric layer 1002, or the third dielectric layer 802, to contact, such as directly contact, the gate structure 302a. In some embodiments, each via of one, some and/or all of the vias 1802 extends, through at least one of a gate structure 1302, the sixth dielectric layer 1402, the fifth dielectric layer 1202, the fourth dielectric layer 1002, or the third dielectric layer 802, to contact, such as directly contact, a gate structure 302.

In some embodiments, the second plurality of vias comprises vias 1804 (shown in FIGS. 18A and 18C) that at least one of extend through and contact one or more gate structures of one or more even layers of the multiple layers of gate structures 1428 or are in contact with top surfaces of one or more gate structures of an even layer, such as a lowermost even layer, of the multiple layers of gate structures 1428. In some embodiments, each via of one, some and/or all of the vias 1804 is in contact with a gate structure 902 of the second set of gate structures 902, such as in contact with a top surface of the gate structure 902. In some embodiments, each via of one, some and/or all of the vias 1804 extends, through at least one of the sixth dielectric layer 1402 or the fifth dielectric layer 1202, to contact, such as directly contact, a gate structure 902.

In some embodiments, along at least one of the z-axis (shown in FIG. 18A) or the x-axis (shown in FIGS. 18A and 18B), one, some and/or all vias of the vias 1802 are laterally offset from one, some and/or all vias of the vias 1804. In some embodiments, one, some and/or all vias of the vias 1802 are within the region between the z-axis position $z_1$ and the z-axis position $z_2$, and one, some and/or all vias of the vias 1804 are within the region between the z-axis position $z_3$ and the z-axis position $z_4$. In some embodiments, along the x-axis, a via 1804 is laterally offset from vias 1802, such as where an x-axis position of the via 1804 is between x-axis positions of two adjacent vias 1802.

In one embodiment, a via 1802b (shown in FIG. 18B) extends through and is in contact with a gate structure 1302b and is in contact with a gate structure 302b underlying the gate structure 1302b. In some embodiments, at least one of the via 1802b, the gate structure 1302b, or the gate structure 302b are within a region, of the memory structure 100, between an x-axis position $x_5$ and an x-axis position $x_6$. A via 1802c (shown in FIG. 18B) extends through and is in contact, such as direct contact, with a gate structure 1302c and is in contact, such as direct contact, with a gate structure 302c underlying the gate structure 1302c. In some embodiments, at least one of the via 1802c, the gate structure 1302c, or the gate structure 302c are within a region, of the memory structure 100, between an x-axis position $x_7$ and an x-axis position $x_8$. Along the x-axis, a via 1804a (shown in FIG. 18C) is laterally offset from the via 1802b (shown in FIG. 18B) and the via 1802c (shown in FIG. 18B). In some embodiments, the via 1804a is in contact, such as direct contact, with a gate structure 902a. In some embodiments, at least one of the via 1804a or the gate structure 902a (shown in FIG. 18C) are within a region, of the memory structure 100, between the x-axis position $x_6$ and the x-axis position $x_7$. In some embodiments, the gate structure 902a and the via 1804a are isolated from one, some and/or all of the vias 1802, such as at least one of the via 1802b (shown in FIG. 18B), the via 1802c, etc. In some embodiments, the gate structure 902a and the via 1804a (shown in FIG. 18C) are isolated from one, some and/or all gate structures of one or more odd layers of gate structures of the multiple layers of gate structures 1428, such as at least one the gate structure 302b (shown in FIG. 18B), the gate structure 302c, the gate structure 1302b, the gate structure 1302c, etc.

In some embodiments, the memory structure 100 comprises memory cells connected in series, such as where the memory cells of the memory structure 100 have at least one of a NAND memory configuration or other memory configuration. In some embodiments, such as where memory cells of the memory structure 100 have a NAND memory configuration, the memory cells are connected to a bit line in series. In some embodiments, the bit line is connected to one, some and/or all of the first plurality of vias. In some embodiments, a first via, of the first plurality of vias, that is in contact with a transistor channel corresponds to a source contact of memory cells comprising at least a portion of the transistor channel, and a second via, of the first plurality of vias, that is in contact with the transistor channel corresponds to a drain contact of the memory cells. In some embodiments, the bit line is connected to at least one of the first via or the second via. In some embodiments, for each transistor channel of one, some and/or all transistor channels in the memory structure 100, the first plurality of vias comprises two vias in contact with the transistor channel, wherein a first via of the two vias corresponds to a source contact and a second via of the two vias corresponds to a drain contact. In some embodiments, a word line is connected to one, some and/or all of the second plurality of vias. In some embodiments, the bit line and the word line are used to read data from memory cells of the memory structure 100, such as where the bit line is used to carry data, such as one or more bits, and the word line is used to select one or more memory cells from which data, such as the one or more bits, are read from. In some embodiments, the bit line and the word line are used to store data on memory cells of the memory structure 100, such as where the bit line is used to carry data, such as one or more bits, and the word line is used to select one or more memory cells on which data, such as the one or more bits, is stored. Embodiments are contemplated in which memory cells of the memory structure 100 have a memory configuration other than NAND memory configuration, such as at least one of NOR memory configuration or other memory configuration.

Figure 19A:
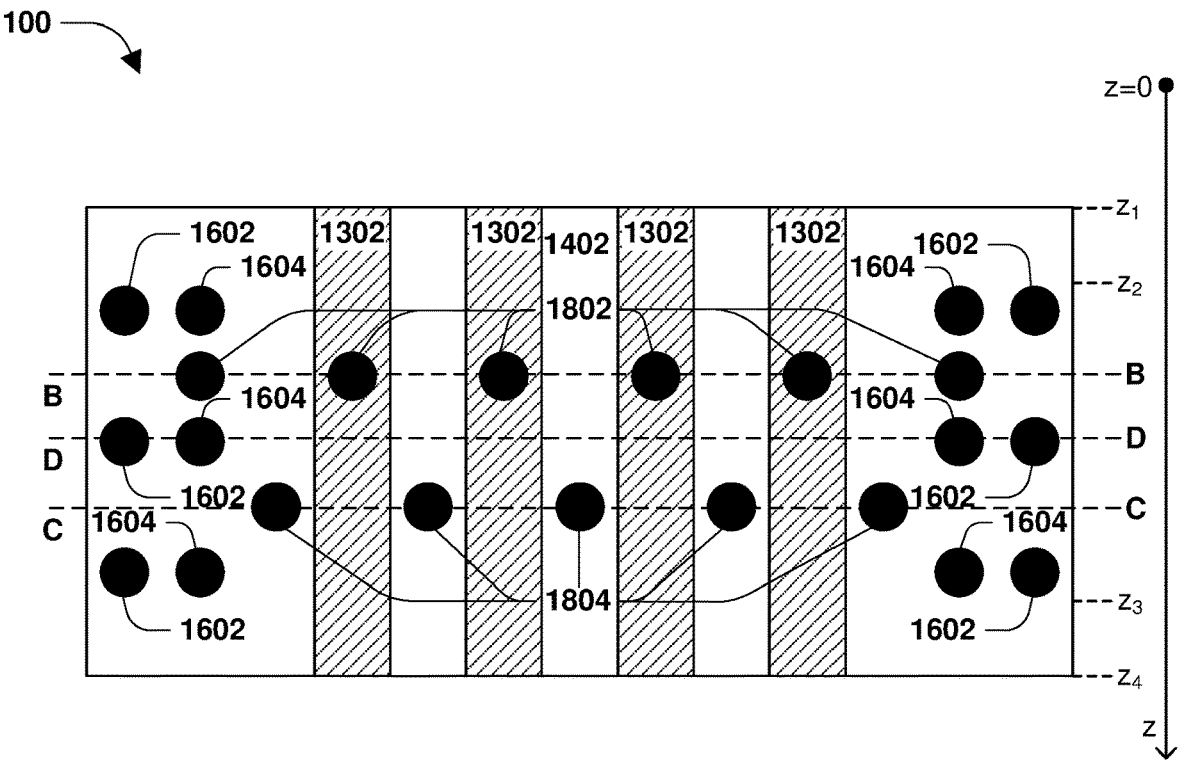
FIGS. 19A-19D illustrate a memory structure, in accordance with some embodiments.
Figure 19B:
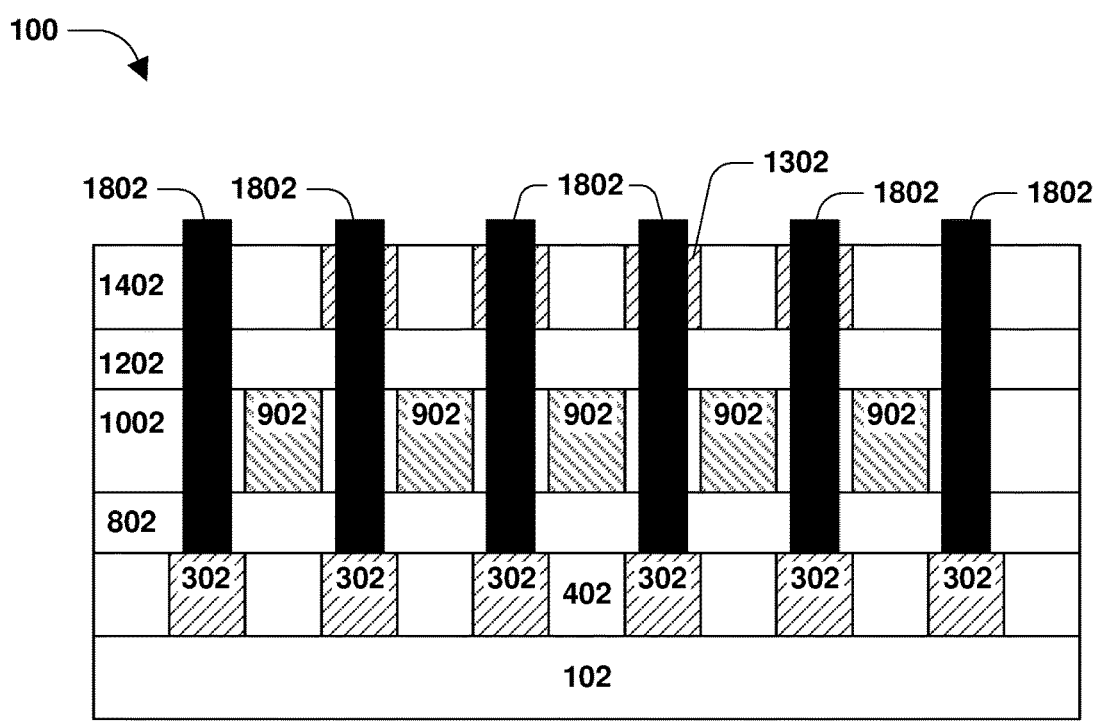
Figure 19C:
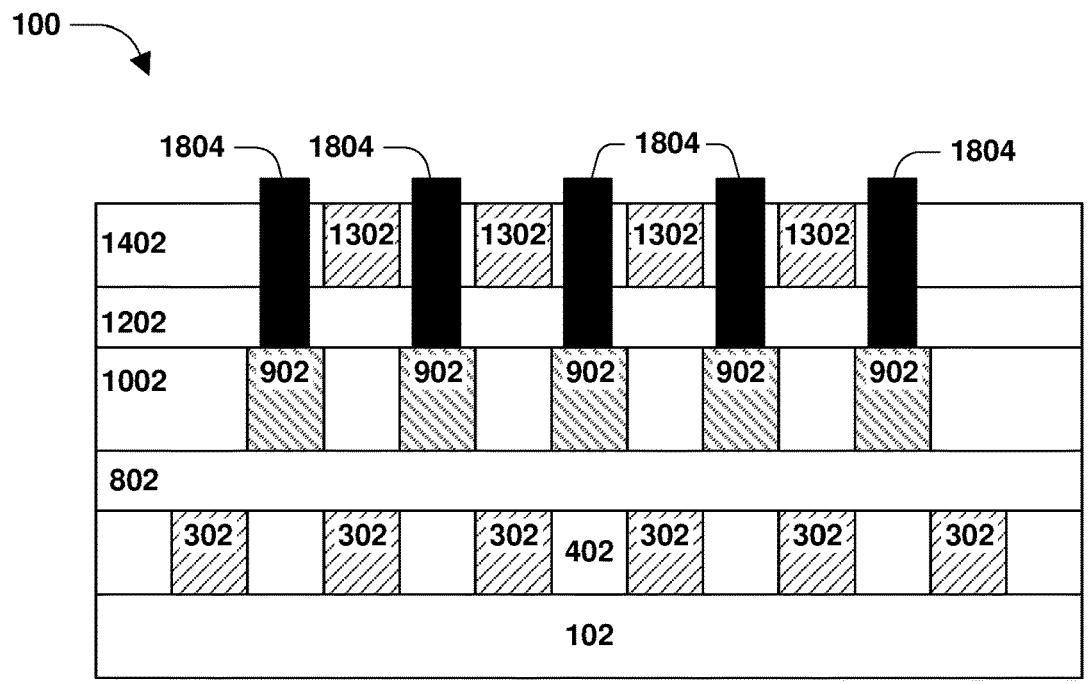
Figure 19D:
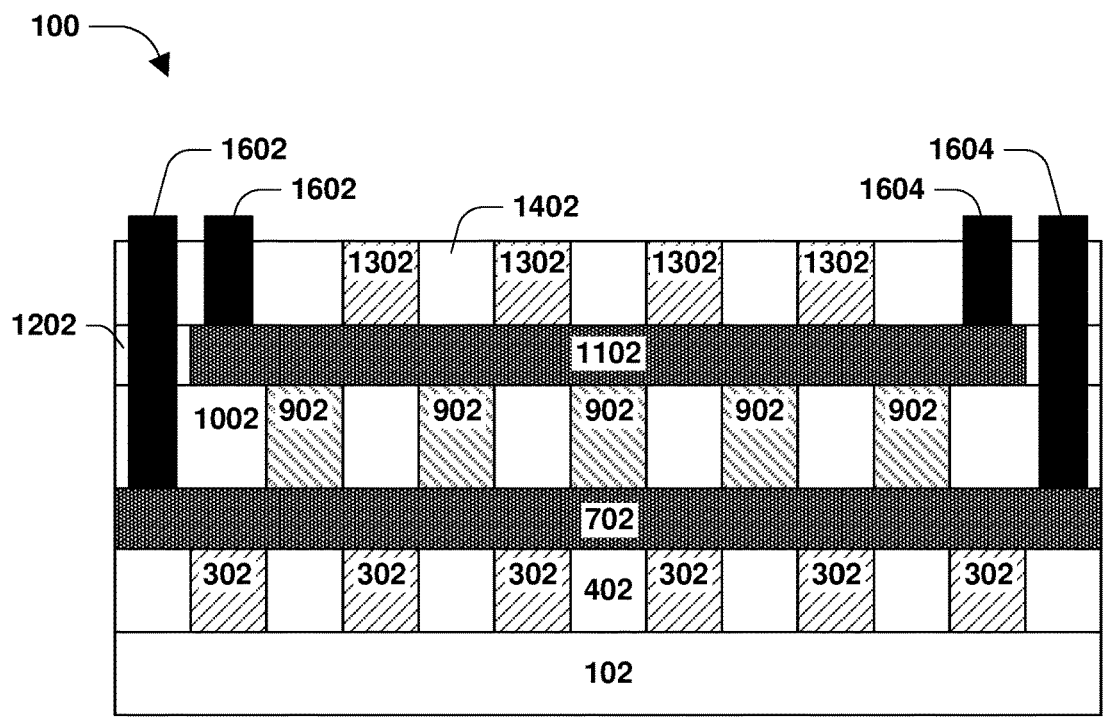

FIGS. 19A-19D illustrate the memory structure 100 according to some embodiments in which vias of the second plurality of vias are arranged differently than shown in FIGS. 18A-18C. FIG. 19A illustrates a top view of the memory structure 100. FIG. 19B illustrates a cross-sectional view of the memory structure 100 taken along lines B-B of FIG. 19A. FIG. 19C illustrates a cross-sectional view of the memory structure 100 taken along lines C-C of FIG. 19A. FIG. 19D illustrates a cross-sectional view of the memory structure 100 taken along lines D-D of FIG. 19A. In some embodiments, along at least one of the z-axis (shown in FIG. 10A) or the x-axis (shown in FIGS. 18A and 18B), one, some and/or all vias of the vias 1802 of the second plurality of vias are laterally offset from one, some and/or all vias of the vias 1804 of the second plurality of vias. In some embodiments, one, some and/or all vias of the vias 1802 are outside the region between the z-axis position $z_1$ and the z-axis position $z_2$, and one, some and/or all vias of the vias 1804 are outside the region between the z-axis position $z_3$ and the z-axis position $z_4$ (shown in FIG. 19A). In some embodiments, one, some and/or all vias of the second plurality of vias are laterally offset, along the z-axis, from transistor channels of the memory structure 100, such as where the second plurality of vias are at least one of isolated from or not in contact with a transistor channel of the memory structure 100. In some embodiments, z-axis positions of one, some and/or all vias of the vias 1802 are between z-axis positions of two adjacent transistor channels 1102 of the second set of transistor channels 1102 and are between z-axis positions of two adjacent transistor channels 702 of the first set of transistor channels 702. In some embodiments, z-axis positions of one, some and/or all vias of the vias 1804 are between z-axis positions of two adjacent transistor channels 1102 of the second set of transistor channels 1102. In some embodiments, such as in an embodiment in which the second plurality of vias are outside the region between the z-axis position $z_1$ and the z-axis position $z_2$ and the region between the z-axis position $z_3$ and the z-axis position $z_4$, one, some and/or all gate structures of the multiple layers of gate structures 1428 occupy the region between the z-axis position $z_1$ and the z-axis position $z_2$ and the region between the z-axis position $z_3$ and the z-axis position $z_4$, such as where the gate structures extend from the z-axis position $z_1$ to the z-axis position $z_4$ (shown in FIG. 19A).

Figure 20A:
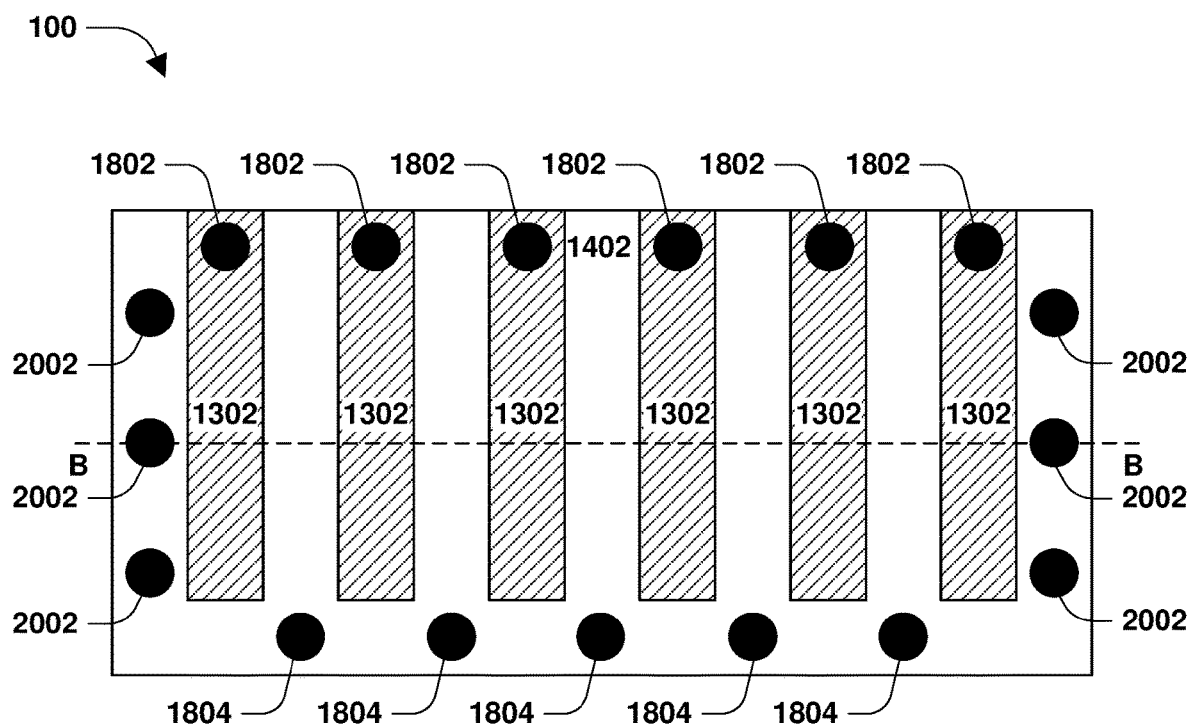
FIG. 20A-20B illustrate a memory structure, in accordance with some embodiments.
Figure 20B:
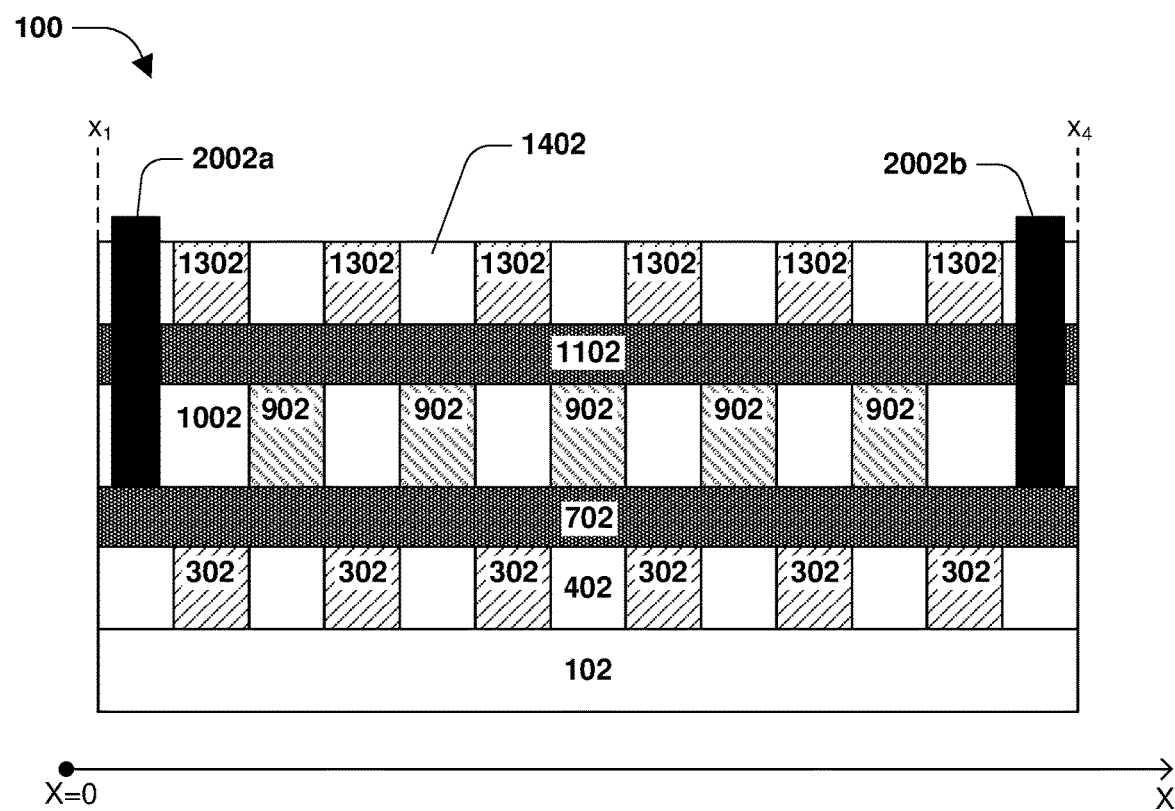

FIGS. 20A-20B illustrate the memory structure 100 according to some embodiments in which vias 2002 are in contact with multiple transistor channels of the multiple layers of transistor channels 1408. FIG. 20A illustrates a top view of the memory structure 100. FIG. 20B illustrates a cross-sectional view of the memory structure 100 taken along lines B-B of FIG. 20A. In some embodiments, the multiple layers of transistor channels 1408 do not form a staircase-like arrangement. In some embodiments, x-axis positions of transistor channels of the multiple layers of transistor channels 1408 are about the same. In some embodiments, one, some and/or all transistor channels of the multiple layers of transistor channels 1408 extend from an x-axis position $x_1$ (shown in FIG. 20B) to an x-axis position $x_2$. In some embodiments, a via 2002 extends, through a transistor channel 1102, to a transistor channel 702 underlying the transistor channel 1102, wherein the via 2002 is in contact with the transistor channel 1102 and the transistor channel 702. In one embodiment, a via 2002a (shown in FIG. 20B) corresponds to a source contact and a via 2002b corresponds to a drain contact, wherein the via 2002a and the via 2002b are in contact with a transistor channel 1102 and a transistor channel 702 underlying the transistor channel 1102.

Figure 21A:
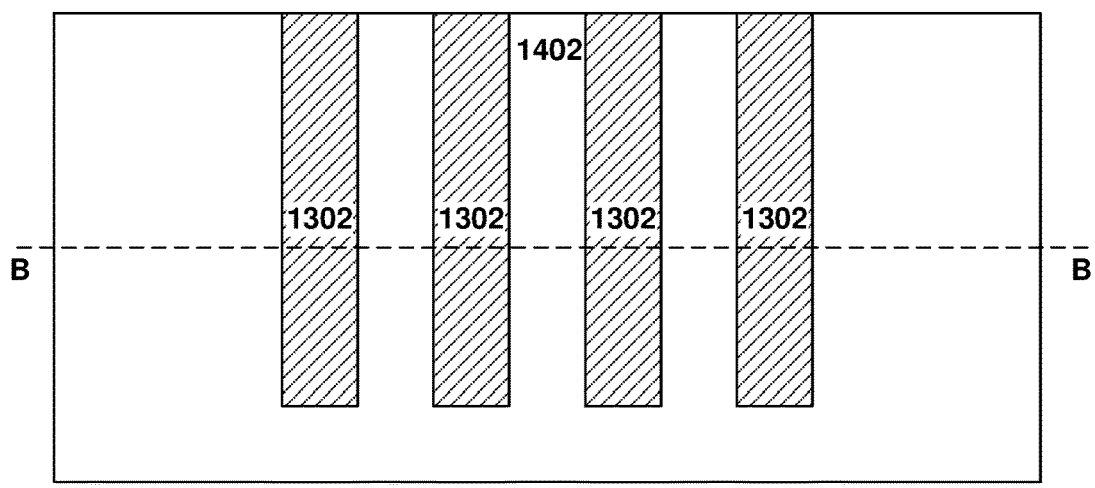
FIG. 21A-21B illustrate a memory structure, in accordance with some embodiments.
Figure 21B:
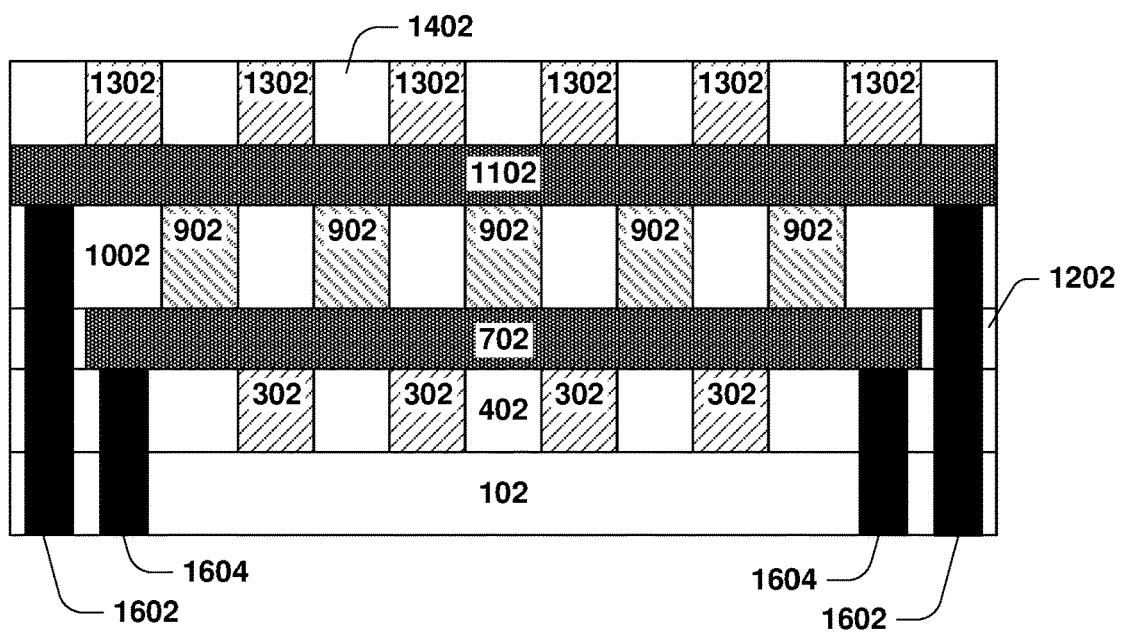

FIGS. 21A-21B illustrate the memory structure 100 according to some embodiments in which a via extends, from under at least one of a transistor channel or a gate structure, to at least one of the transistor channel or the gate structure. FIG. 21A illustrates a top view of the memory structure 100. FIG. 21B illustrates a cross-sectional view of the memory structure 100 taken along lines B-B of FIG. 21A. In some embodiments, the vias 1602 of the first plurality of vias extend from under the first set of transistor channels 702 and contact, such as directly contact, bottom surfaces of transistor channels of the first set of transistor channels 702. In some embodiments, the vias 1604 of the first plurality of vias extend from under the second set of transistor channels 702 and contact, such as directly contact, bottom surfaces of transistor channels of the second set of transistor channels 1102. In some embodiments, the first set of transistor channels 702 and the second set of transistor channels 1102 form an inverted staircase-like arrangement, such as an inverted version of a staircase-like arrangement of transistor channels shown in and/or described with respect to FIGS. 14A-14B. In some embodiments, the vias 1802 (not shown) of the second plurality of vias extend from under the first set of gate structures 302 to contact, such as directly contact, gate structures of one or more odd layers of the multiple layers of gate structures 1428. In some embodiments, the vias 1804 (not shown) of the second plurality of vias extend from under the first set of gate structures 302 to contact, such as directly contact, gate structures of one or more even layers of the multiple layers of gate structures 1428.

Figure 22A:
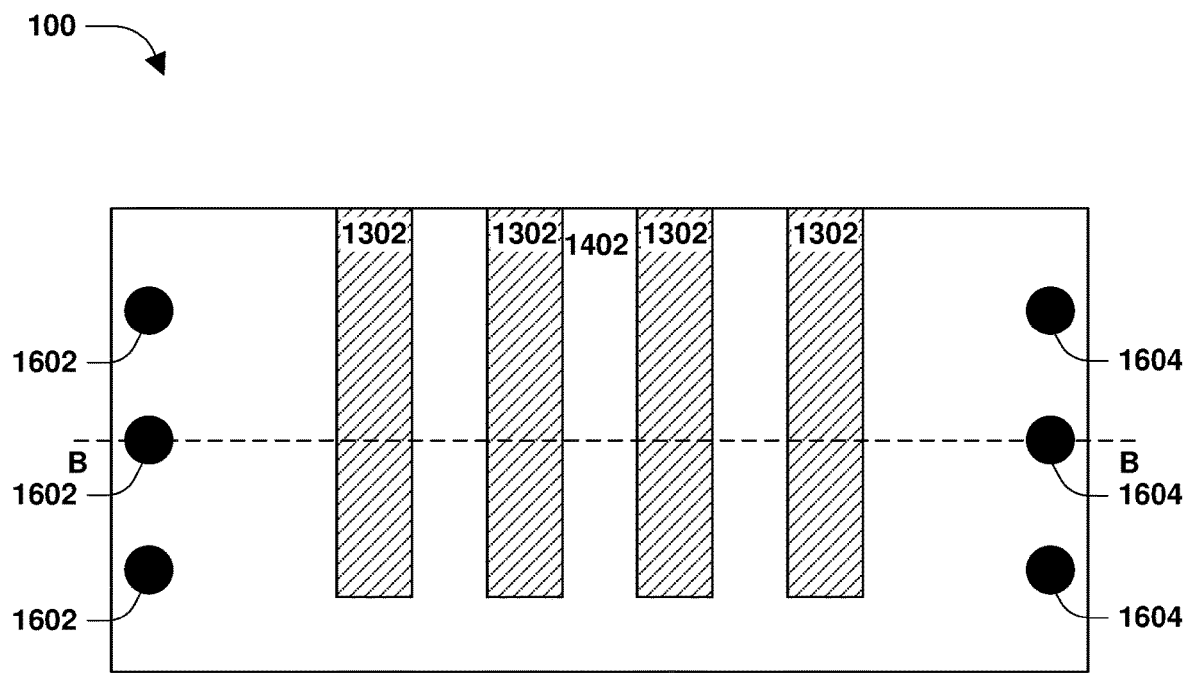
FIG. 22A-22B illustrate a memory structure, in accordance with some embodiments.
Figure 22B:
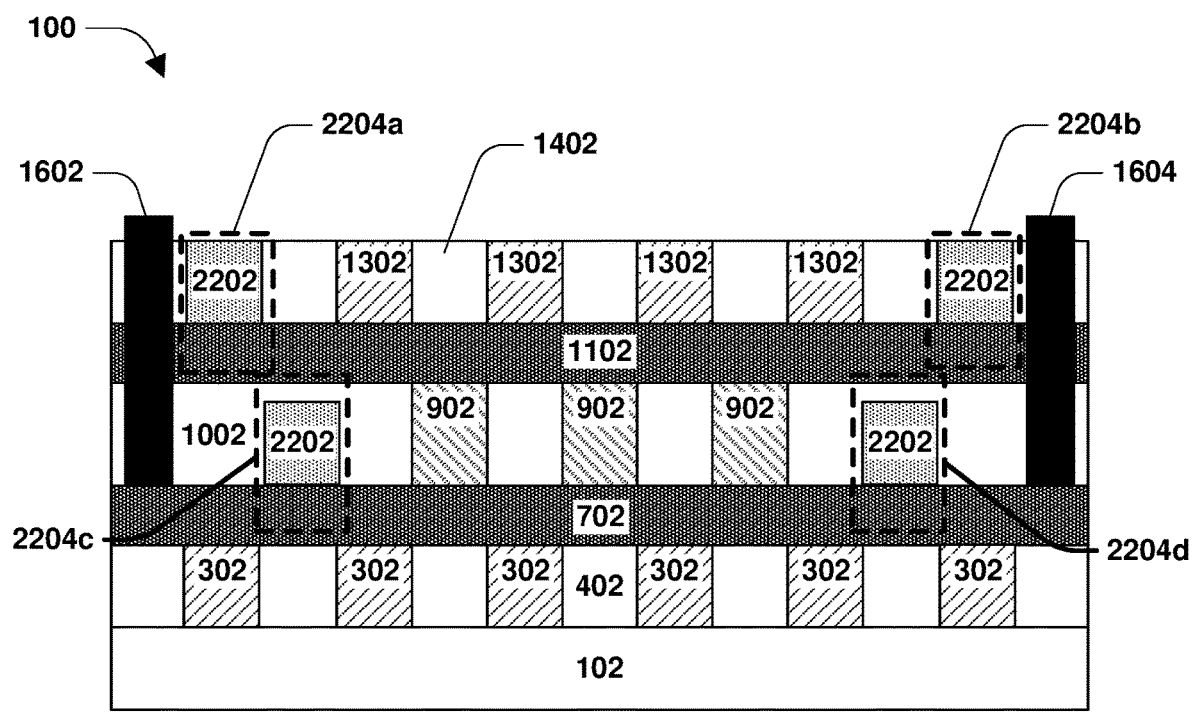

FIGS. 22A-22B illustrate the memory structure 100 according to some embodiments in which the memory structure 100 comprises one or more access transistors 2204. FIG. 22A illustrates a top view of the memory structure 100. FIG. 22B illustrates a cross-sectional view of the memory structure 100 taken along lines B-B of FIG. 22A. In some embodiments, the one or more access transistors 2204 comprise one or more first access transistors comprising one or more gate structures 2202 at least one of overlying or in contact with a top surface of a transistor channel 1102 of the second set of transistor channels 1102. The one or more first access transistors comprise at least one of a first access transistor 2204a or a second access transistor 2204b. In some embodiments, one, some and/or all gate structures 1302, of the third set of gate structures 1302, that are in contact with the transistor channel 1102, are between a gate structure 2202 of the first access transistor 2204a and a gate structure 2202 of the second access transistor 2204b. In some embodiments, the one or more access transistors 2204 comprise one or more second transistors comprising one or more gate structures 2202 at least one of overlying or in contact with a top surface of a transistor channel 702 of the first set of transistor channels 702. The one or more second access transistors comprise at least one of a third access transistor 2204c or a fourth access transistor 2204d. In some embodiments, one, some and/or all gate structures 902, of the second set of gate structures 902, that are in contact with the transistor channel 1102 and the transistor channel 702, are between a gate structure 2202 of the third access transistor 2204c and a gate structure 2202 of the fourth access transistor 2204d. In some embodiments, a gate structure 2202 of an access transistor of the one or more access transistors 2204 comprises at least one of an access gate or a dielectric component. In some embodiments, the dielectric component separates the access gate from a channel layer with which the gate structure 2202 is in contact. In some embodiments, the access gate comprises a metal. The access gate comprises at least one of titanium, tungsten, nitride, such as titanium nitride (TiN), or other suitable material. In some embodiments, the dielectric component comprises a high-k dielectric material. The high-k dielectric material may be any suitable material. In some embodiments, the dielectric component comprises oxide, such as a high-k oxide. In some embodiments, the dielectric component comprises at least one of hafnium dioxide ($HfO_2$) or other suitable material. In some embodiments, the one or more access transistors 2204 are used to control access to memory stored on memory cells of the memory structure 100. Other structures and/or configurations of the one or more access transistors 2204 are within the scope of the present disclosure.

Figure 23:
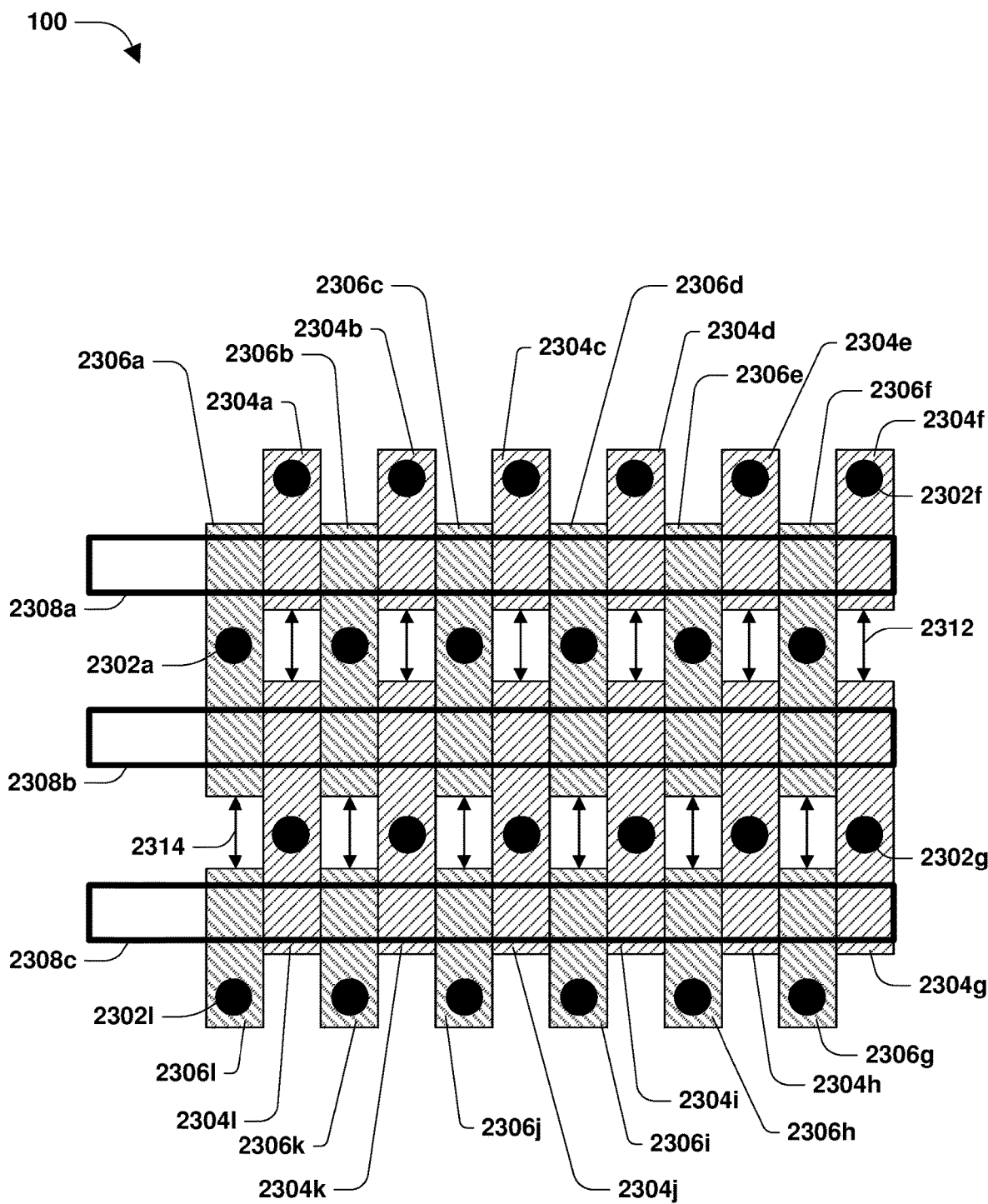
FIG. 23 illustrates a memory structure, in accordance with some embodiments.

FIG. 23 illustrates a positional diagram, showing lateral positions of gate structures, transistor channels, and vias of the memory structure 100, from a top view perspective, according to some embodiments in which gate structures connected to transistor channels are separated into sections. In FIG. 23, even gate structure positions 2306 are shown as rectangles filled with downward diagonal patterns, wherein each even gate structure position 2306 of the even gate structure positions 2306 corresponds to a lateral position of one or more gate structures in one or more even layers of the multiple layers of gate structures 1428, according to some embodiments. In FIG. 23, odd gate structure positions 2304 are shown as rectangles filled with upward diagonal patterns, wherein each odd gate structure position 2304 of the odd gate structure positions 2304 corresponds to a lateral position of one or more gate structures in one or more odd layers of the multiple layers of gate structures 1428, according to some embodiments. In FIG. 23, via positions 2302 are shown with black-filled circles, wherein each via position 2302 of the via positions 2302 corresponds to a lateral position of a via of the second plurality of vias. In FIG. 23, transistor channel positions 2308 are shown with no-fill rectangles, wherein each transistor channel position 2308 of the transistor channel positions 2308 corresponds to a lateral position of one or more transistor channels, such as one or more transistor channels comprising at least one of a transistor channel 702 of the first set of transistor channels 702 or a transistor channel 1102, of the second set of transistor channels 1102, overlying the transistor channel 702.

In some embodiments, a via position 2302a overlaid on an even gate structure position 2306a is representative of a lateral position of a first via, such as a via 1804, that extends through and/or is in contact with one or more first gate structures, of one or more first even layers of the multiple layers of gate structures 1428, having the even gate structure position 2306*a*. In some embodiments, a via position 2302*l* overlaid on an even gate structure position 2306*l* is representative of a lateral position of a second via, such as a via 1804, that extends through and/or is in contact with one or more second gate structures, of the one or more first even layers, having the even gate structure position 2306*l*. In some embodiments, the one or more first gate structures having the even gate structure position 2306*a* are offset from the one or more second gate structures having the even gate structure position 2306*l* by a distance 2314. In some embodiments, the one or more first gate structures having the even gate structure position 2306*a* are in contact with at least one of one or more transistor channels having a transistor channel position 2308*a* or one or more transistor channels having a transistor channel position 2308*b*. In some embodiments, the one or more second gate structures having the even gate structure position 2306*l* are in contact with at least one of one or more transistor channels having a transistor channel position 2308*c*. In some embodiments, a word line is connected to the first via and the second via. In some embodiments, separating the one or more first gate structures from the one or more second gate structures and/or implementing the first via and the second via that contact the one or more first gate structures and the one or more second gate structures separately provides for increased speed and/or control in selecting memory cells from which to read data, such as using the word line, and/or in reading data from memory cells formed from the one or more first gate structures and the one or more second gate structures, as compared to the one or more first gate structures not being separate from the one or more second gate structures.

In some embodiments, a via position 2302*g* overlaid on an odd gate structure position 2304*g* is representative of a lateral position of a third via, such as a via 1802, that extends through and/or is in contact with one or more third gate structures, of one or more first odd layers of the multiple layers of gate structures 1428, having the odd gate structure position 2304*g*. In some embodiments, a via position 2302*f* overlaid on an odd gate structure position 2304*f* is representative of a lateral position of a fourth via, such as a via 1802, that extends through and/or is in contact with one or more fourth gate structures, of the one or more first odd layers, having the odd gate structure position 2304*f*. In some embodiments, the one or more third gate structures having the odd gate structure position 2304*g* are offset from the one or more fourth gate structures having the odd gate structure position 2304*f* by a distance 2312. In some embodiments, the one or more third gate structures having the odd gate structure position 2304*g* are in contact with at least one of one or more transistor channels having the transistor channel position 2308*a* or one or more transistor channels having the transistor channel position 2308*b*. In some embodiments, the one or more fourth gate structures having the odd gate structure position 2304*f* are in contact with at least one of one or more transistor channels having the transistor channel position 2308*c*. In some embodiments, a word line is connected to the third via and the fourth via. In some embodiments, separating the one or more third gate structures from the one or more fourth gate structures and/or implementing the third via and the fourth via that contact the one or more third gate structures and the one or more fourth gate structures separately provides for increased speed and/or control in selecting memory cells from which to read data, such as using the word line, and/or in reading data from memory cells formed from the one or more third gate structures and the one or more fourth gate structures, as compared to the one or more third gate structures not being separate from the one or more fourth gate structures.

In some embodiments, throughout the present disclosure, where it is provided that a via is in contact with a gate structure, the via is in contact with, such as in direct contact with, a gate of the gate structure, such as a control gate of the gate structure.

Figure 24A:
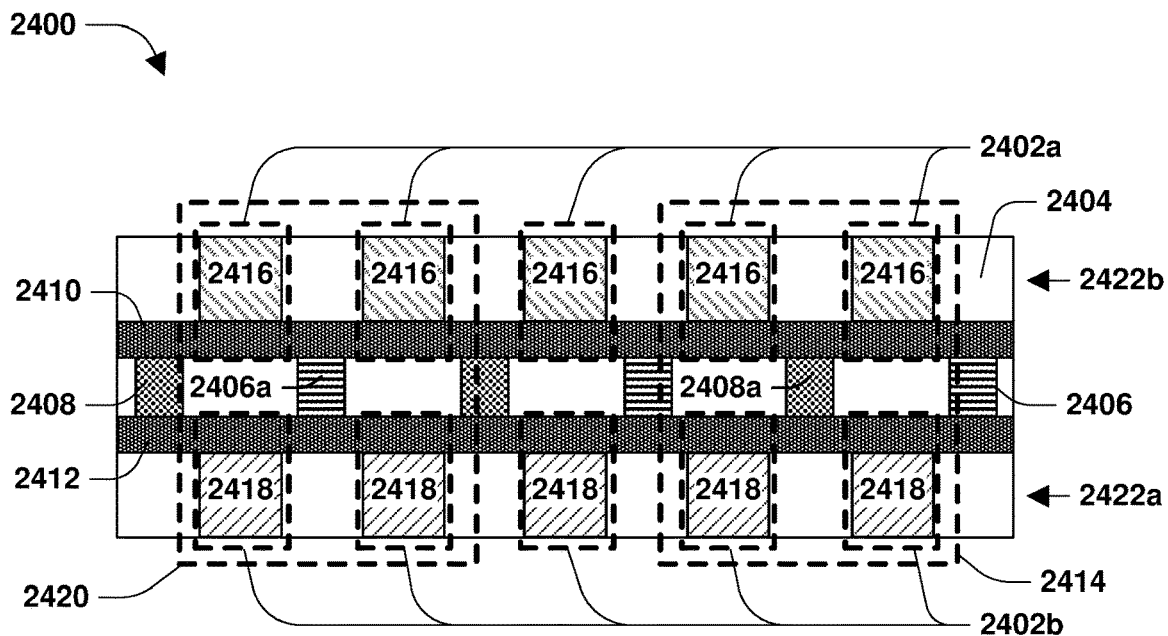
FIGS. 24A-24D illustrate a memory structure, in accordance with some embodiments.

FIGS. 24A-24D illustrate a memory structure 2400 according to some embodiments. In some embodiments, the memory structure 2400 is a non-volatile memory structure, such as a flash memory structure or other non-volatile memory structure. In some embodiments, the memory structure 2400 comprises memory cells. In some embodiments, the memory cells comprise non-volatile memory cells, such as flash memory cells or other type of non-volatile memory cells. In some embodiments, the memory structure 2400 comprises a stacked memory array structure comprising layers of memory cells stacked over each other. In some embodiments, the memory structure 2400 comprises memory cells connected in parallel, such as where the memory cells have a NOR configuration. FIG. 24A illustrates a cross-sectional view of the memory structure 2400. In some embodiments, the memory structure 2400 comprises at least one of the one or more layers, features, structures, elements, etc. of the memory structure 100 (shown in and/or described with respect to FIGS. 1A-23). In some embodiments, the memory structure 2400 comprises a plurality of memory cells 2402 comprising a first set of memory cells 2402*a* and a second set of memory cells 2402*b*. In some embodiments, a memory cell 2402 comprises at least one of the one or more features, structures, elements, etc. described with respect to memory cells of the memory structure 100 and/or the memory cell 2402 is formed using one or more of the techniques provided herein with respect to forming memory cells of the memory structure 100.

In some embodiments, each memory cell of one, some and/or all memory cells of the first set of memory cells 2402*a* comprises a gate structure 2416. In some embodiments, a gate structure 2416 comprises at least one of the one or more features, structures, elements, etc. described with respect to at least one of a gate structure 302, a gate structure 902, a gate structure 1302, etc. and/or the gate structure 2416 is formed using one or more of the techniques provided herein with respect to forming at least one of a gate structure 302, a gate structure 902, a gate structure 1302, etc.

In some embodiments, each memory cell of one, some and/or all memory cells of the second set of memory cells 2402*b* comprises a gate structure 2418. In some embodiments, a gate structure 2418 comprises at least one of the one or more features, structures, elements, etc. described with respect to at least one of a gate structure 302, a gate structure 902, a gate structure 1302, etc. and/or the gate structure 2418 is formed using one or more of the techniques provided herein with respect to forming at least one of a gate structure 302, a gate structure 902, a gate structure 1302, etc.

In some embodiments, the memory structure 2400 comprises at least one of a first transistor channel 2410 or a second transistor channel 2412. The first transistor channel 2410 comprises at least one of InGaZnO, InSnO, InWO, $In_2O_3$, $Ga_2O_3$, InGaZnO:Si, a III-V compound semiconductor, silicon, indium gallium arsenide, gallium arsenide, indium arsenide, or other suitable material. The second transistor channel 2412 comprises at least one of InGaZnO, InSnO, InWO, $In_2O_3$, $Ga_2O_3$, InGaZnO:Si, a III-V compound semiconductor, silicon, indium gallium arsenide, gallium arsenide, indium arsenide, or other suitable material. In some embodiments, at least one of the first transistor channel 2410 or the second transistor channel 2412 are formed using one or more of the techniques provided herein with respect to forming at least one of a transistor channel 702, a transistor channel 1102, etc.

In some embodiments, the memory structure 2400 comprises a plurality of contacts. In some embodiments, one, some and/or all contacts of the plurality of contacts are vias that extend through (not shown) at least one of the first transistor channel 2410 or the second transistor channel 2412. The plurality of contacts comprises at least one of a first set of contacts 2408 (shown with checker board pattern-filled rectangles in FIG. 24A) or a second set of contacts 2406 (shown with horizontal line pattern-filled rectangles in FIG. 24A). In some embodiments, one, some and/or all contacts of the plurality of contacts are metal contacts. In some embodiments, contacts of the first set of contacts 2408 are connected to one or more bit lines. In some embodiments, contacts of the second set of contacts 2406 are connected to a fixed potential, such as a high supply voltage Vdd, or a low supply voltage Vss, or ground. In some embodiments, for each memory cell of one, some and/or all memory cells of the plurality of memory cells 2402, the plurality of contacts comprises two contacts connected to the memory cell, such as a contact, of the first set of contacts 2408, connected to a bit line and a contact, of the second set of contacts 2406, connected to a fixed potential.

In some embodiments, a group of memory cells 2414, such as comprising two memory cells of the first set of memory cells 2402a and two memory cells of the second set of memory cells 2402b, are connected to a first contact 2408a of the first set of contacts 2408, such as where the group of memory cells 2414 share a bit line connected to the first contact 2408a. In some embodiments, the first contact 2408a provides a connection between the bit line and memory cells of the group of memory cells 2414.

In some embodiments, a group of memory cells 2420, such as comprising two memory cells of the first set of memory cells 2402a and two memory cells of the second set of memory cells 2402b, are connected to a second contact 2406a of the second set of contacts 2406. In some embodiments, the second contact 2406a provides a connection between a fixed potential and memory cells of the group of memory cells 2420.

One, some and/or all gate structures 2416 of the first set of memory cells 2402a at least one of overlie, are in direct contact with, or are in indirect contact with the first transistor channel 2410. The first transistor channel 2410 at least one of overlies, is in direct contact, or is in indirect contact with one, some and/or all contacts of the plurality of contacts. The second transistor channel 2412 at least one of underlies, is in direct contact, or is in indirect contact with one, some and/or all contacts of the plurality of contacts. One, some and/or all gate structures 2418 of the second set of memory cells 2402b at least one of underlie, are in direct contact with, or are in indirect contact with the first transistor channel 2410. In some embodiments, at least one of the first transistor channel 2410, the second transistor channel 2412, gate structures 2416 of the first set of memory cells 2402, gate structures 2418 of the second set of memory cells 2402a, or the plurality of contacts are embedded in one or more dielectric layers 2404. In some embodiments, the one or more dielectric layers 2404 comprise at least one of silicon, nitride, oxide, such as SiO2, or other suitable material.

In some embodiments, the memory structure 2400 comprises multiple layers of gate structures 2422 stacked over each other. The multiple layers of gate structures 2422 comprise at least one of a first layer of gate structures 2422a comprising the gate structures 2418 of the second set of memory cells 2402b, a second layer of gate structures 2422b, over the first layer of gate structures 2422a, comprising the gate structures 2416 of the first set of memory cells 2402a, or one or more other layers of gate structures over the second layer of gate structures 2422b. Although FIG. 24A shows two layers of gate structures stacked over each other, any number of layers of gate structures of the multiple layers of gate structures 2422 is contemplated. In some embodiments, each layer of gate structures of one, some and/or all of the multiple layers of gate structures 2422 comprises one or more gate structures that are in direct contact or indirect contact with at least one of one or more transistor channels underlying the layer of transistor channels or one or more transistor channels overlying the layer of gate structures. In some embodiments, the arrangement shown in and/or described with respect to FIG. 24A is repeated periodically in a vertical direction, such as where structures comprising at least some of the arrangement are stacked over each other.

In some embodiments, gate structures of one or more odd layers of the multiple layers of gate structures 2422, such as at least one of the gate structures 2418 of the first layer of gate structures 2422a or gate structures of one or more other odd layers of the multiple layers of gate structures 2422, are in contact with vias of a third plurality of vias. In some embodiments, a via of the third plurality of vias is in contact with one or more gate structures, of the one or more odd layers, that are vertically coincident with each other. In some embodiments, vias of the third plurality of vias are connected to one or more word lines. In some embodiments, gate structures of one or more even layers of the multiple layers of gate structures 2422, such as at least one of the gate structures 2416 of the second layer of gate structures 2422b or gate structures of one or more other even layers of the multiple layers of gate structures 2422, are in contact with vias of a fourth plurality of vias. In some embodiments, a via of the fourth plurality of vias is in contact with one or more gate structures, of the one or more even layers, that are vertically coincident with each other. In some embodiments, vias of the fourth plurality of vias are connected to one or more word lines. In some embodiments, the third plurality of vias are not in contact with at least one of contacts of the plurality of contacts or gate structures of the one or more even layers of the multiple layers of gate structures 2422. In some embodiments, the fourth plurality of vias are not in contact with at least one of contacts of the plurality of contacts or gate structures of the one or more odd layers of the multiple layers of gate structures 2422.

Figure 24B:
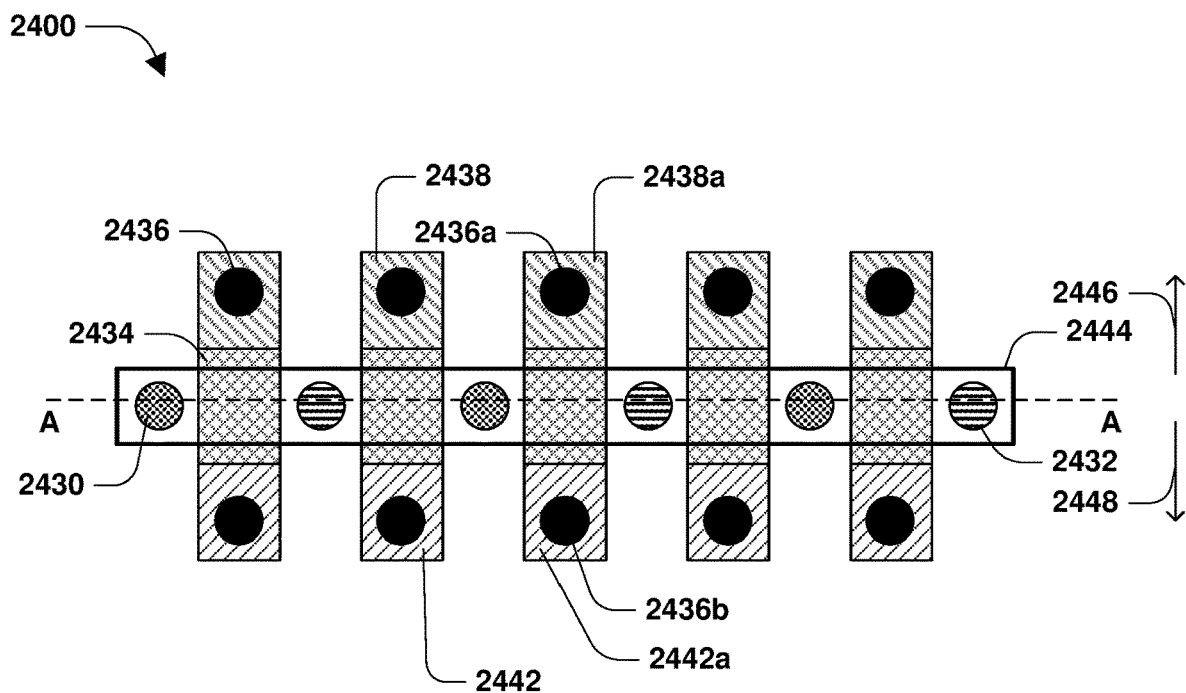
Figure 24C:
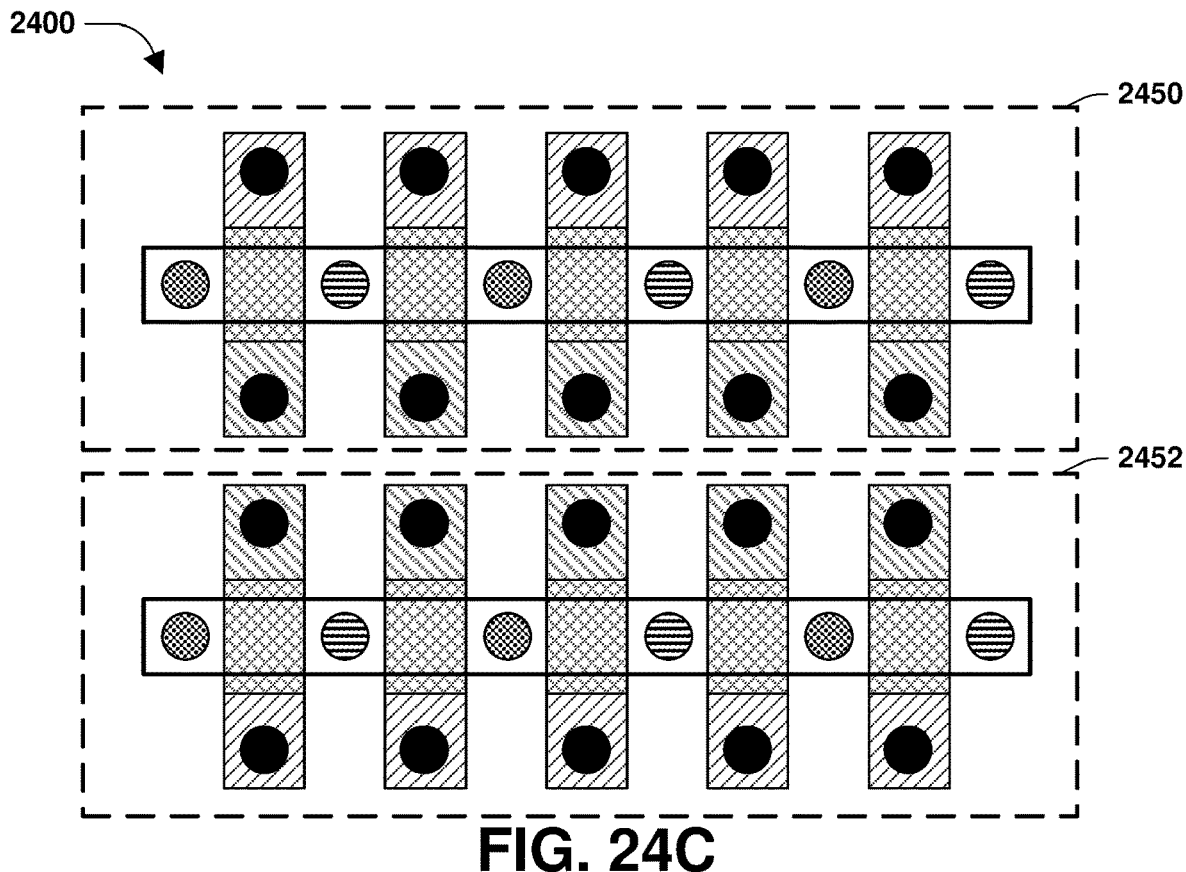
Figure 24D:
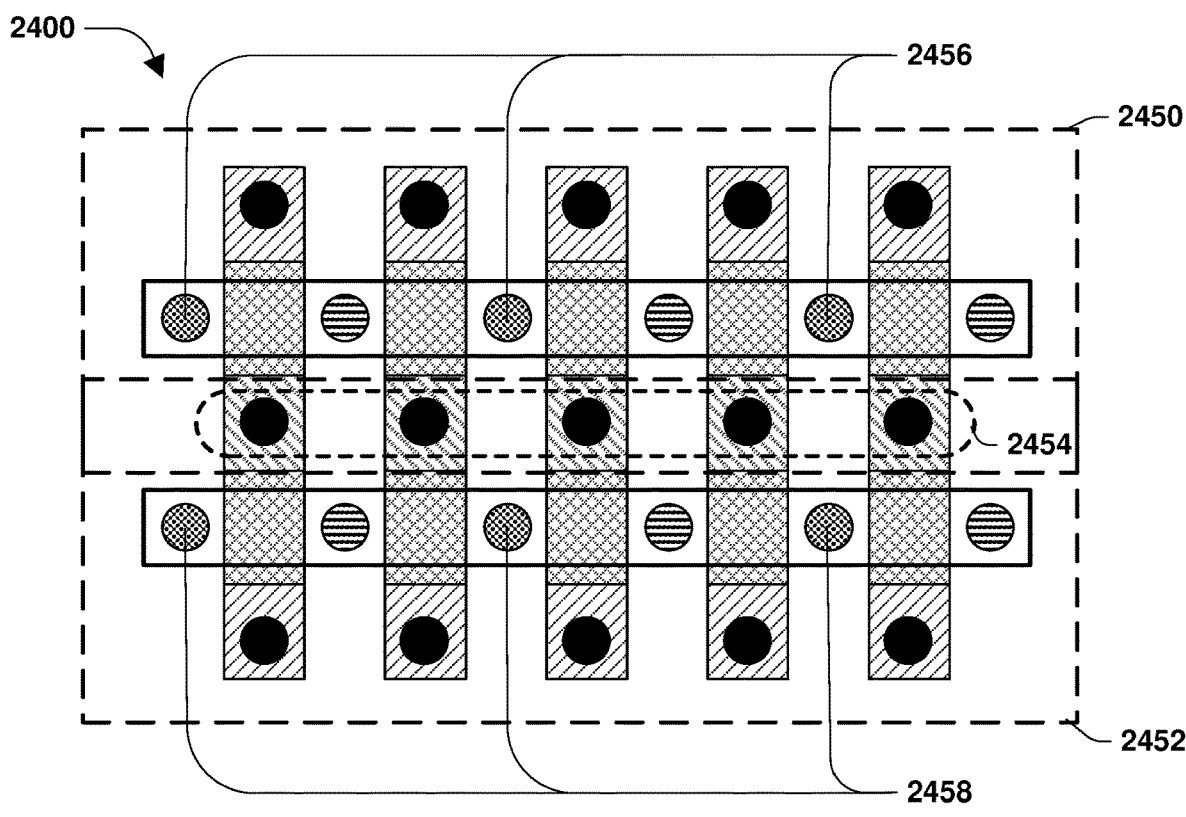

FIGS. 24B-24D illustrate positional diagrams, showing lateral positions of gate structures, contacts, transistor channels, and vias of the memory structure 2400, from a top view perspective, according to some embodiments. In some embodiments, the cross-sectional view depicted in FIG. 24A corresponds to a cross-sectional view of the memory structure 2400 taken along lines A-A of FIG. 24B. In FIG. 24B, even gate structure positions 2438 are shown as rectangles filled with downward diagonal patterns, wherein each even gate structure position 2438 of the even gate structure positions 2438 corresponds to a lateral position of one or more gate structures in one or more even layers of the multiple layers of gate structures 2422, according to some embodiments. In FIG. 24B, odd gate structure positions 2442 are shown as rectangles filled with upward diagonal patterns, wherein each odd gate structure position 2442 of the odd gate structure positions 2442 corresponds to a lateral position of one or more gate structures in one or more odd layers of the multiple layers of gate structures 2422, according to some embodiments. In FIG. 24B, overlapping gate structure positions 2434 are shown as rectangles filled with diamond shape patterns, wherein each overlapping gate structure position 2434 of the overlapping gate structure positions 2434 corresponds to a lateral position of a region in which one or more gate structures in one or more odd layers of the multiple layers are vertically coincident with one or more gate structures in one or more even layers of the multiple layers, according to some embodiments. In FIG. 24B, via positions 2436 are shown with black-filled circles, wherein each via position 2436 of the via positions 2436 corresponds to a lateral position of a via of the third plurality of vias and/or the fourth plurality of vias. In FIG. 24B, transistor channel positions 2444 are shown with no-fill rectangles, wherein each transistor channel position 2444 of the transistor channel positions 2444 corresponds to a lateral position of one or more transistor channels, such as one or more transistor channels comprising at least one of the first transistor channel 2410 or the second transistor channel 2412 underlying the first transistor channel 2410. In FIG. 24B, first contact positions 2430 are shown with checker board pattern-filled circles, wherein each contact position 2430 of the first contact positions 2430 corresponds to a lateral position of a contact of the first set of contacts 2408. In FIG. 24B, second contact positions 2432 are shown with horizontal line pattern-filled circles, wherein each contact position 2432 of the second contact positions 2432 corresponds to a lateral position of a contact of the second set of contacts 2406.

In some embodiments, as shown in FIG. 24B, gate structures of one or more even layers of the multiple layers of gate structures 2422 extend in a first direction 2446 and gate structures of one or more odd layers of the multiple layers of gate structures 2422 extend in a second direction 2448 opposite the first direction 2446.

In some embodiments, a via position 2436a overlaid on an even gate structure position 2438a is representative of a lateral position of a first via, such as a via of the fourth plurality of vias, that extends through and/or is in contact with one or more first gate structures, of one or more even layers of the multiple layers of gate structures 2422, having the even gate structure position 2438a.

In some embodiments, a via position 2436b overlaid on an odd gate structure position 2442a is representative of a lateral position of a second via, such as a via of the third plurality of vias, that extends through and/or is in contact with one or more second gate structures, of one or more odd layers of the multiple layers of gate structures 2422, having the odd gate structure position 2442a.

In some embodiments, the arrangement shown in and/or described with respect to FIGS. 24A and 24B is repeated periodically, such as across a plane of a wafer. FIG. 24C illustrates the memory structure 2400 according to some embodiments in which the memory structure 2400 comprises multiple memory structure units arranged periodically, such as across a plane of a wafer. In some embodiments, the multiple memory structure units comprise at least one of a first memory structure unit 2450, a second memory structure unit 2452, or one or more other memory structure units. In some embodiments, each memory structure unit of the multiple memory structure units comprises at least one of the one or more features, structures, elements, etc. shown in and/or described with respect to FIGS. 24A and 24B.

FIG. 24D illustrates the memory structure 2400 according to some embodiments in which the memory structure 2400 comprises the multiple memory structure units. In some embodiments, vias corresponding to via positions 2454 are in contact with gate structures of the first memory structure unit 2450 and gate structures of the second memory structure unit 2452, wherein the gate structures of the first memory structure unit 2450 and the gate structures of the second memory structure unit 2452 are within odd layers of gate structures or within even layers of gate structures. In some embodiments, such as shown in FIG. 24D, the fourth plurality of vias comprise the vias corresponding to the via positions 2454. In some embodiments, such as shown in FIG. 24D, a via of the fourth plurality of vias is in contact with a gate structure of an even layer of gate structures of the first memory structure unit 2450 and a gate structure of an even layer of gate structures of the second memory structure unit 2452. In some embodiments, a first bit line, such as BL, is connected to contacts 2456, such as the first set of contacts 2408, of the first memory structure unit 2450. In some embodiments, a second bit line, such as BL', is connected to contacts 2458, such as the first set of contacts 2408, of the second memory structure unit 2452. In some embodiments, a bit line is split into the first bit line and the second bit line.

Combinations of at least one of the one or more layers, features, structures, elements, etc. disclosed herein are within the scope of the present disclosure.

In some embodiments, a semiconductor device is provided. The semiconductor device comprises a memory structure, such as a stacked memory array structure, in accordance with one or more of the embodiments provided herein, such as one or more embodiments shown in and/or described with respect to FIGS. 1A-24D and/or one or more other embodiments. In some embodiments, the memory structure of the semiconductor device comprises at least one of the one or more layers, features, structures, elements, etc. of at least one of the memory structure 100, the memory structure 2400, or other memory structure within the scope of the present disclosure.

Figure 25:
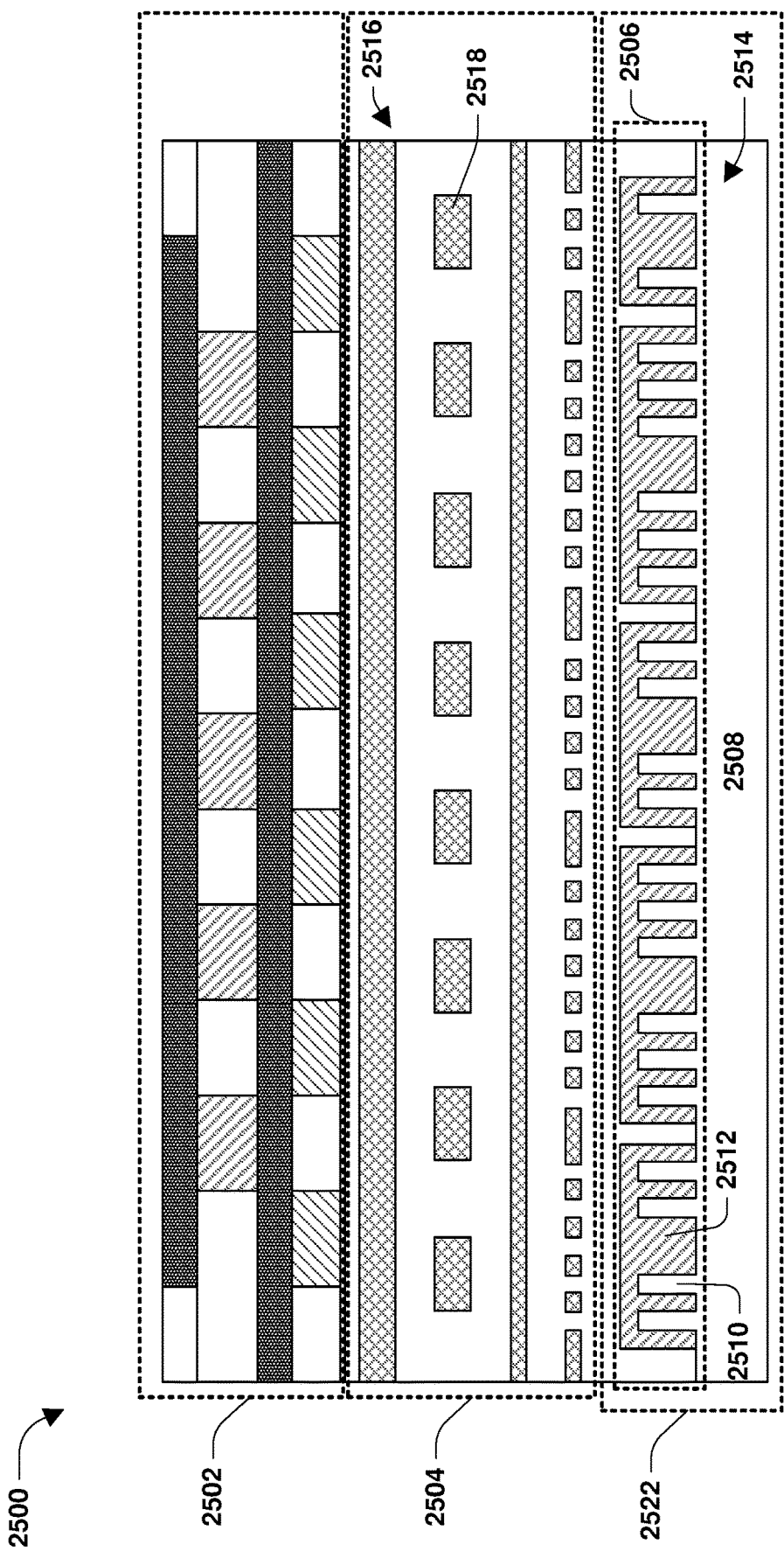
FIG. 25 illustrates a semiconductor device, in accordance with some embodiments.

FIG. 25 illustrates a semiconductor device 2500 according to some embodiments. In some embodiments, the semiconductor device 2500 comprises a memory structure 2502, such as a stacked memory array structure. The memory structure 2502 comprises a plurality of memory cells. In some embodiments, the memory structure 2502 comprises a memory structure in accordance with one or more of the embodiments provided herein, such as one or more embodiments shown in and/or described with respect to FIGS. 1A-24D and/or one or more other embodiments. In some embodiments, the memory structure 2502 comprises at least one of the one or more layers, features, structures, elements, etc. of at least one of the memory structure 100, the memory structure 2400, or other memory structure within the scope of the present disclosure.

The semiconductor device 2500 comprises a logic structure 2506. In some embodiments, the logic structure 2506 is in a FEOL structure 2522 of the semiconductor device 2500. In some embodiments, the logic structure 2506 comprises a plurality of logic cells 2514. In some embodiments, each logic cell of one, some and/or all logic cells of the plurality of logic cells 2514 comprises at least one of a transistor, a diode, or other component. In some embodiments, logic cells of the plurality of logic cells 2514 may comprise at least one of one or more field effect transistors, such as one or more fin field effect transistors (FinFET), or one or more other suitable transistors. In some embodiments, logic cells of the plurality of logic cells 2514 are configured to perform one or more logic functions, such as at least one of executing one or more instructions, performing computer processing, etc. In some embodiments, the semiconductor device 2500 comprises a logic chip, such as at least one of a processor, a controller, a central processing unit (CPU), a graphics processing unit (GPU), etc. In some embodiments in which logic cells of the plurality of logic cells 2514 comprise one or more FinFETs, the plurality of logic cells 2514 may comprise at least one of one or more fins 2510 of the one or more FinFETs or one or more gates 2512 of the one or more FinFETs. In some embodiments, logic cells of the plurality of logic cells 2514 overlie a substrate 2508. The substrate 2508 comprises at least one of an epitaxial layer, a silicon-on-insulator (SOI) structure, a wafer, or a die formed from a wafer. Other structures and/or configurations of the substrate 2508 are within the scope of the present disclosure. The substrate 2508 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. According to some embodiments, the substrate 2508 comprises monocrystalline silicon, crystalline silicon with a <100> crystallographic orientation, crystalline silicon with a <110> crystallographic orientation or other suitable material. In some embodiments, the substrate 2508 comprises at least one doped region.

The semiconductor device 2500 comprises one or more interconnection layers 2516. In some embodiments, the one or more interconnection layers 2516 are in a BEOL structure 2504 of the semiconductor device 2500. The one or more interconnection layers 2516 comprise at least one of patterned dielectric layers or conductive layers that provide interconnections, such as wiring, between at least one of various doped features, circuitry, input/output, etc. of the semiconductor device 2500. In some embodiments, the one or more interconnection layers 2516 comprise at least one of one or more interlayer dielectric layers or multilayer interconnect structures, such as at least one of contacts, vias, metal lines, or a different type of structure. Other structures and configurations of the one or more interconnection layers 2516 are within the scope of the present disclosure. For purposes of illustration, the one or more interconnection layers 2516 comprise conductive lines 2518, where the positioning and configuration of such conductive lines might vary depending upon design needs.

In some embodiments, the memory structure 2502 overlies at least one of the logic structure 2506, the one or more interconnection layers 2516, or the substrate 2508. In some embodiments, the memory structure 2502 at least one of overlies or is within the BEOL structure 2504. In some embodiments, the memory structure 2502 is embedded in the BEOL structure 2504. In some embodiments, one, some and/or all memory cells of the memory structure 2502 overlie one, some and/or all logic cells of the logic structure 2506. In some embodiments, one, some and/or all gates 308 of memory cells of the memory structure 2502 are embedded in one or more dielectric layers, wherein the one or more dielectric layers overlie at least one of the logic structure 2506, the one or more interconnection layers 2516, or the substrate 2508. In some embodiments, the one or more dielectric layers at least one of overlie or are within the BEOL structure 2504. In some embodiments, the memory structure 2502 is connected to the logic structure 2506, such as where the logic structure 2506 is connected to vias of the memory structure 2502. In some embodiments, the one or more interconnection layers 2516 provide one or more connections between the logic structure 2506 and the memory structure 2502, such as one or more connections between the logic structure 2506 and vias of the memory structure 2502.

In some embodiments, the logic structure 2506 is formed over the substrate 2508. The memory structure 2502 is formed over the logic structure 2506. In some embodiments, prior to forming the memory structure 2502, the one or more interconnection layers 2516 are formed over the logic structure 2506, wherein the one or more interconnection layers 2516 are between the memory structure 2502 and the logic structure 2506.

In some embodiments, logic cells of the logic structure 2506 perform computations and/or processing using data stored in memory cells of the memory structure 2502, wherein the memory structure 2502 overlying the logic structure 2506 provides for in-memory computing and/or near-memory computing of the semiconductor device 2500 even where memory cells are not included in the logic structure 2506 and/or do not take up space in the FEOL structure 2522 of the semiconductor device 2500, thereby providing for more space, in the FEOL structure 2522, for logic cells while providing for in-memory computing and/or near-memory computing of the semiconductor device 2500. In some embodiments, the semiconductor device 2500 provides for processing and/or computing with increased speed as compared to semiconductor devices, such as logic chips, that are connected to memory circuitry on separate devices, such as standalone flash memory. In some embodiments, the increased speed is a result of a reduced amount of time it takes for the logic structure 2506 to retrieve data from memory cells of the memory structure 2502. The increased speed enables the semiconductor device 2500 to perform tasks that require fast processing and/or computing, such as at least one of machine learning applications, artificial intelligence, etc.

In some semiconductor devices, memory cells are formed laterally coincident with logic cells of a logic structure, such as within FEOL structures of the semiconductor devices. In some embodiments, compared with these semiconductor devices, the semiconductor device 2500 can be manufactured with at least one of reduced manufacturing costs, reduced complexity, increased memory cell density, etc. In some embodiments, the reduced manufacturing costs and/or the reduced complexity are a result of a complexity and/or difficulty in forming memory cells in an FEOL structure comprising logic cells as compared to forming memory cells over an FEOL structure in accordance with embodiments provided herein, such as due to complexity and/or difficulty in co-integrating memory cells with logic cells. In some embodiments, the reduced manufacturing costs, the reduced complexity and/or the increased memory cell density are a result of using thin film transistor processing to form memory cells of the memory structure 2502, wherein in some cases thin film transistor processing may not be possible for forming memory cells that are co-integrated with logic cells in an FEOL structure, and wherein memory cells that are to be co-integrated with logic cells in an FEOL structure may be required to have more complex transistor structures.

In some embodiments, the semiconductor device 2500 comprises a single wafer, such as where the logic structure 2506, the one or more interconnection layers 2516 and the memory structure 2502 are formed on the single wafer. In some embodiments, the memory structure 2502 is formed by processing the single wafer comprising the logic structure 2506 and the one or more interconnection layers 2516. In some embodiments, the logic structure 2506 is formed on the single wafer, the one or more interconnection layers 2516 are formed over the logic structure 2506, and the memory structure 2502 is formed over the one or more interconnection layers 2516.

In some embodiments, the semiconductor device 2500 comprises multiple wafers. In some embodiments, the memory structure 2502 is formed on a first wafer separate from a second wafer comprising at least one of the logic structure 2506 or the one or more interconnection layers 2516. In some embodiments, the memory structure 2502 is formed by processing the first wafer. In some embodiments, at least one of the logic structure 2506 or the one or more interconnection layers 2516 are formed by processing the second wafer. In some embodiments, the one or more interconnection layers 2516 are formed over the logic structure 2506. In some embodiments, when the memory structure 2502 is formed on the first wafer, the first wafer is bonded with the second wafer, such as by at least one of an adhesive, one or more bonding layers, a bonding process, or other suitable techniques. In some embodiments in which the first wafer is bonded with the second wafer using the one or more bonding layers, the one or more bonding layers are between the first wafer and the second wafer.

In some embodiments, one or more materials of transistor channels of the memory structure 2502 depend upon whether the memory structure 2502 is formed by monolithically processing a wafer comprising at least one of the logic structure 2506 or the one or more interconnection layers 2516 or whether the memory structure 2502 is formed by processing a wafer separate from at least one of the logic structure 2506 or the one or more interconnection layers 2516. In some embodiments, the transistor channels of the memory structure 2502 comprise at least one of the first set of transistor channels 702, the second set of transistor channels 1102, the first transistor channel 2410, the second transistor channel 2412, or other transistor channel of the memory structure 2502. In some embodiments in which the memory structure 2502 is formed by monolithically processing a wafer comprising at least one of the logic structure 2506 or the one or more interconnection layers 2516, the transistor channels of the memory structure 2502 comprise one or more first materials that are deposited at a temperature that is at most a threshold temperature. In some embodiments, the threshold temperature is based upon, such as equal to, a temperature that does not damage one or more components, such as at least one of wiring, circuitry, transistors, etc. in at least one of the one or more interconnection layers 2516 or the logic structure 2506. In some embodiments, the one or more first materials comprise an oxide semiconductor material such as at least one of $InGaZnO$, $InSnO$, $InWO$, $In_2O_3$, $Ga_2O_3$, $InGaZnO:Si$, or other suitable material.

In some embodiments in which the memory structure 2502 is formed by processing a wafer separate from at least one of the logic structure 2506 or the one or more interconnection layers 2516, the transistor channels of the memory structure 2502 comprise one or more second materials that are deposited at a temperature that is less than, equal to or greater than the threshold temperature. In some embodiments, the one or more second materials comprise at least one of a III-V compound semiconductor, silicon, indium gallium arsenide, gallium arsenide, indium arsenide, or other suitable material. In some embodiments, the one or more second materials provide for higher electron mobility than the one or more first materials.

According to some embodiments, at least one of the one or more layers, features, structures, elements, etc. disclosed herein are in direct contact with another of the one or more layers, features, structures, elements, etc. disclosed herein. According to some embodiments, at least one of the one or more layers, features, structures, elements, etc. disclosed herein are not in direct contact with another of the one or more layers, features, structures, elements, etc. disclosed herein, such as where one or more intervening, separating, etc. layers, features, structures, elements, etc. exist.

In some embodiments, a semiconductor device is provided. The semiconductor device includes a memory structure including a first transistor channel, a gate structure overlying the first transistor channel, and a second transistor channel overlying the gate structure. The gate structure includes a control gate.

In some embodiments, a semiconductor device is provided. The semiconductor device includes a memory structure including a first gate structure, a second gate structure overlying the first gate structure, and a via in contact with the first gate structure and the second gate structure. The first gate structure comprises a first control gate and the second gate structure comprises a second control gate.

In some embodiments, a method for forming a semiconductor device is provided. The method includes forming a first transistor channel. The method includes forming a gate structure, including a control gate, in contact with the first transistor channel, wherein the gate structure overlies the first transistor channel. The method includes forming a second transistor channel in contact with the gate structure, wherein the second transistor channel overlies the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a memory structure, comprising:
   a first transistor channel;
   a gate structure, comprising a control gate, overlying the first transistor channel; and
   a second transistor channel overlying the gate structure, wherein the control gate is configured to control the first transistor channel and the second transistor channel.

2. The semiconductor device of claim 1, wherein:
   a first portion of the gate structure and at least a portion of the first transistor channel form a first memory cell of the memory structure; and
   a second portion of the gate structure and at least a portion of the second transistor channel form a second memory cell of the memory structure.

3. The semiconductor device of claim 2, wherein:
   the first portion of the gate structure comprises the control gate and a first charge storing component that separates the control gate from the first transistor channel; and
   the second portion of the gate structure comprises the control gate and a second charge storing component that separates the control gate from the second transistor channel.

4. The semiconductor device of claim 3, wherein:
   the first charge storing component comprises at least one of a first floating gate or a first dielectric charge trapping element; and
   the second charge storing component comprises at least one of a second floating gate or a second dielectric charge trapping element.

5. The semiconductor device of claim 1, comprising:
   a logic structure underlying the memory structure, wherein the logic structure comprises a plurality of logic cells.

6. The semiconductor device of claim 1, wherein:
   the memory structure comprises non-volatile memory cells.

7. The semiconductor device of claim 1, wherein:
   at least one of the first transistor channel or the second transistor channel comprises an oxide semiconductor material.

8. The semiconductor device of claim 1, wherein the memory structure comprises:
   a dielectric layer overlying the first transistor channel and underlying the second transistor channel, wherein a sidewall of the dielectric layer is aligned with a sidewall of the gate structure.

9. A semiconductor device, comprising:
   a first gate structure having a longest dimension extending in a first direction;
   a first transistor channel overlying the first gate structure and having a longest dimension extending in a second direction different than the first direction;
   a second gate structure overlying the first transistor channel and having a longest dimension extending in the first direction, wherein the second gate structure is offset from the first gate structure in the second direction such that the second gate structure does not overlie the first gate structure; and
   a second transistor channel overlying the second gate structure, the first transistor channel, and the first gate structure and having a longest dimension extending in the second direction.

10. The semiconductor device of claim 9, comprising:
    a third gate structure overlying the first gate structure, the first transistor channel, and the second transistor channel and having a longest dimension extending in the first direction.

11. The semiconductor device of claim 10, comprising a via extending through the third gate structure and contacting the first gate structure.

12. The semiconductor device of claim 9, wherein:
    the first transistor channel has a first length measured in the second direction and the second transistor channel has a second length measured in the second direction, and
    the second length is different than the first length.

13. The semiconductor device of claim 12, wherein the second length is less than the first length.

14. A semiconductor device, comprising:
    a memory structure, comprising:
    a first transistor channel;
    a gate structure, comprising a control gate, overlying the first transistor channel; and a second transistor channel overlying the gate structure, wherein:
  a first portion of the gate structure and at least a portion of the first transistor channel form a first memory cell of the memory structure; and
  a second portion of the gate structure and at least a portion of the second transistor channel form a second memory cell of the memory structure.

15. The semiconductor device of claim 14, wherein:
the first portion of the gate structure comprises the control gate and a first charge storing component that separates the control gate from the first transistor channel; and
the second portion of the gate structure comprises the control gate and a second charge storing component that separates the control gate from the second transistor channel.

16. The semiconductor device of claim 15, wherein:
the first charge storing component comprises at least one of a first floating gate or a first dielectric charge trapping element; and
the second charge storing component comprises at least one of a second floating gate or a second dielectric charge trapping element.

17. The semiconductor device of claim 14, comprising:
a logic structure underlying the memory structure, wherein the logic structure comprises a plurality of logic cells.

18. The semiconductor device of claim 14, wherein:
the memory structure comprises non-volatile memory cells.

19. The semiconductor device of claim 14, wherein:
at least one of the first transistor channel or the second transistor channel comprises an oxide semiconductor material.

20. The semiconductor device of claim 14, wherein the memory structure comprises:
a dielectric layer overlying the first transistor channel and underlying the second transistor channel, wherein a sidewall of the dielectric layer is aligned with a sidewall of the gate structure.

* * * * *